US012777635B2

(12) United States Patent
Choi et al.

(10) Patent No.: US 12,777,635 B2
(45) Date of Patent: Oct. 27, 2026

(54) SEMICONDUCTOR MEMORY DEVICE

(71) Applicant: Samsung Electronics Co., Ltd., Suwon-si (KR)

(72) Inventors: Hyun Geun Choi, Suwon-si (KR); Seok Han Park, Suwon-si (KR); Bo Won Yoo, Suwon-si (KR); Ki Seok Lee, Suwon-si (KR); Jin Woo Han, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 233 days.

(21) Appl. No.: 18/406,454

(22) Filed: Jan. 8, 2024

(65) Prior Publication Data

US 2024/0315013 A1 Sep. 19, 2024

(30) Foreign Application Priority Data

Mar. 17, 2023 (KR) ........................ 10-2023-0034993

(51) Int. Cl.

*H10B 12/00* (2023.01)
*H10W 20/41* (2026.01)
*H10W 20/42* (2026.01)

(52) U.S. Cl.

CPC ......... *H10B 12/482* (2023.02); *H10B 12/315* (2023.02); *H10B 12/488* (2023.02); (Continued)

(58) Field of Classification Search

CPC ........ H10B 12/50; H10B 12/30; H10B 12/31; H10B 12/315; H10B 12/488; H10B 12/482; H10B 12/485; H10B 12/48; H10B 12/033; H10B 12/0335; H10B 12/03; G11C 11/4097; G11C 5/025; G11C 5/063; G11C 8/14; G11C 7/02; G11C 7/18

See application file for complete search history.

(56) References Cited

U.S. PATENT DOCUMENTS 8,372,715 B2 * 2/2013 Chung ................. H10B 12/488 438/270
11,282,816 B2 3/2022 Yu et al.
(Continued)

FOREIGN PATENT DOCUMENTS

KR 1020120050820 A 5/2012
KR 1020210124631 A 10/2021
(Continued)

*Primary Examiner* — Sophia T Nguyen
(74) *Attorney, Agent, or Firm* — Muir Patent Law, PLLC

(57) ABSTRACT

A semiconductor memory device includes a peri-gate structure on a substrate, a first bonding pad on the peri-gate structure, a shielding conductive pattern on the first bonding pad, a second bonding pad between the shielding conductive pattern and the first bonding pad and contacting the first bonding pad, a bit line on the shielding conductive pattern extending in a first direction, an active pattern on the bit line and including a lower surface and an upper surface, and a first side wall and a second side wall opposite to each other in the first direction, the lower surface of the active pattern being connected to the bit line, a word line on the first side wall of the active pattern, and extends in a third direction, and a data storage pattern on the active pattern, and is connected to the upper surface of the active pattern.

20 Claims, 53 Drawing Sheets

(52) U.S. Cl.
CPC ............ *H10B 12/50* (2023.02); *H10W 20/42* (2026.01); *H10W 20/435* (2026.01)

(56) References Cited

U.S. PATENT DOCUMENTS

| | | | | |
|---|---|---|---|---|
| 11,302,706 | B2 | 4/2022 | Liu et al. | |
| 11,367,735 | B2 | 6/2022 | Lim et al. | |
| 12,075,611 | B2 * | 8/2024 | Lee | H10B 12/05 |
| 12,501,607 | B2 * | 12/2025 | Lee | H10B 12/05 |
| 12,532,458 | B2 * | 1/2026 | Lee | H10B 12/05 |
| 2021/0066280 | A1 * | 3/2021 | Park | H10W 90/00 |
| 2021/0104534 | A1 | 4/2021 | Huo et al. | |
| 2022/0102352 | A1 * | 3/2022 | Lee | H10B 12/315 |
| 2022/0216239 | A1 | 7/2022 | Yoo et al. | |
| 2022/0223732 | A1 * | 7/2022 | Ryu | H10D 30/668 |
| 2022/0246180 | A1 * | 8/2022 | Lee | H10B 12/488 |
| 2022/0262728 | A1 * | 8/2022 | Lee | H10B 12/315 |
| 2022/0285434 | A1 | 9/2022 | Shen et al. | |
| 2022/0367721 | A1 * | 11/2022 | Jeong | H10D 30/6755 |
| 2023/0055147 | A1 * | 2/2023 | Lee | H10B 12/05 |
| 2023/0055499 | A1 * | 2/2023 | Lee | H10B 12/05 |
| 2023/0328961 | A1 * | 10/2023 | Cho | H10B 12/50 |
| 2023/0354582 | A1 * | 11/2023 | Lee | H10B 12/05 |
| 2023/0363143 | A1 * | 11/2023 | Lee | H10B 12/05 |
| 2023/0371243 | A1 * | 11/2023 | Lee | H10B 12/488 |
| 2023/0380173 | A1 * | 11/2023 | Ku | G11C 11/4097 |
| 2023/0389289 | A1 * | 11/2023 | Park | H10B 12/05 |
| 2024/0049482 | A1 * | 2/2024 | Kim | H10B 12/50 |
| 2024/0072175 | A1 * | 2/2024 | Song | H10D 30/6755 |
| 2024/0114674 | A1 * | 4/2024 | Na | H10B 12/315 |
| 2024/0234253 | A1 * | 7/2024 | You | H10W 20/023 |
| 2024/0266308 | A1 * | 8/2024 | Lee | H10B 12/482 |
| 2024/0306404 | A1 * | 9/2024 | Choi | H10B 80/00 |
| 2024/0315013 | A1 * | 9/2024 | Choi | H10B 12/482 |
| 2024/0334682 | A1 * | 10/2024 | Yoo | H10B 12/33 |
| 2024/0422961 | A1 * | 12/2024 | Shin | H10B 12/50 |
| 2025/0048622 | A1 * | 2/2025 | Choi | H10B 12/50 |
| 2025/0081441 | A1 * | 3/2025 | Yoo | H10B 12/482 |
| 2025/0081445 | A1 * | 3/2025 | Yoo | H10B 12/482 |
| 2025/0107066 | A1 * | 3/2025 | Yoo | H10B 12/482 |
| 2025/0107071 | A1 * | 3/2025 | Kang | H10B 12/488 |
| 2025/0169083 | A1 * | 5/2025 | Jung | H10B 80/00 |
| 2025/0176156 | A1 * | 5/2025 | Kim | H10B 12/03 |
| 2025/0185233 | A1 * | 6/2025 | Shin | H10B 12/315 |
| 2025/0220893 | A1 * | 7/2025 | Sung | H10B 12/482 |
| 2025/0287569 | A1 * | 9/2025 | Choi | H10B 12/33 |
| 2025/0287575 | A1 * | 9/2025 | Chang | H10B 12/05 |
| 2026/0105940 | A1 * | 4/2026 | Kim | G11C 5/063 |
| 2026/0105941 | A1 * | 4/2026 | Roh | G11C 5/063 |
| 2026/0107446 | A1 * | 4/2026 | Kim | H10B 12/05 |
| 2026/0129834 | A1 * | 5/2026 | Jeong | H10B 12/315 |

FOREIGN PATENT DOCUMENTS

| | | | |
|---|---|---|---|
| KR | 1020220043981 | A | 4/2022 |
| TW | 202228275 | A | 7/2022 |

* cited by examiner

SEMICONDUCTOR MEMORY DEVICE

CROSS-REFERENCE TO RELATED APPLICATION

This application claims priority from Korean Patent Application No. 10-2023-0034993 filed on Mar. 17, 2023 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a semiconductor memory device, and more particularly, to a semiconductor memory device including a vertical channel transistor (VCT).

2. Description of the Related Art

The degree of integration of semiconductor memory devices is constantly increasing to satisfy excellent performance and low prices desired by consumers. In the case of semiconductor memory devices, because the degree of integration is an important factor in determining the price of a product, an increased degree of integration is particularly desirable.

In the case of a two-dimensional or planar semiconductor memory device, the degree of integration is mainly determined by an area occupied by unit memory cells, and is therefore greatly affected by the capabilities of fine pattern forming technology. Though since ultra-expensive apparatuses are currently being used to miniaturize patterns on semiconductor devices, and the degree of integration of the two-dimensional semiconductor memory device is increasing, the degree of integration is still limited. Therefore, semiconductor memory devices that include a vertical channel transistor having a channel extending in a vertical direction are being developed.

SUMMARY

Aspects of the present disclosure provide a semiconductor memory device having improved integration and electrical characteristics.

However, aspects of the present disclosure are not restricted to those set forth herein. The above and other aspects of the present disclosure will become more apparent to one of ordinary skill in the art to which the present disclosure pertains by referencing the detailed description of the present disclosure given below.

According to an aspect of the present disclosure, a semiconductor memory device includes a peri-gate structure on a substrate; a first bonding pad on the peri-gate structure; a shielding conductive pattern on the first bonding pad; a second bonding pad between the shielding conductive pattern and the first bonding pad, the second bonding pad being in contact with the first bonding pad; a bit line on the shielding conductive pattern, the bit line extending in a first direction; an active pattern on the bit line, the active pattern including a lower surface and an upper surface opposite to each other in a second direction, and a first side wall and a second side wall opposite to each other in the first direction, the lower surface of the active pattern being connected to the bit line; a word line on the first side wall of the active pattern, the word line extending in a third direction; and a data storage pattern on the active pattern, the data storage pattern being connected to the upper surface of the active pattern.

According to another aspect of the present disclosure, a semiconductor memory device includes a peri-gate structure on a substrate; a lower peri-connecting structure on the peri-gate structure; a shielding conductive pattern on the lower peri-connecting structure, the shielding conductive pattern including a shielding conductive plate and a plurality of shielding conductive protrusions, the plurality of shielding conductive protrusions protruding from the shielding conductive plate in a first direction; a bit line on the shielding conductive pattern, wherein the bit line extends in a second direction and is connected to the lower peri-connecting structure; an active pattern on the bit line, the active pattern including a lower surface and an upper surface opposite to each other in the first direction, and a first side wall and a second side wall opposite to each other in the second direction, the lower surface of the active pattern being connected to the bit line; a word line on the first side wall of the active pattern, wherein the word line extends in the third direction and is connected to the lower peri-connecting structure; a back gate electrode on the second side wall of the active pattern, the back gate electrode extending in the third direction; and a data storage pattern on the active pattern, the data storage pattern being connected to the upper surface of the active pattern.

According to still another aspect of the present disclosure, a semiconductor memory device includes a peri-gate structure on a substrate; a lower peri-connecting structure on the peri-gate structure; a first lower bonding pad and a second lower bonding pad on the lower peri-connecting structure, the first lower bonding pad structure and the second lower bonding pad structure being connected to the lower peri-connecting structure; a first upper bonding pad and a second upper bonding pad on the first lower bonding pad and the second lower bonding pad, respectively; a shielding conductive pattern on the first upper bonding pad and the second upper bonding pad, the shielding conductive pattern including a shielding conductive plate and a plurality of shielding conductive protrusions, each of the plurality of shielding conductive protrusions protruding from the shielding conductive plate in a first direction and extending in a second direction; a bit line between shielding conductive protrusions adjacent to each other in a third direction, the bit line extending in the second direction; a first word line on the bit line and the shielding conductive pattern, the first word line extending in the third direction; a second word line on the bit line and the shielding conductive pattern, wherein the second word line extends in the third direction and is spaced apart from the first word line in the second direction; a first upper pad plug which connects the bit line to the first upper bonding pad; a second upper pad plug which connects the first word line to the second upper bonding pad, and which connects the second word line to the second upper bonding pad; a back gate electrode between the first word line and the second word line, the back gate electrode extending in the third direction; a first active pattern on the bit line, between the first word line and the back gate electrode; a second active pattern on the bit line, between the second word line and the back gate electrode; a data storage pattern on the first active pattern and the second active pattern, the data storage pattern being connected to the first active pattern and the second active pattern; an upper peri-connecting structure on the data storage pattern; and a through connecting via which connects the lower peri-connecting structure to the upper peri-connecting structure.

BRIEF DESCRIPTION OF THE DRAWINGS

The above and other aspects and features of the present disclosure will become more apparent by describing in detail example embodiments thereof with reference to the attached drawings, in which.

DETAILED DESCRIPTION OF THE EMBODIMENTS

Although terms such as first and second are used to describe various elements or components in the present specification, it goes without saying that these elements or components are not limited by these terms. These terms are only used to distinguish a single element or component from other elements or components. Therefore, it goes without saying that a first element or component referred to below may be a second element or component within the technical idea of the present disclosure.

Figure 1:
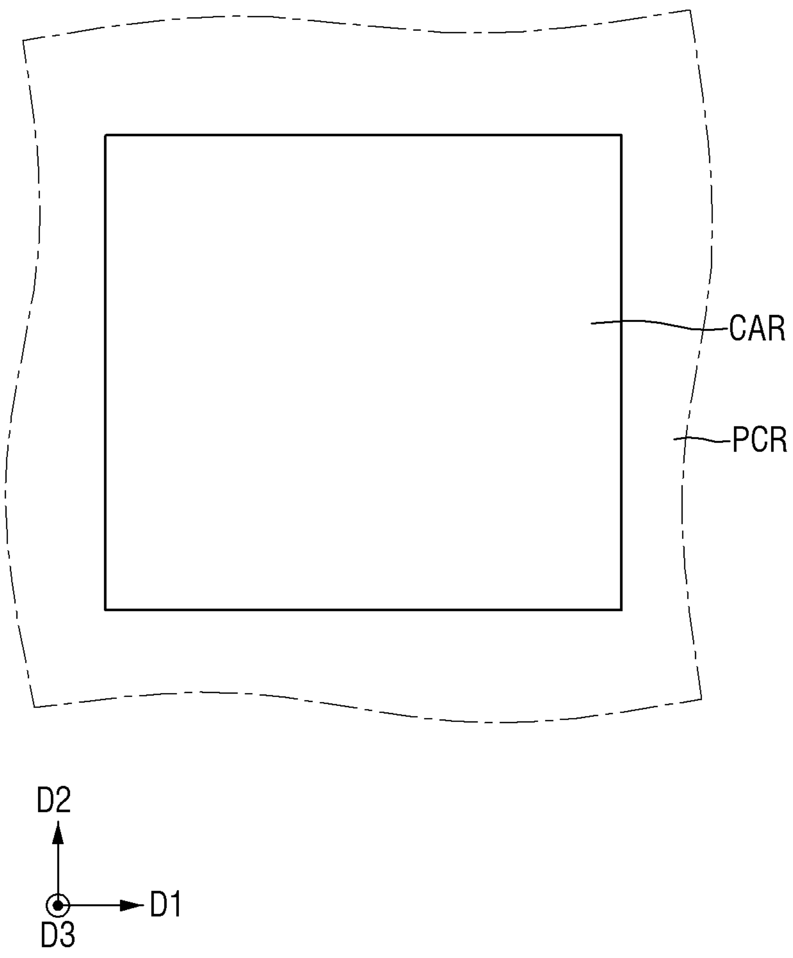
FIG. 1 is a layout diagram of a semiconductor memory device according to some embodiments.
Figure 2:
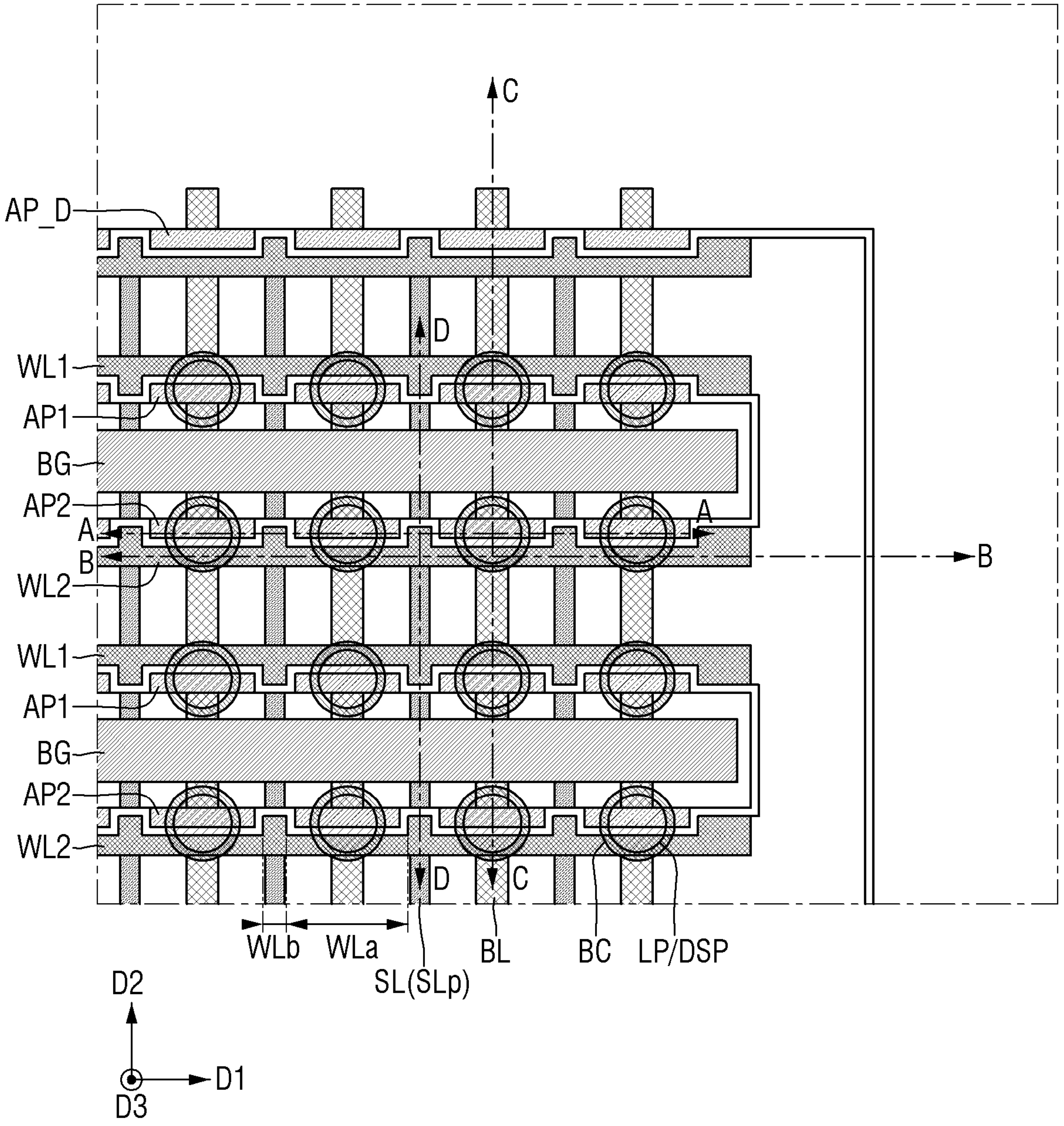
FIG. 2 is a plan view of a boundary portion between a cell array region and a peripheral circuit region of FIG. 1.
Figure 3:
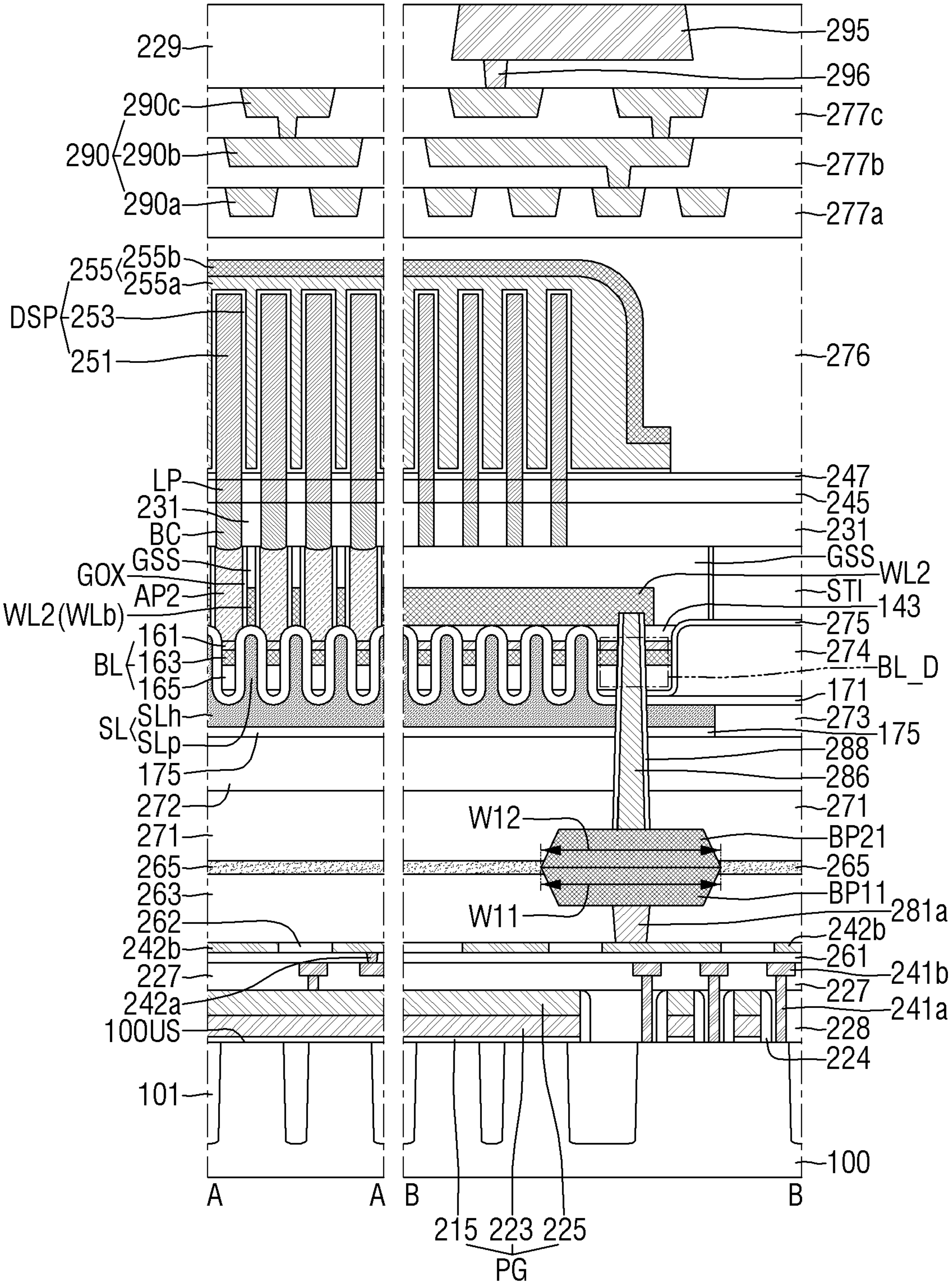
FIG. 3 is a cross-sectional view taken along A-A and B-B of FIG. 2.
Figure 4:
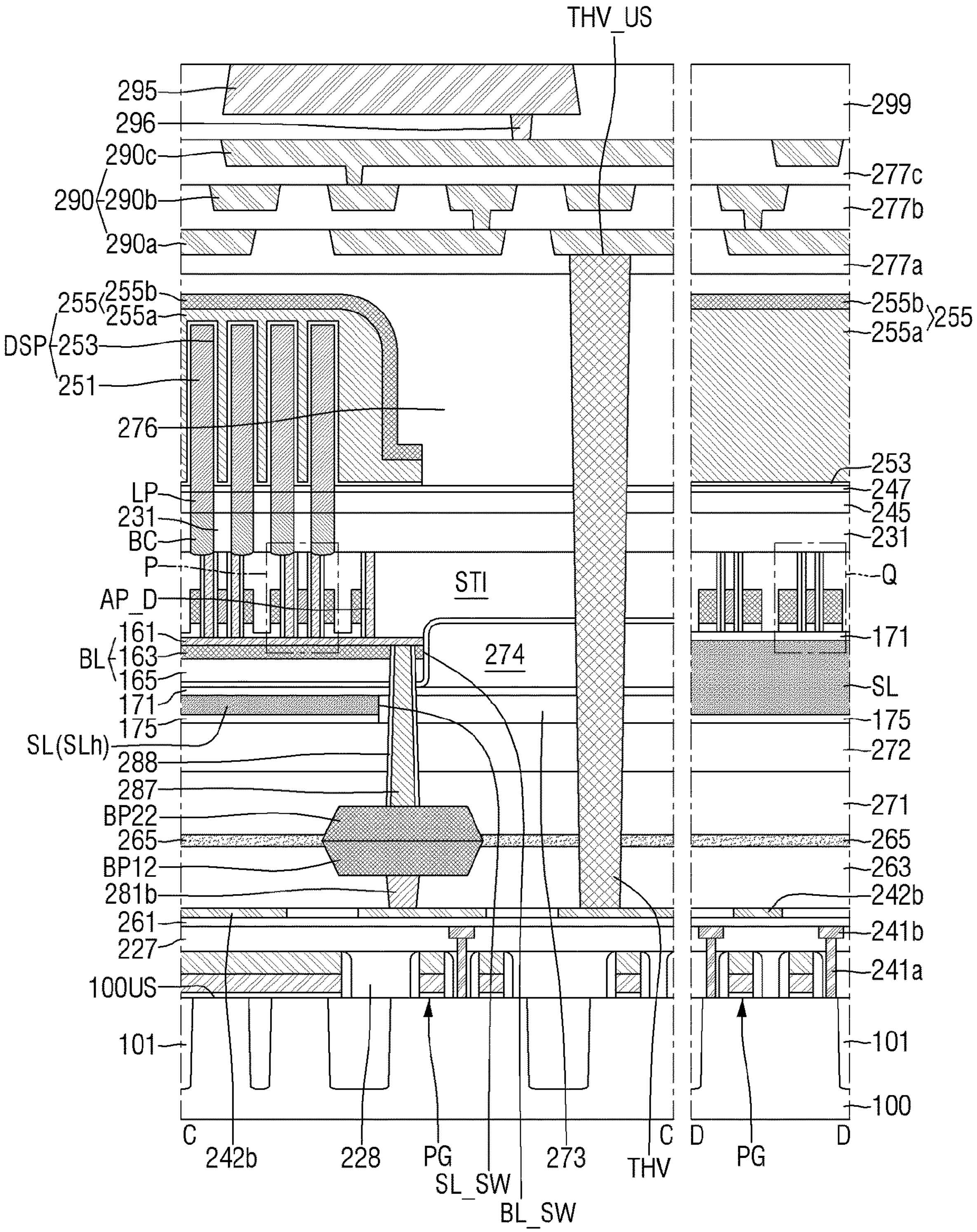
FIG. 4 is a cross-sectional view taken along C-C and D-D of FIG. 2.
Figure 5:
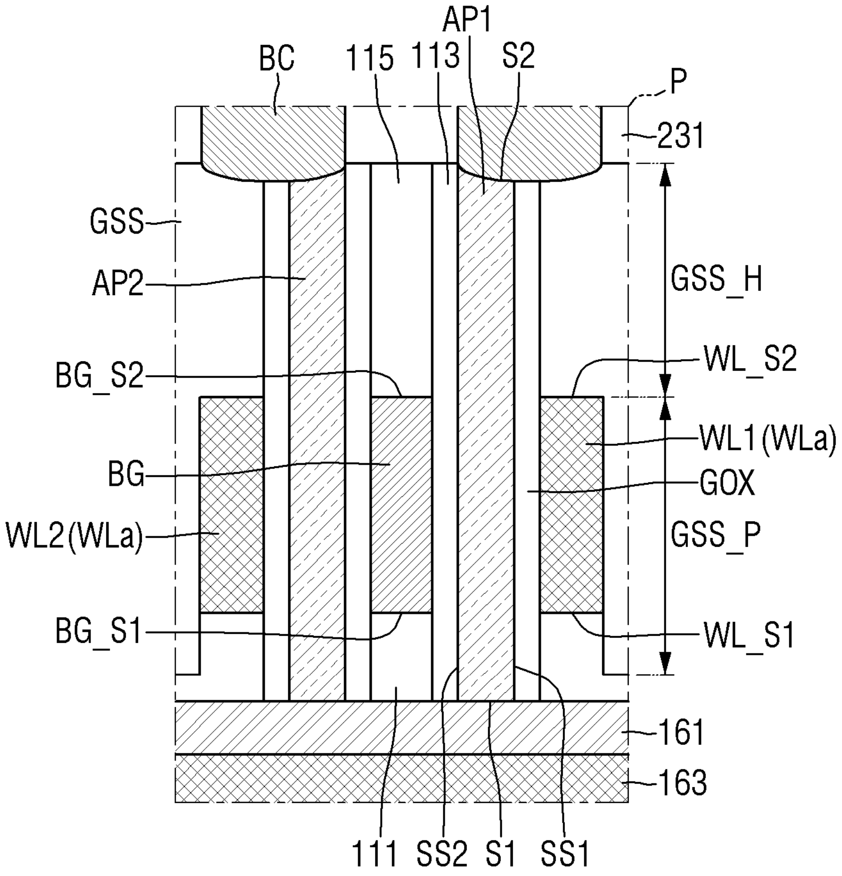
FIG. 5 is an enlarged view of a portion P of FIG. 4.
Figure 6:
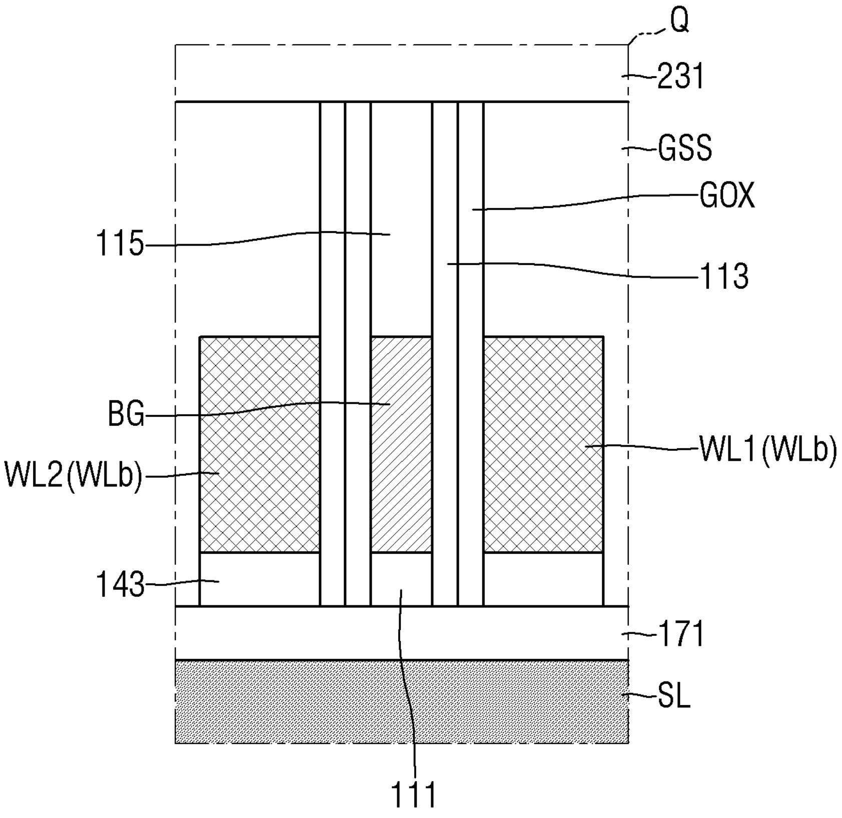
FIG. 6 is an enlarged view of a portion Q of FIG. 4.

FIG. 1 is a layout diagram of a semiconductor memory device according to some embodiments. FIG. 2 is a plan view of a boundary portion between a cell array region and a peripheral circuit region of FIG. 1. FIG. 3 is a cross-sectional view taken along A-A and B-B of FIG. 2. FIG. 4 is a cross-sectional view taken along C-C and D-D of FIG. 2. FIG. 5 is an enlarged view of a portion P of FIG. 4. FIG. 6 is an enlarged view of a portion Q of FIG. 4. FIGS. 7 to 12 are diagrams for explaining a shape and/or an arrangement of a second upper bonding pad.

The semiconductor memory device according to embodiments of the present disclosure may include memory cells including a vertical channel transistor (VCT).

Referring to FIGS. 1 to 12, the semiconductor memory device according to some embodiments may include bit lines BL, word lines WL1 and WL2, back gate electrodes BG, a shielding conductive pattern SL, active patterns AP1 and AP2, data storage patterns DSP, a first lower bonding pad BP11, a second lower bonding pad BP12, a first upper bonding pad BP21, a second upper bonding pad BP22, and a through connecting via THV.

The substrate 100 may be a silicon substrate or may be or include, but is not limited to, other materials, for example, silicon germanium, indium antimonide, lead telluride, indium arsenic, indium phosphide, gallium arsenide or gallium antimonide.

The substrate 100 may include an upper side 100US. An element isolation film 101 may be disposed in the substrate 100. The element isolation film 101 may define an active region inside the substrate 100. The element isolation film 101 includes an insulating material.

The substrate 100 may include a cell array region CAR in which the data storage pattern DSP is disposed, and a peripheral circuit region (e.g., a peri-region) PCR defined around the cell array region CAR. A cell region element isolation film STI may be disposed on the peripheral circuit region PCR of the substrate 100. In a plan view, the cell region element isolation film STI may define the cell array region CAR of the substrate 100.

A peri-gate structure PG may be disposed on the substrate 100. For example, the peri-gate structure PG may be disposed on the upper side 100US of the substrate. The peri-gate structure PG may be disposed over the cell array region CAR and the peripheral circuit region PCR. In other words, a part of the peri-gate structure PG is disposed in the cell array region CAR of the substrate 100, and the rest of the peri-gate structure PG may be disposed in the peripheral circuit region PCR of the substrate 100.

The peri-gate structure PG may be included in a sensing transistor, a transfer transistor, a driving transistor, and the like. For example, the peri-gate structure PG included in the sensing transistor may be disposed on the substrate 100 of the cell array region CAR, but is not limited thereto. The types of transistors of the peripheral circuits disposed on the substrate 100 of the cell array region CAR may vary depending on a design arrangement of the semiconductor memory device.

The peri-gate structure PG may include a peri-gate insulating film 215, a peri-lower conductive pattern 223, and a peri-upper conductive pattern 225. The peri-gate insulating film 215 may be or include a silicon oxide film, a silicon oxynitride film, a high dielectric constant insulating film having a dielectric constant higher than that of the silicon oxide film or a combination thereof. The high dielectric constant insulating film may include, for example, but is not limited to, at least one of metal oxide, metal oxynitride, metal silicon oxide, and metal silicon oxynitride.

The peri-lower conductive pattern 223 and the peri-upper conductive pattern 225 may each be or include a conductive material. For example, the peri-lower conductive pattern 223 and the peri-upper conductive pattern 225 may each include at least one of a doped semiconductor material, a conductive metal nitride, a conductive metal silicon nitride, a metal carbonitride, a conductive metal silicide, a conductive metal oxide, a two-dimensional material (2D material), and a metal. In the semiconductor device according to some embodiments, the two-dimensional material may be a metallic material and/or a semiconductor material. The 2D material may include a 2D allotrope or a 2D compound, and may include, but is not limited to, at least one of graphene, molybdenum disulfide ($MoS_2$), molybdenum diselenide ($MoSe_2$), tungsten diselenide ($WSe_2$), and tungsten disulfide ($WS_2$). That is, since the above-mentioned 2D materials are only listed as an example, the 2D materials that may be included in the semiconductor memory device of the present disclosure are not limited by the above-mentioned materials.

Although the peri-gate structure PG is shown to include the plurality of conductive patterns, the embodiment is not limited thereto.

The peri-gate spacer 224 may be disposed on the side wall of the peri-gate structure PG. The peri-gate spacer 224 may be or include an insulating material.

A first peri-lower insulating film 227 and a second peri-lower insulating film 228 are disposed on the upper side 100US of the substrate. The first peri-lower insulating film 227 and the second peri-lower insulating film 228 may each be or include an insulating material.

A peri-wiring line 241*a* and a peri-contact plug 241*b* may be disposed in the first peri-lower insulating film 227 and the second peri-lower insulating film 228. The peri-wiring line 241*a* and the peri-contact plug 241*b* may be connected to the conductive patterns 223 and 225 of the peri-gate structure PG. Although it is not shown, the peri-wiring line 241*a* and the peri-contact plug 241*b* may be connected to a source/drain region disposed on at least one side of the peri-gate structure PG.

Although the peri-wiring line 241*a* and the peri-contact plug 241*b* are shown to be different films from each other, the embodiment is not limited thereto. A boundary between the peri-wiring line 241*a* and the peri-contact plug 241*b* may not be distinguished. For example, the peri-wiring line 241*a* and the peri-contact plug 241*b* may be continuously provided with no boundary therebetween. The peri-wiring line 241*a* and the peri-contact plug 241*b* may each be or include a conductive material.

The first peri-upper insulating film 261 and the second peri-upper insulating film 262 are disposed on the peri-wiring line 241*a* and the peri-contact plug 241*b*. The first peri-upper insulating film 261 and the second peri-upper insulating film 262 may each be or include an insulating material. An insulating film made up of a single film may be disposed on the peri-wiring line 241*a* and the peri-contact plug 241*b*, unlike the shown example.

The lower peri-connecting structures 242*a* and 242*b* may be connected to the peri-wiring line 241*a*. The lower peri-connecting structures 242*a* and 242*b* may include a lower peri-connecting via 242*a* and a lower peri-connecting wiring line 242*b*. Although the lower peri-connecting via 242*a* and the lower peri-connecting wiring line 242*b* are shown as different elements from each other, the embodiment is not limited thereto. For example, the lower peri-connecting via 242*a* and the lower peri-connecting wiring line 242*b* may be continuously provided with no boundary therebetween. The lower peri-connecting via 242*a* and the lower peri-connecting wiring line 242*b* each include a conductive material.

A first lower bonding pad BP11 and a second lower bonding pad BP12 may be disposed on the peri-gate structure PG. The first lower bonding pad BP11 and the second lower bonding pad BP12 may each be connected to the lower peri-connecting structures 242*a* and 242*b*. For example, the first lower bonding pad BP11 and the second lower bonding pad BP12 may be connected to the lower peri-connecting structures 242*a* and 242*b*, respectively. As an example, at least one of the first lower bonding pad BP11 and the second lower bonding pad BP12 may be connected to the peri-gate structure PG. As another example, at least one of the first lower bonding pad BP11 and the second lower bonding pad BP12 may be connected to a source/drain region disposed on at least one side of the peri-gate structure PG.

The first lower pad plug 281*a* may connect the first lower bonding pad BP11 to the lower peri-connecting wiring line 242*b*. The second lower pad plug 281*b* may connect the second lower bonding pad BP12 to the lower peri-connecting wiring line 242*b*.

The first lower bonding pad BP11, the second lower bonding pad BP12, the first lower pad plug 281*a* and the second lower pad plug 281*b* may be disposed in the lower pad insulating film 263.

A first upper bonding pad BP21 and a second upper bonding pad BP22 may be disposed on the first lower bonding pad BP11 and the second lower bonding pad BP12, respectively. The first upper bonding pad BP21 and the second upper bonding pad BP22 may be disposed on the lower pad insulating film 263.

The first upper bonding pad BP21 may be connected to the first lower bonding pad BP11. The first upper bonding pad BP21 may be in contact with the first lower bonding pad BP11. The second upper bonding pad BP22 may be connected to the second lower bonding pad BP12. The second upper bonding pad BP22 may be in contact with the second lower bonding pad BP12.

It will be understood that when an element is referred to as "contacting" or "in contact with" another element (or using any form of the word "contact"), there are no intervening elements present at the point of contact.

The first upper pad plugs 286 may connect the first upper bonding pad BP21 to the word lines WL1 and WL2. The second upper pad plug 287 may connect the second upper bonding pad BP22 and the bit line BL.

The first upper bonding pad BP21 and the second upper bonding pad BP22 may be disposed in the first upper pad insulating film 271. A part of the first upper pad plug 286 may be disposed in the first upper pad insulating film 271 and the second upper pad insulating film 272 and a part of the second upper pad plug 287 may be disposed in the first upper pad insulating film 271 and the second upper pad insulating film 272.

An upper plug liner 288 may be disposed along a side wall of the first upper pad plug 286. The upper plug liner 288 may be disposed along a side wall of the second upper pad plug 287. The upper plug liner 288 may not be disposed on the side wall of the second upper pad plug 287, unlike the shown example. Although not shown, a plug liner, such as the upper plug liner 288, may be disposed on the side wall of the first lower pad plug 281*a* and the side wall of the second lower pad plug 281*b*.

The upper pad plugs 286 and 287 and the lower pad plugs 281*a* and 281*b* may be formed of or include a conductive material including a metal. The lower bonding pads BP11 and BP12 and the upper bonding pads BP21 and BP22 may each be formed of or include a conductive material including a metal. Although the lower bonding pads BP11 and BP12 and the upper bonding pads BP21 and BP22 are each shown as a single film, this is only for convenience of explanation, and the invention is not limited thereto.

Each of the lower pad insulating film 263, the first upper pad insulating film 271 and the second upper pad insulating film 272 may be formed of or include an insulating material. The first upper pad insulating film 271 and the second upper pad insulating film 272 may be disposed as an insulating film made up of a single film on the lower pad insulating film 263. The upper plug liner 288 includes an insulating material.

A first lower bonding pad BP11 and a first upper bonding pad BP21 will be explained as an example. At the boundary between the first lower bonding pad BP11 and the first upper bonding pad BP21, a width W11 of the first lower bonding pad BP11 may be the same as a width W12 of the first upper bonding pad BP21. As an example, at the boundary between the first lower bonding pad BP11 and the first upper bonding pad BP21, the first lower bonding pad BP11 may completely overlap the first upper bonding pad BP21 in a third direction D3. As another example, at the boundary between the first lower bonding pad BP11 and the first upper bonding pad BP21, a part of the first lower bonding pad BP11 may overlap the first upper bonding pad BP21 in the third direction D3.

The first lower bonding pad BP11 and the first upper bonding pad BP21 may be disposed near the boundary of the cell array region CAR. The first lower bonding pad BP11 and the first upper bonding pad BP21 may be arranged in the second direction D2 along the boundary of the cell array region CAR. The first upper pad plug 286 may be connected to the ends of the word lines WL1 and WL2 in the vicinity of the boundary of the cell array region CAR. For example, the first upper pad plug may be connected to an end of one or more of the word line WL1 and WL2 at a position of the world line corresponding to a boundary of the cell array region.

Figure 7:
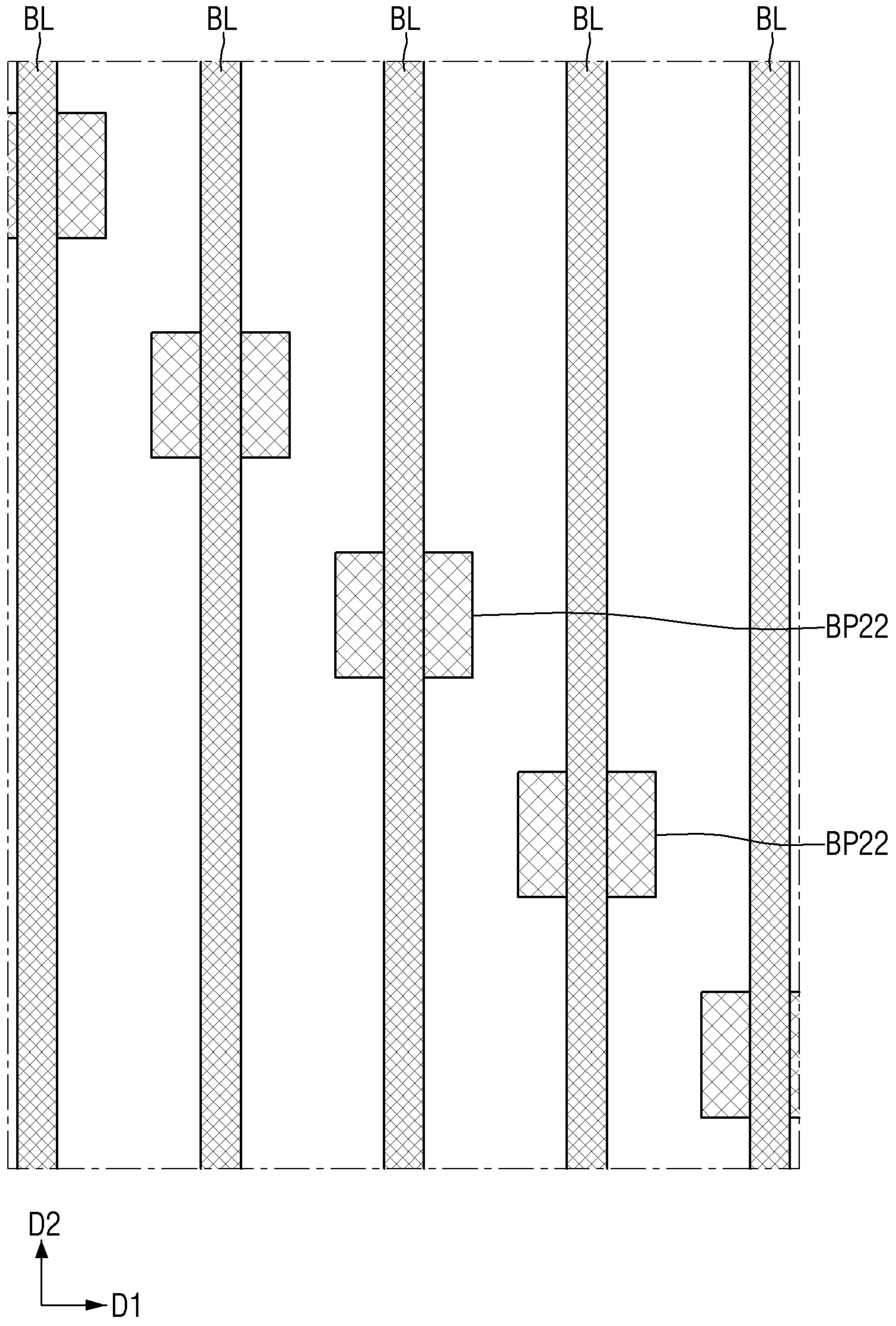
FIGS. 7 to 12 are diagrams for explaining a shape and/or an arrangement of a second upper bonding pad.
Figure 8:
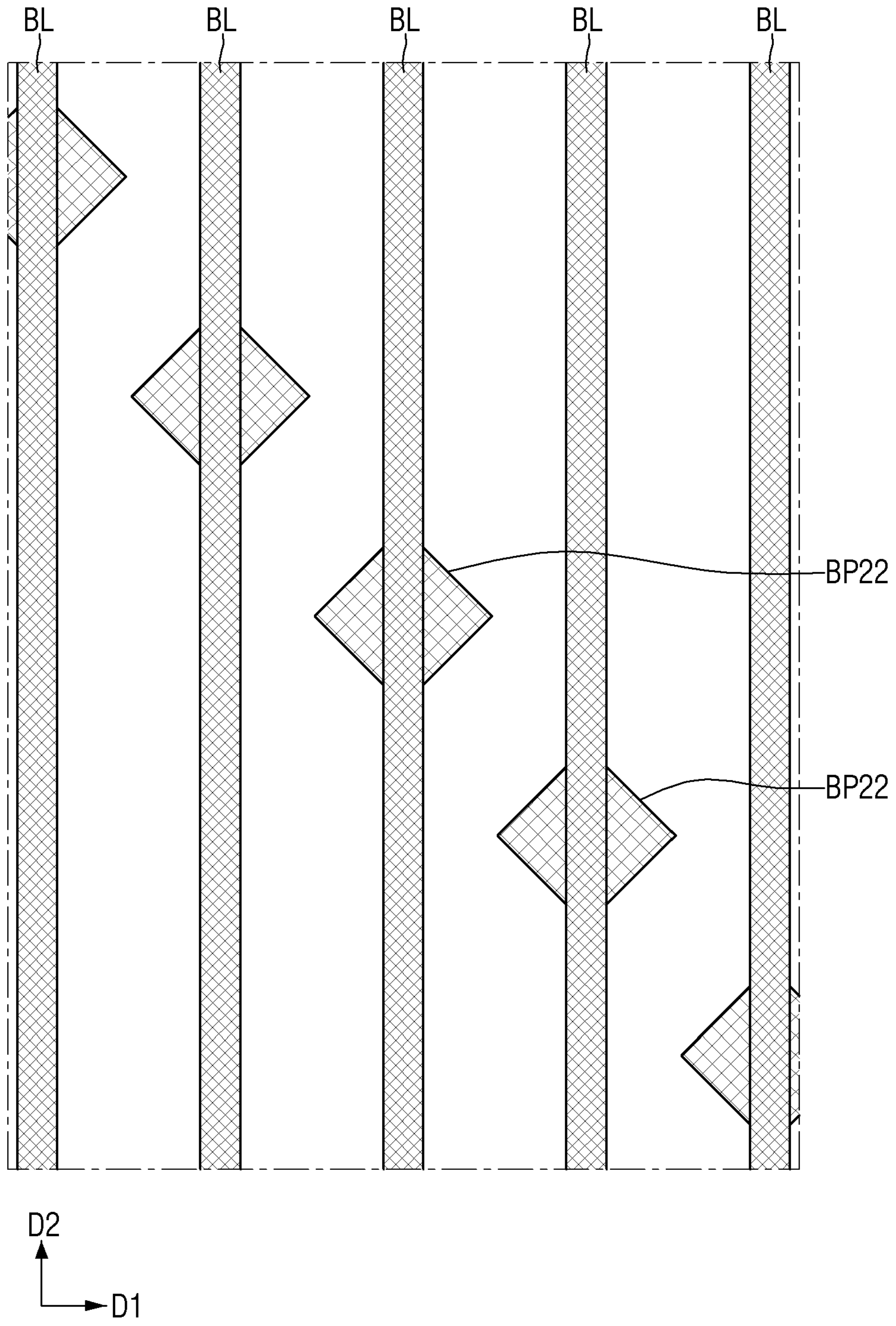
Figure 9:
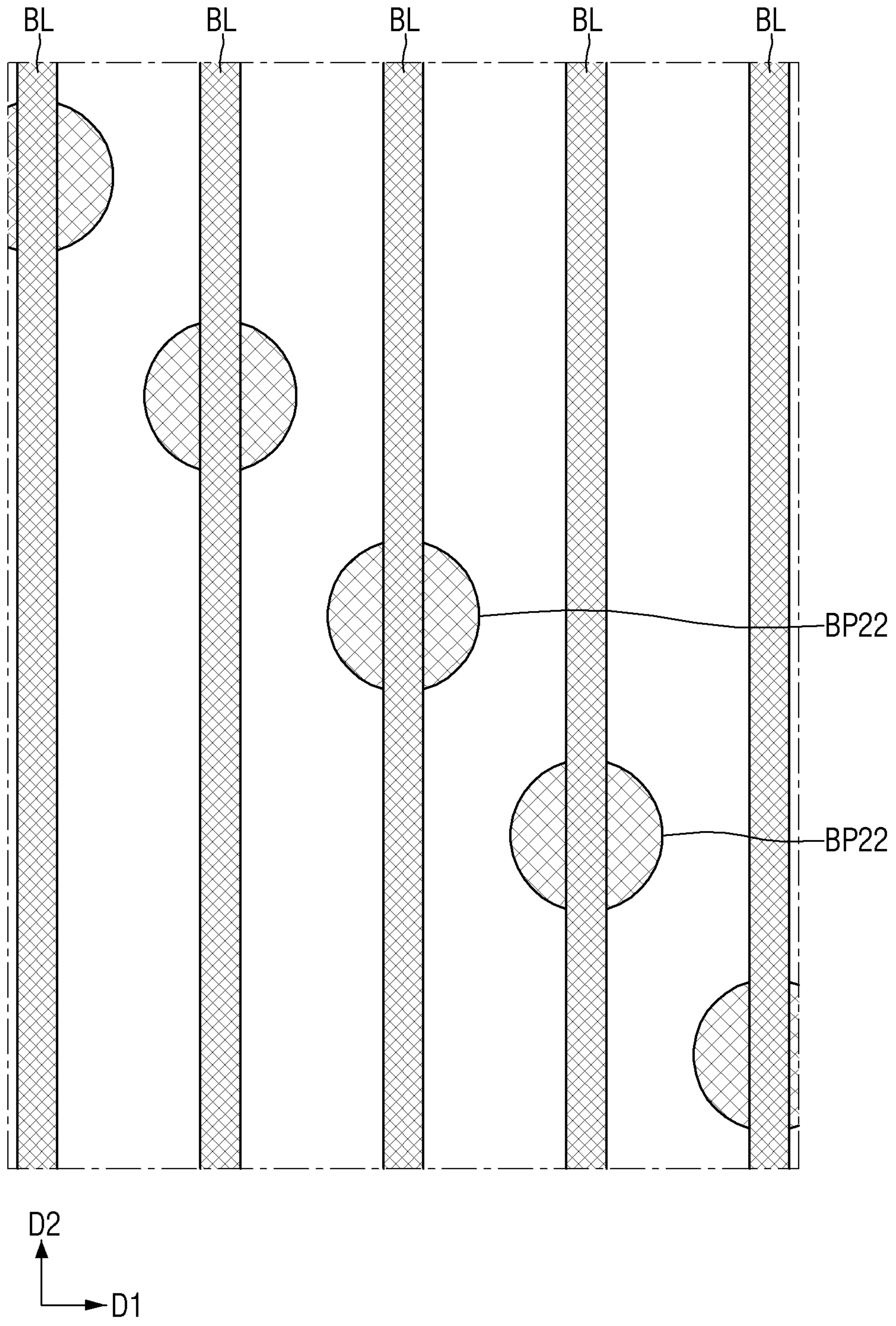
Figure 10:
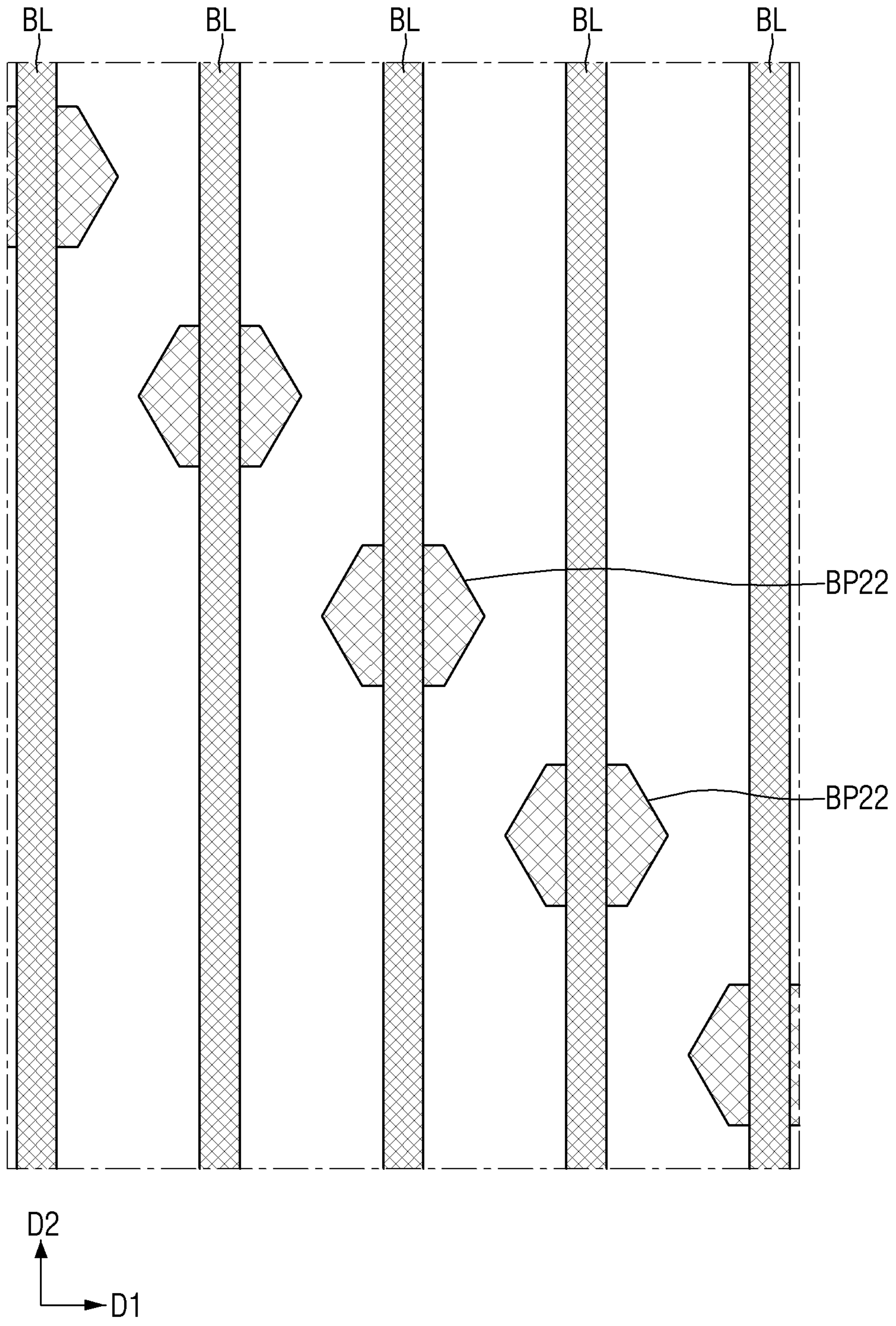

As shown in FIG. 7, for example, the second upper bonding pad BP22 may have a square shape in plan view. In FIG. 8, the second upper bonding pad BP22 may have a rhombus shape in plan view. In FIG. 9, the second upper bonding pad BP22 may have a circular or elliptical shape in plan view. In FIG. 10, the second upper bonding pad BP22 may have a hexagonal shape in plan view. Although it is not shown, the first lower bonding pad BP11, the second lower bonding pad BP12, and the first upper bonding pad BP21 may each have various shapes such as square, rhombus, circle, oval, and hexagon in plan view.

In FIGS. 7 to 12, the second upper bonding pad BP22 may include a plurality of bonding pads connected to the bit lines BL spaced apart from each other in the first direction D1. The second upper bonding pads BP22 may be arranged in a diagonal direction that intersects both the first direction D1 and the second direction D2. Here, the diagonal direction may be parallel to the upper side 100US of the substrate.

As shown in FIGS. 7 to 10, the second upper bonding pads BP22 may be discretely disposed along the diagonal direction. However, the invention is not limited thereto, and the second upper bonding pad BP22 may be continuously disposed along the diagonal direction.

Figure 11:
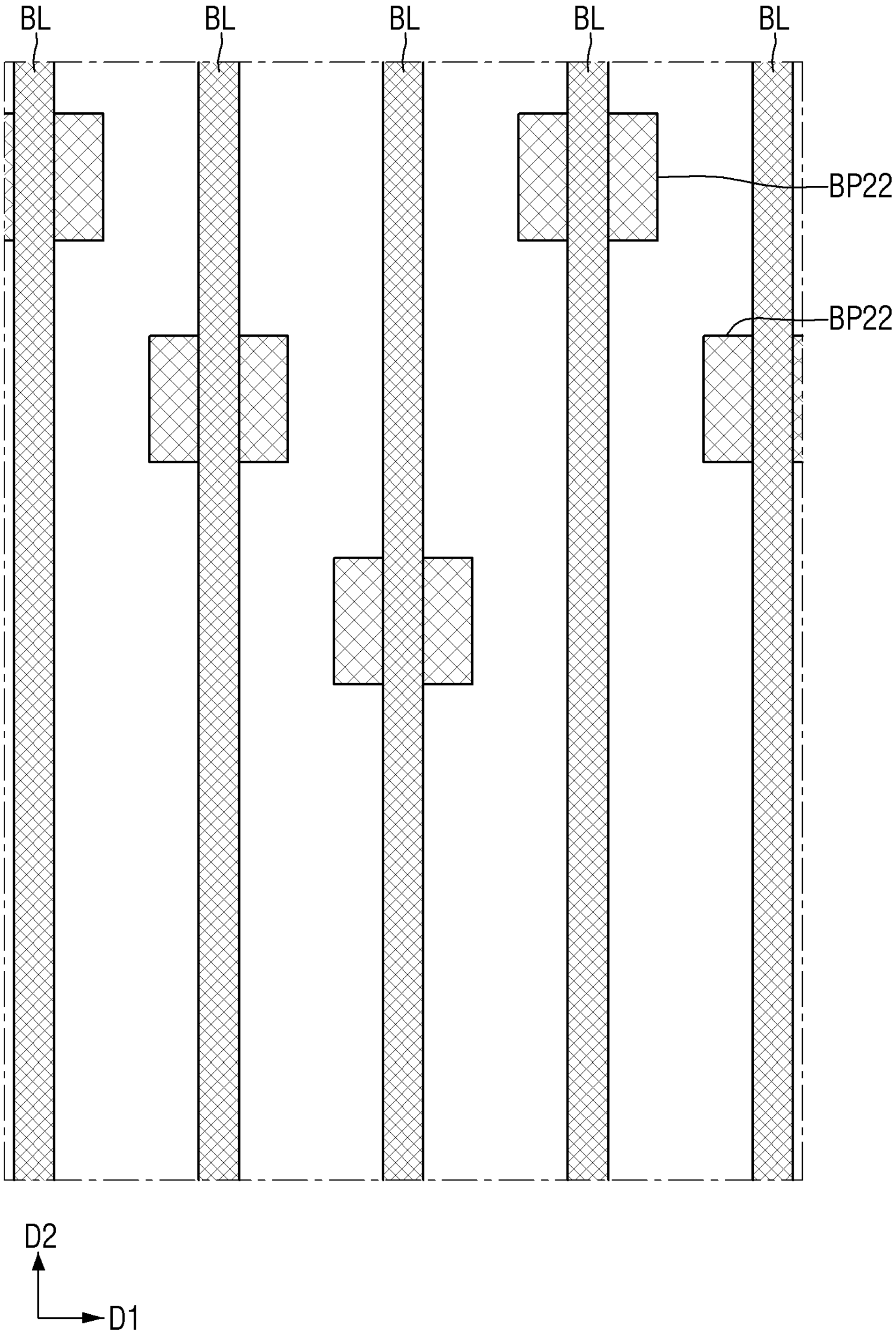

In FIG. 11, the second upper bonding pads BP22 may include a plurality of pad groups, each group including three or more second bonding pads BP22. The three or more second upper bonding pads BP22 included in each pad group may be discretely disposed along the diagonal direction. The pad groups themselves may be arranged along the first direction D1.

Figure 12:
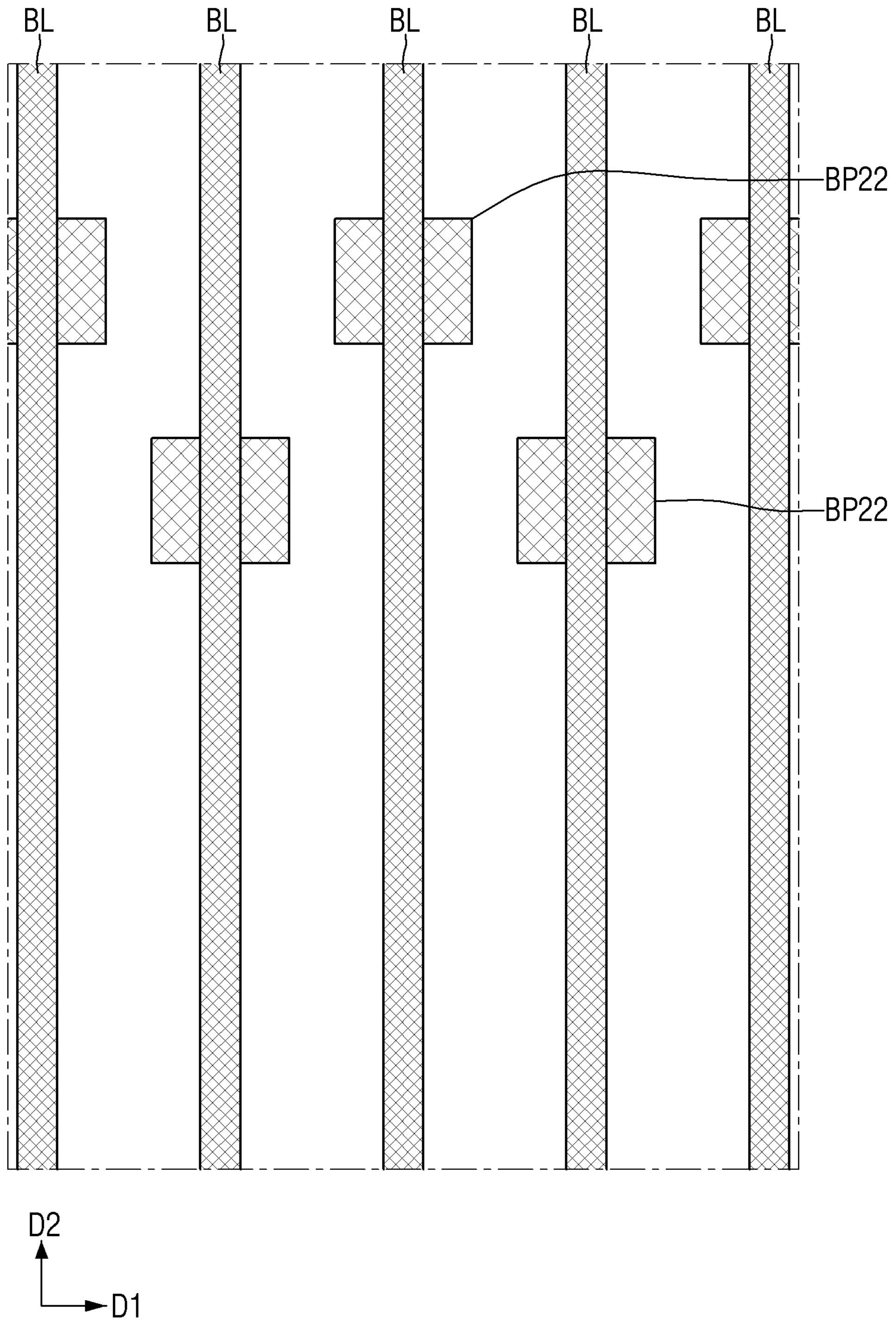

In FIG. 12, the second upper bonding pads BP22 may be arranged in a zigzag pattern along the first direction D1 and the diagonal direction.

A first bonding insulating film 265 may be disposed between the lower pad insulating film 263 and the first upper pad insulating film 271. A first bonding insulating film 265 may be disposed between the peri-gate structure PG and the shielding conductive pattern SL.

The first bonding insulating film 265 may be disposed along an extension line of an interface between the first lower bonding pad BP11 and the first upper bonding pad BP21. The first bonding insulating film 265 may be disposed along an extension line of an interface between the second lower bonding pad BP12 and the second upper bonding pad BP22. The interface between the lower bonding pads BP11 and BP12 and the upper bonding pads BP21 and BP22 may be the boundary between the lower bonding pads BP11 and BP12 and the upper bonding pads BP21 and BP22.

The first bonding insulating film 265 may be used to bond the lower bonding pads BP11 and BP12 to the upper bonding pads BP21 and BP22, respectively. The first bonding insulating film 265 may be or include, for example, silicon carbonitride (SiCN).

It will be understood that a first element described as being "on" or "disposed on" a second element may be in contact with the second element, or there may be one or more other elements between the first and second elements.

Shielding structures 171, SL, and 175 may be disposed on the first upper bonding pad BP21 and the second upper bonding pad BP22. The shielding structures 171, SL, and 175 may be disposed on the second upper pad insulating film 272.

The shielding structures 171, SL and 175 may include a shielding conductive pattern SL and shielding insulating films 171 and 175. The shielding insulating films 171 and 175 may include a shielding insulating liner 171 and a shielding insulating capping film 175.

A shielding conductive pattern SL may be disposed on the lower peri-connecting structures 242*a* and 242*b*. The upper bonding pads BP21 and BP22 may be disposed between the shielding conductive pattern SL and the lower bonding pads BP11 and BP12, respectively.

The shielding conductive pattern SL may include a shielding conductive plate SLh and a plurality of shielding conductive protrusions SLp. The shielding conductive plate SLh may have a flat plate shape. The shielding conductive plate SLh may be disposed on the cell array region CAR.

An item, layer, or portion of an item or layer described as "extending" in a particular direction has a length in the particular direction and a width perpendicular to that direction, where the length is greater than the width.

The plurality of shielding conductive protrusions SLp may protrude from the shielding conductive plate SLh in the third direction D3. Each shielding conductive protrusion SLp may protrude toward the word lines WL1 and WL2. Each shielding conductive protrusion SLp may extend in the second direction D2. The shielding conductive protrusions SLp may be adjacent to each other in the first direction D1.

A shielding insulating capping film 175 may be disposed on the second upper pad insulating film 272. The shielding insulating capping film 175 may be disposed between the second upper pad insulating film 272 and the shielding conductive pattern SL.

A shielding insulating liner 171 may be disposed on the shielding conductive pattern SL. The shielding insulating liner 171 may extend along profiles of the shielding conductive plate SLh and the shielding conductive protrusion SLp. The shielding conductive pattern SL may be disposed between the shielding insulating liner 171 and the shielding insulating capping film 175.

A part of the shielding insulating liner 171 may extend along the upper side of the first upper insulating film 273. The first upper insulating film 273 may be disposed on the second upper pad insulating film 272. The first upper insulating film 273 may cover a side wall of the shielding insulating capping film 175 and a side wall SL_SW of the shielding conductive pattern. The shielding conductive plate SLh includes the side wall SL_SW of the shielding conductive pattern.

The shielding conductive pattern SL may be formed of or include a conductive material. The shielding conductive pattern SL may include, for example, at least one of conductive metal nitride, conductive metal silicon nitride, metal carbonitride, conductive metal silicide, conductive metal oxide, a two-dimensional material and a metal. The shielding insulating liner 171, the shielding insulating capping film 175, and the first upper insulating film 273 may each be formed of or include an insulating material.

The bit lines BL may be disposed on the shielding conductive pattern SL. The bit line BL may extend in the second direction D2. Adjacent bit lines BL may be spaced apart in the first direction D1.

Each bit line BL may be disposed on the shielding conductive plate SLh. The bit line BL may be disposed between the shielding conductive protrusions SLp adjacent to each other in the first direction D1 (see, e.g., FIG. 2).

Each bit line BL may extend from the cell array region CAR to the peripheral circuit region PCR. An end portion of each bit line BL may be disposed on the peripheral circuit region PCR. A part of the bit line BL may overlap the cell region element isolation film STI that surrounds the cell array region CAR in the third direction D3.

As used herein, the term "dummy" is used to refer to a component that has the same or similar structure and shape as other components but does not have a substantial function and exists only as a pattern in the device.

A dummy bit line BL_D may be disposed on the shielding conductive pattern SL. The dummy bit line BL_D may be disposed on the shielding conductive plate SLh.

In FIG. 3, the shielding conductive protrusion SLp may be disposed on one side of the dummy bit line BL_D. However, the shielding conductive protrusion SLp may not be disposed on the other side of the dummy bit line BL_D.

The dummy bit line BL_D may be disposed at an outermost part of the cell array region CAR. A width of the dummy bit line BL_D in the first direction D1 may be greater than a width of the bit line BL in the first direction D1.

The bit line BL and the dummy bit line BL_D may include a semiconductor pattern 161, a metal pattern 163, and a bit line mask pattern 165, which are sequentially stacked. Unlike the shown example, the bit line BL may include one of a semiconductor pattern 161 and a metal pattern 163.

The bit line BL and the dummy bit line BL_D may include a conductive bit line. The conductive bit line may be a film including a conductive material among the bit line BL and the dummy bit line BL_D. The conductive bit line may include a semiconductor pattern 161 and a metal pattern 163.

The semiconductor pattern 161 may be formed of or include a conductive semiconductor material. The semiconductor pattern 161 may include at least one of polysilicon, polysilicon germanium, poly germanium, amorphous silicon, amorphous silicon germanium, and amorphous germanium. The metal pattern 163 may be formed of or include a conductive material including a metal. The metal pattern 163 may include, for example, at least one of a conductive metal nitride, a conductive metal silicon nitride, a metal carbonitride, a conductive metal silicide, a conductive metal oxide, a two-dimensional material, and a metal. The bit line mask pattern 165 may be formed of or include an insulating material such as silicon nitride or silicon oxynitride.

In FIG. 4, the bit line BL may include a side wall BL_SW extending in the first direction D1. The side wall BL_SW of the bit line may be the end of the bit line BL. The shielding conductive pattern SL may include a side wall SL_SW of the shielding conductive pattern extending in the first direction D1. A part of the bit line BL may protrude in the second direction D2 beyond the side wall SL_SW of the shielding conductive pattern. The side wall BL_SW of the bit line may be located farther from the center of the cell array region CAR than the side wall SL_SW of the shielding conductive pattern.

The bit line BL may be connected to the second upper bonding pad BP22 through the second upper pad plug 287. For example, the second upper pad plug 287 may be directly connected to the bit line BL and the second upper bonding pad BP22. The bit line BL may be connected to the lower peri-connecting structures 242*a* and 242*b*.

The second upper pad plug 287 is connected to the conductive bit line of the bit line BL. Although the second upper pad plug 287 is shown to extend to the semiconductor pattern 161 of the conductive bit line, the invention is not limited thereto. Unlike the shown example, the second upper pad plug 287 may extend to the metal pattern 163 of the conductive bit line.

A second upper insulating film 274 may be disposed on the shielding insulating liner 171. The second upper insulating film 274 may be disposed around the bit line BL and the dummy bit line BL_D. A bit line etching stop film 275 may be disposed between the shielding structures 171, SL and 175 and the bit line BL.

A cell region element isolation film STI may be disposed on the second upper insulating film 274. In plan view, the cell region element isolation film STI may define the cell array region CAR in which word lines WL1 and WL2, back gate electrodes BG, active patterns AP1 and AP2, and the like are disposed. Although the cell region element isolation film STI is shown to be a single film, the invention is not limited thereto.

The bit line etching stop film 275 may be disposed between the shielding structure 171, SL and 175 and the dummy bit line BL_D. The bit line etching stop film 275 may extend along side walls BL_SW of the bit line. The bit line etching stop film 275 may be disposed between the second upper insulating film 274 and the cell region element isolation film STI.

The second upper insulating film 274, the cell region element isolation film STI, and the bit line etching stop film 275 may each be formed of or include an insulating material.

As shown, e.g., in FIG. 5, the first active patterns AP1 and the second active patterns AP2 may be disposed on each bit line BL. The first active patterns AP1 and the second active patterns AP2 may be alternately disposed along the second direction D2.

The first active patterns AP1 may be spaced apart from each other in the first direction D1. The first active patterns AP1 may be spaced apart at regular intervals. The second active patterns AP2 may be spaced apart from each other in the first direction D1. The second active patterns AP2 may be spaced apart at regular intervals. The first active pattern AP1 may be spaced apart from the second active pattern AP2 in the second direction D2. The first active patterns AP1 and the second active patterns AP2 may be arranged two-dimensionally along the first direction D1 and the second direction D2 that intersect each other.

For example, the first active pattern AP1 and the second active pattern AP2 may each be made of a single crystal semiconductor material. For example, the first active pattern AP1 and the second active pattern AP2 may each be made of single crystal silicon.

The first active pattern AP1 and the second active pattern AP2 may each have a length in the first direction D1, a width in the second direction D2, and a height in the third direction D3. Each of the first active pattern AP1 and the second active pattern AP2 may have a substantially uniform width. That is, each of the first active pattern AP1 and the second active pattern AP2 may have substantially the same width on the first and second sides S1 and S2 thereof (e.g., as shown in FIG. 5, a width at an upper surface S2 of each of the first active pattern AP1 and the second active pattern AP2 may be the same as a width at a lower surface S1 of each of the first active pattern AP1 and the second active pattern AP2. Also, the width of the first active pattern AP1 may be the same as the width of the second active pattern AP2.

The width of the first active pattern AP1 and the width of the second active pattern AP2 may be in a range from several nm to several tens of nm. For example, the width of the first active pattern AP1 and the width of the second active pattern AP2 may be, but are not limited to, 1 nm to 30 nm, more preferably, 1 nm to 10 nm. Lengths of each of the first and second active patterns AP1 and AP2 may be greater than a line width of the bit line BL. That is, lengths of each of the first and second active patterns AP1 and AP2 may be greater than the width of the bit line BL in the first direction D1.

Each of the first active pattern AP1 and the second active pattern AP2 includes a first side S1 and a second side S2 opposite to each other in the third direction D3. For example, the first sides S1 of the first and second active patterns AP1 and AP2 face the bit line BL. The second sides S2 of the first and second active patterns AP1 and AP2 face the contact pattern BC.

The first sides S1 of the first and second active patterns AP1 and AP2 are connected to the bit line BL. For example, the first sides S1 of the first and second active patterns AP1 and AP2 may be connected to the semiconductor pattern 161 of the bit line BL. Unlike the shown example, when the semiconductor pattern 161 is omitted, the first sides S1 of the first and second active patterns AP1 and AP2 may be connected to the metal pattern 163. The second side S2 of the first and second active patterns AP1 and AP2 may be connected to the contact pattern BC.

Each of the first active pattern AP1 and the second active pattern AP2 may include a first side wall SS1 and a second side wall SS2 that are opposite to each other in the second direction D2. The second side wall SS2 of the first active pattern AP1 may face the first side wall SS1 of the second active pattern AP2.

The first side wall SS1 of the first active pattern AP1 may be adjacent to the first word line WL1. The second side wall SS2 of the second active pattern AP2 may be adjacent to the second word line WL2.

Although it is not shown, as an example, each of the first active pattern AP1 and the second active pattern AP2 may include a first dopant region adjacent to the bit line BL, and a second dopant region adjacent to the contact pattern BC. Each of the first active pattern AP1 and the second active pattern AP2 may include a channel region between the first dopant region and the second dopant region. The first dopant region and the second dopant region are regions in which dopants are doped in the first active pattern AP1 and the second active pattern AP2. Unlike that explained above, each of the first active pattern AP1 and the second active pattern AP2 may not include at least one of the first dopant region and the second dopant region.

At the time of operation of the semiconductor memory device, the channel regions of the first and second active patterns AP1 and AP2 may be controlled by the first and second word lines WL1 and WL2 and the back gate electrode BG. Since the first and second active patterns AP1 and AP2 are made of a single crystal semiconductor material, leakage current characteristics of the semiconductor memory device can be improved.

In the semiconductor memory device according to some embodiments, the dummy active pattern AP_D may be disposed along the boundary of the cell array region CAR (see, e.g., FIG. 4). The dummy active pattern AP_D may not be connected to the data storage pattern DSP.

The back gate electrodes BG may be disposed on the bit line BL and the shielding conductive pattern SL. The back gate electrodes BG may be spaced apart from each other in the second direction D2. The back gate electrodes BG may be spaced apart at regular intervals. Each back gate electrode BG may extend in the first direction D1 across the bit line BL.

Each back gate electrode BG may be disposed between a first active pattern AP1 and a second active pattern AP2 adjacent to each other in the second direction D2. That is to say, the first active pattern AP1 may be disposed on one side of each back gate electrode BG, and the second active pattern AP2 may be disposed on the other side of each back gate electrode BG. A height of the back gate electrode BG in the third direction D3 may be smaller than the heights of the first and second active patterns AP1 and AP2.

Each back gate electrode BG may be disposed between the second side wall SS2 of the first active pattern AP1 and the first side wall SS1 of the second active pattern AP2. Each back gate electrode BG may be disposed on the second side wall SS2 of the first active pattern AP1 and the first side wall SS1 of the second active pattern AP2.

The first active pattern AP1 may be disposed between the first word line WL1 and the back gate electrode BG. The second active pattern AP2 may be disposed between the second word line WL2 and the back gate electrode BG. A pair of first word line WL1 and second word line WL2 may be disposed between the back gate electrodes BG adjacent to each other in the second direction D2.

The back gate electrode BG may include a first side (e.g., a lower surface) BG_S1 and a second side (e.g., an upper surface) BG_S2 that are opposite to each other in the third direction D3. The first side BG_S1 of the back gate electrode is closer to the bit line BL than the second side BG_S2 of the back gate electrode.

The back gate electrode BG may be formed of or include a conductive material, and may include, for example, at least one of doped polysilicon, conductive metal nitride, conductive metal silicon nitride, metal carbonitride, conductive metal silicide, conductive metal oxide, a 2D material, and a metal.

A voltage is applied to the back gate electrode BG at the time of the operation of the semiconductor memory device, and a threshold voltage of the vertical channel transistor may be adjusted. Since the threshold voltage of the vertical channel transistor is adjusted, deterioration of leakage current characteristics can be prevented.

The back gate isolation pattern 111 may be disposed between the first active pattern AP1 and the second active pattern AP2 adjacent to each other in the second direction D2. The back gate isolation pattern 111 may extend in the first direction D1 along with the back gate electrode BG. The back gate isolation pattern 111 may be disposed on the first side BG_S1 of the back gate electrode. The back gate isolation pattern 111 may be disposed between the back gate electrode BG and the bit line BL.

The back gate isolation pattern 111 may be formed of or include an insulating material. The back gate isolation pattern 111 may include, for example, but is not limited to, a silicon oxide film, a silicon oxynitride film or a silicon nitride film. As an example, the back gate isolation pattern 111 may be formed at the same level as a gate capping pattern 143, which will be described below. Here, the term "same level" means formation by the same fabricating process. The back gate isolation pattern 111 may be formed of the same material as the gate capping pattern 143.

The back gate insulating pattern 113 may be disposed between the back gate electrode BG and the first active pattern AP1, and between the back gate electrode BG and the second active pattern AP2. The back gate insulating pattern 113 may be disposed between the back gate isolation pattern 111 and the first active pattern AP1, and between the back gate isolation pattern 111 and the second active pattern AP2.

The back gate insulating pattern 113 includes an insulating material. The back gate insulating pattern 113 may include, for example, a silicon oxide film, a silicon oxynitride film, a high dielectric constant insulating film having a dielectric constant higher than that of the silicon oxide film or a combination thereof.

The back gate capping pattern 115 may be disposed between the contact interlayer insulating film 231 and the back gate electrode BG. The back gate capping pattern 115 may be disposed between the first active pattern AP1 and the second active pattern AP2 adjacent to each other in the second direction D2. The back gate capping pattern 115 may extend in the first direction D1 along with the back gate electrode BG. The back gate capping pattern 115 may be disposed on the second side BG_S2 of the back gate electrode.

The back gate capping pattern 115 may be formed of or include an insulating material. The back gate capping pattern 115 may include, for example, at least one of a silicon oxide film, a silicon oxynitride film, and a silicon nitride film.

The first word line WL1 and the second word line WL2 may be disposed on the bit line BL and the shielding conductive pattern SL. The first word line WL1 and the second word line WL2 may be disposed on the shielding conductive protrusion SLp.

Each of the first word line WL1 and the second word line WL2 may extend in the first direction D1. The first word line WL1 and the second word line WL2 may be alternately arranged in the second direction D2.

The first word line WL1 may be disposed on the first side wall SS1 of the first active pattern AP1. The second word line WL2 may be disposed on the second side wall SS2 of the second active pattern AP2. The first active patterns AP1 and the second active patterns AP2 may be disposed between the first word line WL1 and the second word line WL2 adjacent to each other in the second direction D2.

The first word line WL1 and the second word line WL2 may be spaced apart from the bit line BL and the contact pattern BC in the third direction D3. The first word line WL1 and the second word line WL2 may be positioned between the bit line BL and the contact pattern BC.

Each of the first word line WL1 and the second word line WL2 may have a width in the second direction D2. The width of the first word line WL1 and the width of the second word line WL2 on the bit line BL may differ from the width of the first word line WL1 and the width of the second word line WL2 on the shielding conductive pattern SL (see, e.g., FIGS. 2 and 4).

For example, each of the first word line WL1 and the second word line WL2 may include a first portion WLa of the word line, and a second portion WLb of the word line. A width of the first portion Wla of the word line in the second direction D2 may be smaller than a width of the second portion WLb of the word line in the second direction D2. As an example, the first portion Wla of the word line may overlap the bit line BL in the third direction D3. The second portion WLb of the word line may overlap the shielding conductive line SL in the third direction D3.

Each of the first word line WL1 and the second word line WL2 may include the first portion Wla of the word line and the second portion WLb of the word line which are alternately disposed along the first direction D1. In the first word line WL1, each first active pattern AP1 may be disposed between the second portions WLb of the word lines adjacent to each other in the first direction D1. In the second word line WL2, each second active pattern AP2 may be disposed between the second portions WLb of the word lines adjacent to each other in the first direction D1.

The first word line WL1 and the second word line WL2 may include a first side (e.g., a lower surface) WL_S1 and a second side (e.g., an upper surface) WL_S2 that are opposite to each other in the third direction D3. The first sides WL_S1 of the first and second word lines are closer to the bit line BL than the second sides WL_S2 of the first and second word lines.

The first word line WL1 will be described as an example. As an example, a height of the first word line WL1 in the third direction D3 may be the same as a height of the back gate electrode BG in the third direction D3. As another example, the height of the first word line WL1 in the third direction D3 may be greater than the height of the back gate electrode BG in the third direction D3. As still another example, the height of the first word line WL1 in the third direction D3 may be smaller than the height of the back gate electrode BG in the third direction D3.

Further, as an example, a height of the first side WL_S1 of the first word line may be the same as a height of the first side BG_S1 of the back gate electrode, relative to the bit line BL. As another example, the first side WL_S1 of the first word line may be higher than the first side BG_S1 of the back gate electrode. As yet another example, the first side WL_S1 of the first word line may be lower than the first side BG_S1 of the back gate electrode.

In addition, as an example, the height of the second side WL_S2 of the first word line may be the same as the height of the second side BG_S2 of the back gate electrode relative to the bit line BL. As another example, the second side WL_S2 of the first word line may be higher than the second side BG_S2 of the back gate electrode. As yet another example, the second side WL_S2 of the first word line may be lower than the second side BG_S2 of the back gate electrode.

The second word line WL2 may be connected to the first upper bonding pad BP21 through the first upper pad plug 286. Although it is not shown, the first word line WL1 may be connected to the first upper bonding pad BP21 through the first upper pad plug 286.

For example, the first upper pad plug 286 may be directly connected to the first and second word lines WL1 and WL2. The first upper pad plug 286 may be directly connected to the first upper bonding pad BP21. The first and second word lines WL1 and WL2 may be connected to the lower peri-connecting structures 242*a* and 242*b*.

The first upper pad plug 286 penetrates the shielding conductive pattern SL, and may be connected to the first and second word lines WL1 and WL2. The first upper pad plug 286 may penetrate the shielding conductive plate SLh. The first upper pad plug 286 may penetrate the dummy bit line BL_D.

Unlike the shown example, in the cross-sectional view such as FIG. 3, the first and second word lines WL1 and WL2 may include portions that do not overlap the shielding conductive pattern SL and the dummy bit line BL_D in the third direction D3. That is, the first and second word lines WL1 and WL2 may partially protrude in the first direction D1 beyond the shielding conductive pattern SL and the dummy bit line BL_D. The first upper pad plug 286 may be connected to some parts of the first and second word lines WL1 and WL2 that protrude in the first direction D1 beyond the shielding conductive pattern SL and the dummy bit line BL_D. In such a case, the first upper pad plug 286 may not penetrate the shielding conductive pattern SL and the dummy bit line BL_D.

Unlike the shown example, in the cross-sectional view such as FIG. 3, the first and second word lines WL1 and WL2 may include portions that do not overlap one of the shielding conductive pattern SL and the dummy bit line BL_D in the third direction D3. The first and second word lines WL1 and WL2 may partially protrude in the first direction D1 beyond one of the shielding conductive pattern SL and the dummy bit line BL_D. In such a case, the first upper pad plug 286 may not penetrate one of the shielding conductive pattern SL and the dummy bit line BL_D.

The first word line WL1 and the second word line WL2 may be formed of or include a conductive material. The first word line WL1 and the second word line WL2 may include, for example, at least one of doped polysilicon, conductive metal nitride, conductive metal silicon nitride, metal carbonitride, conductive metal silicide, conductive metal oxide, a two-dimensional material, and a metal. Although the first word line WL1 and the second word line WL2 are shown as being a single conductive film, this is only for convenience of explanation, and the embodiment is not limited thereto.

The second sides WL_S2 of the first and second word lines WL1 and WL2 may be a plane. Unlike the shown example, as an example, the second sides WL_S2 of the first and second word lines WL1 and WL2 may be concavely rounded. As another example, each of the first word line WL1 and the second word line WL2 may have a spacer form. In other words, the second sides WL_S2 of the first and second word lines WL1 and WL2 may be convexly rounded.

The first sides WL_S1 of the first and second word lines WL1 and WL2 may be a plane. Unlike the shown example, the first sides WL_S1 of the first and second word lines WL1 and WL2 may have a concave curved face. Although the first side BG_S1 of the back gate electrode and the second side BG_S2 of the back gate electrode are shown as being a plane, the invention is not limited thereto.

Gate insulating patterns GOX may be disposed between the first word line WL1 and the first active pattern AP1, and between the second word line WL2 and the second active pattern AP2. The gate insulating patterns GOX may extend in the first direction D1 along with the first and second word lines WL1 and WL2.

The gate insulating pattern GOX may be formed of or include a silicon oxide film, a silicon oxynitride film, a high dielectric constant insulating film having a dielectric constant higher than that of the silicon oxide film or a combination thereof.

The gate insulating pattern GOX may extend along the first side wall SS1 of the first active pattern AP1, and may extend along the second side wall SS2 of the second active pattern AP2. In the semiconductor memory device according to some embodiments, the gate insulating pattern GOX between the first active pattern AP1 and the first word line WL1 may be separated from the gate insulating pattern GOX between the second active pattern AP2 and the second word line WL2 from the viewpoint of the cross-sectional view.

The gate capping pattern 143 may be disposed between the first word line WL1 and the bit line BL, and between the second word line WL2 and the bit line BL. The gate capping pattern 143 may cover the first sides WL_S1 of the first and second word lines WL1 and WL2. The gate capping pattern 143 may be in contact with the bit line BL.

The gate isolation pattern GSS may be disposed on the bit line BL. The gate isolation pattern GSS may be disposed between the bit line BL and the contact pattern BC.

The gate isolation pattern GSS may be disposed between the first word line WL1 and the second word line WL2 adjacent in the second direction D2. The first word line WL1 and the second word line WL2 may be separated by the gate isolation pattern GSS. The gate isolation pattern GSS may extend in the first direction D1 between the first word line WL1 and the second word line WL2.

The first word line WL1 may be disposed between the gate isolation pattern GSS and the first active pattern AP1. The second word line WL2 may be disposed between the gate isolation pattern GSS and the second active pattern AP2.

The gate isolation pattern GSS may include a horizontal part GSS_H and a protruding part GSS_P. The protruding part GSS_P of the gate isolation pattern may protrude in the third direction D3 from the horizontal part GSS_H of the gate isolation pattern. The protruding part GSS_P of the gate isolation pattern may protrude from the horizontal part GSS_H of the gate isolation pattern toward the bit line BL.

The protruding part GSS_P of the gate isolation pattern may be closer to the bit line BL than the horizontal part GSS_H of the gate isolation pattern. A width of the horizontal part GSS_H of the gate isolation pattern in the second direction D2 is greater than a width of the protruding part GSS_P of the gate isolation pattern in the second direction D2.

The protruding part GSS_P of the gate isolation pattern may be disposed between the side wall of the first word line WL1 and the side wall of the second word line WL2 that face each other. The horizontal part GSS_H of the gate isolation pattern may cover the second sides WL_S2 of the first and second word lines WL1 and WL2.

The horizontal part GSS_H of the gate isolation pattern is disposed on the first word line WL1 and the second word line WL2. The horizontal part GSS_H of the gate isolation pattern may contact the second sides WL_S2 of the first and second word lines WL1 and WL2. The gate isolation pattern GSS may be formed of or include an insulating material. The gate isolation pattern GSS may include a plurality of insulating films, unlike the shown example.

The contact patterns BC may be disposed inside the contact interlayer insulating film 231. The contact patterns BC may be connected to each of the first active pattern AP1 and the second active pattern AP2. The contact patterns BC may be connected to the second sides S2 of the first and second active patterns AP1 and AP2. The contact pattern BC may not be connected to the dummy active pattern AP_D.

Each contact pattern BC may have various shapes such as a circle, an ellipse, a rectangle, a square, a rhombus, and a hexagon in plan view. The contact patterns BC may be formed of or include a conductive material, and may include, for example, at least one of doped polysilicon, conductive metal nitride, conductive metal silicon nitride, metal carbonitride, conductive metal silicide, conductive metal oxide, a two-dimensional material and a metal. The contact interlayer insulating film 231 may be formed of or include an insulating material.

Landing pads LP may be disposed on the contact pattern BC. In plan view, the landing pads LP may have various shapes such as a circle, an ellipse, a rectangle, a square, a rhombus, and a hexagon.

Pad isolation insulating patterns 245 may be disposed between the landing pads LP. In plan view, the landing pads LP may be arranged in the form of a matrix along the first direction D1 and the second direction D2. The upper side of the landing pad LP may be substantially coplanar with the upper side of the pad isolation insulating pattern 245.

The landing pad LP may be formed of or include a conductive material, and may include, for example, at least one of doped polysilicon, conductive metal nitride, conductive metal silicon nitride, metal carbonitride, conductive metal silicide, conductive metal oxide, a two-dimensional material and a metal The data storage patterns DSP may each be disposed on the landing pads LP. The data storage patterns DSP may be electrically connected to each of the first and second active patterns AP1 and AP2. The data storage patterns DSP may be connected to the second sides S2 of the first and second active patterns AP1 and AP2.

The data storage patterns DSP may be disposed in the form of a matrix along the first direction D1 and the second direction D2, as shown in FIG. 2. The data storage patterns DSP may completely or partially overlap the landing pads LP in the third direction D3. The data storage patterns DSP may be in contact with all or a part of the upper sides of the landing pads LP.

As an example, the data storage patterns DSP may be capacitors. The data storage patterns DSP may include a capacitor dielectric film 253 interposed between the storage electrodes 251 and the plate electrodes 255. In this case, the storage electrode 251 may be in contact with the landing pad LP. In plan view, the storage electrode 251 may have various shapes such as a circle, an ellipse, a rectangle, a square, a rhombus, and a hexagon. The storage electrodes 251 may penetrate the upper etching stop film 247. The upper etching stop film 247 may be formed of or include an insulating material.

The plate electrode 255 may include a lower plate electrode 255*a* and an upper plate electrode 255*b*. The plate electrode 255 may be a single film, unlike the shown example. The storage electrode 251 and the plate electrode 255 may each be formed of or include, for example, at least one of a doped semiconductor material, conductive metal nitride, conductive metal silicon nitride, metal carbonitride, conductive metal silicide, conductive metal oxide and metal.

In contrast, the data storage patterns DSP may be variable resistance patterns that may be switched between two resistance states by electrical pulses applied to the memory elements. For example, the data storage patterns DSP may include a phase-change material, perovskite compounds, a transition metal oxide, magnetic materials, ferromagnetic materials or antiferromagnetic materials.

A third upper insulating film 276 may be disposed on the upper etching stop film 247. The third upper insulating film 276 may cover the data storage pattern DSP. The third upper insulating film 276 includes an insulating material.

An upper peri-connecting structure 290 may include upper peri-connecting structures 290*a*, 290*b* and 290*c* disposed on the data storage pattern DSP. The upper peri-connecting structures 290*a*, 290*b* and 290*c* may be disposed inside the peri-connecting insulating films 277*a*, 277*b* and 277*c*.

Although the upper peri-connecting structures 290*a*, 290*b* and 290*c* are shown to include wiring lines disposed at three metal levels, this is only for convenience of explanation, and the invention is not limited thereto. The upper peri-connecting structures 290*a*, 290*b* and 290*c* may be formed of or include a conductive material.

A through connecting via THV may connect the upper peri-connecting structures 290*a*, 290*b* and 290*c* to the lower peri-connecting structures 242*a* and 242*b*. The through connecting via THV extends in the third direction D3. For example, the through connecting via THV may be disposed on the peripheral circuit region PCR.

The through connecting via THV may be connected to the upper peri-connecting structure 290*a*, which is disposed at the lowest part among the upper peri-connecting structures 290*a*, 290*b* and 290*c*. The upper side (e.g., the uppermost surface) THV_US of the through connecting via is higher than the highest part of the data storage pattern DSP.

Although the through connecting via THV is shown to be a single film, the invention is not limited thereto. The through connecting via THV and the upper peri-connecting structures 290*a*, 290*b* and 290*c* may each be formed of or include a conductive material. The peri-connecting insulating films 277*a*, 277*b* and 277*c* may be formed of or include an insulating material.

The upper connecting pad 295 and the upper connecting plug 296 may be disposed on the upper peri-connecting structures 290*a*, 290*b* and 290*c*. The upper connecting pad 295 and the upper connecting plug 296 may be disposed in the third upper pad insulating film 229.

The upper connecting pad 295 and the upper connecting plug 296 may be connected to an upper peri-connecting structure 290*c* disposed at the highest part among the upper peri-connecting structures 290*a*, 290*b* and 290*c*. The upper connecting pad 295 and the upper connecting plug 296 each include a conductive material. The third upper pad insulating film 229 may be formed of or include an insulating material.

Figure 13:
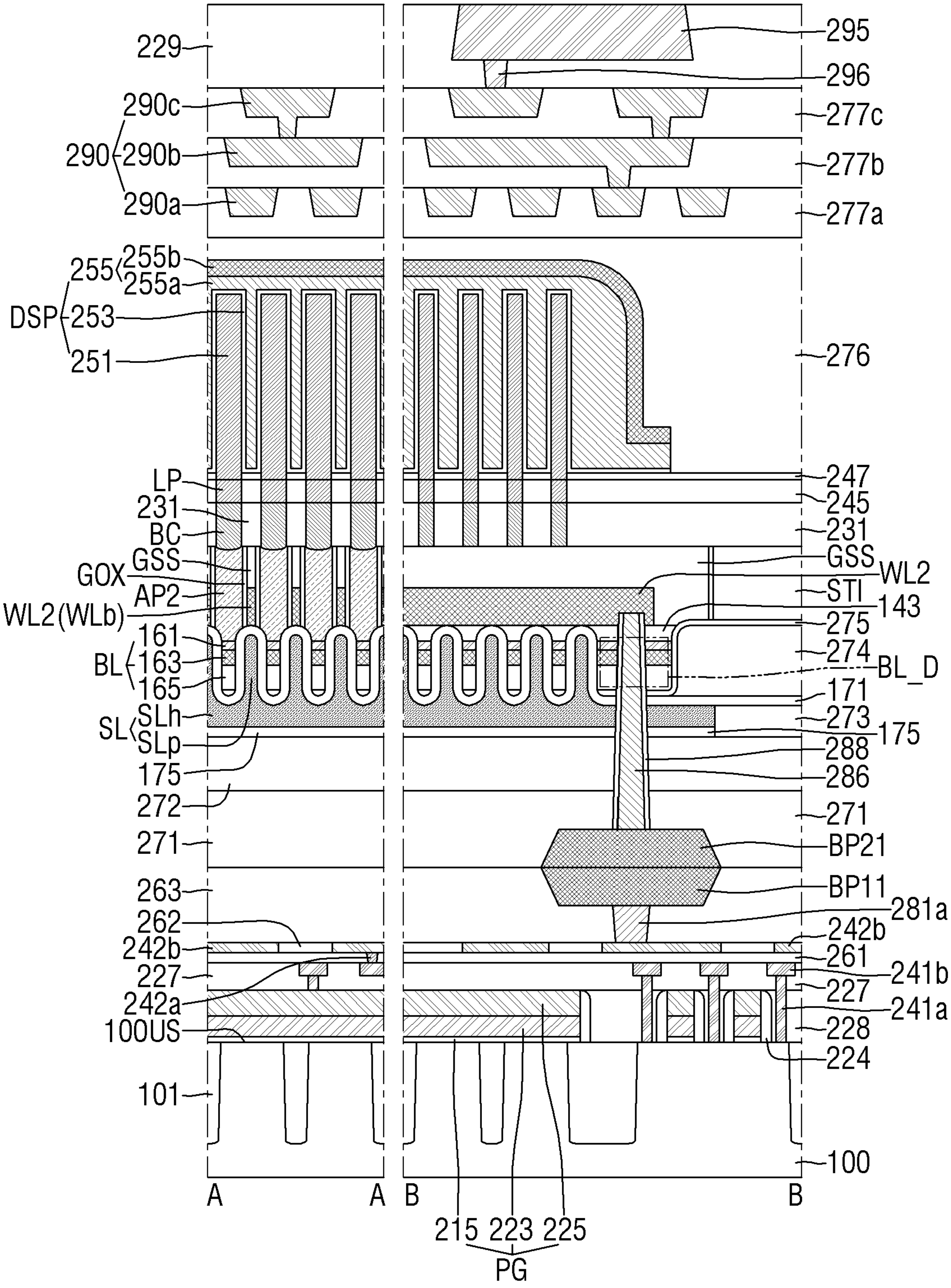
FIGS. 13 and 14 are diagrams for explaining a semiconductor memory device according to some embodiments.
Figure 14:
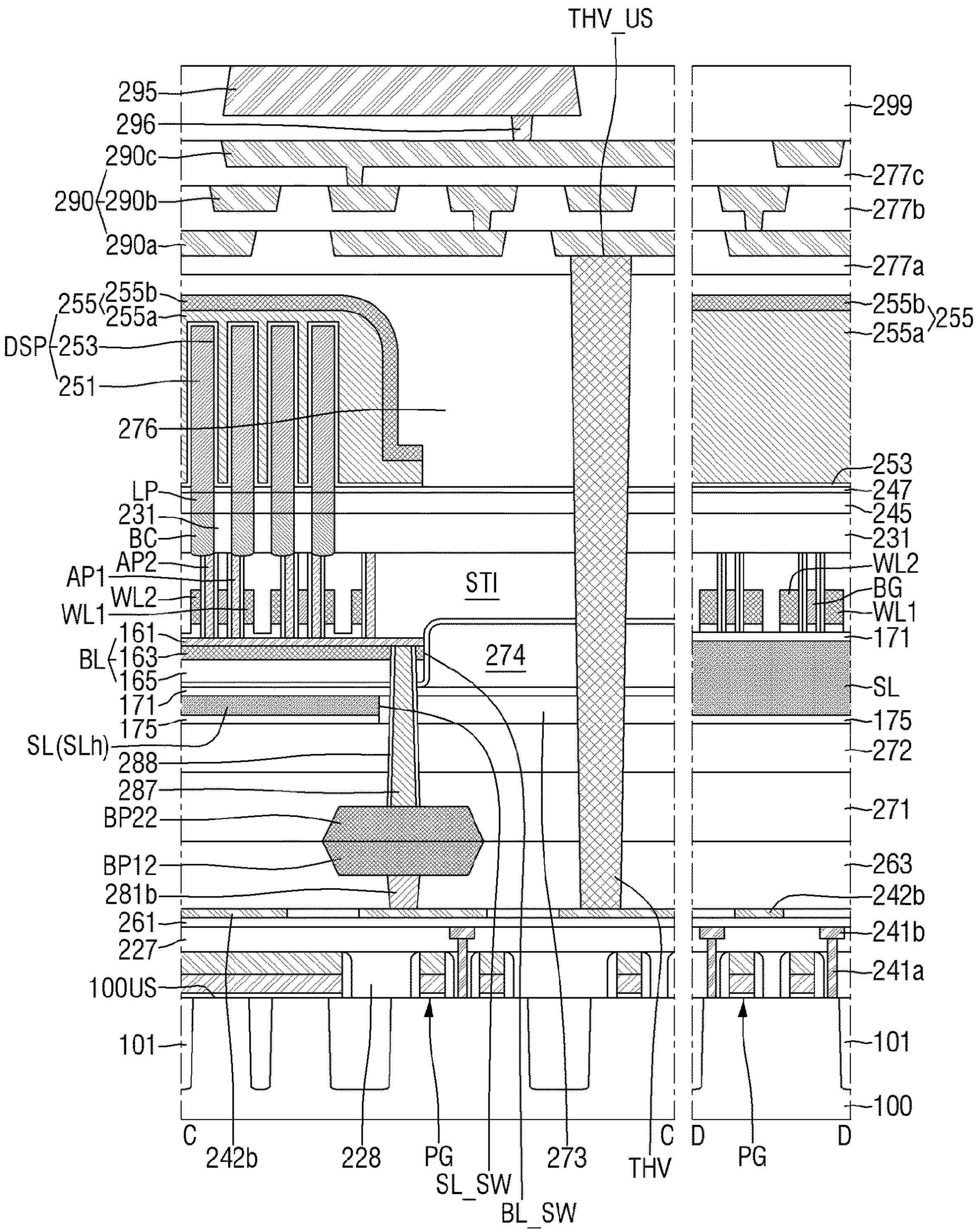
Figure 15:
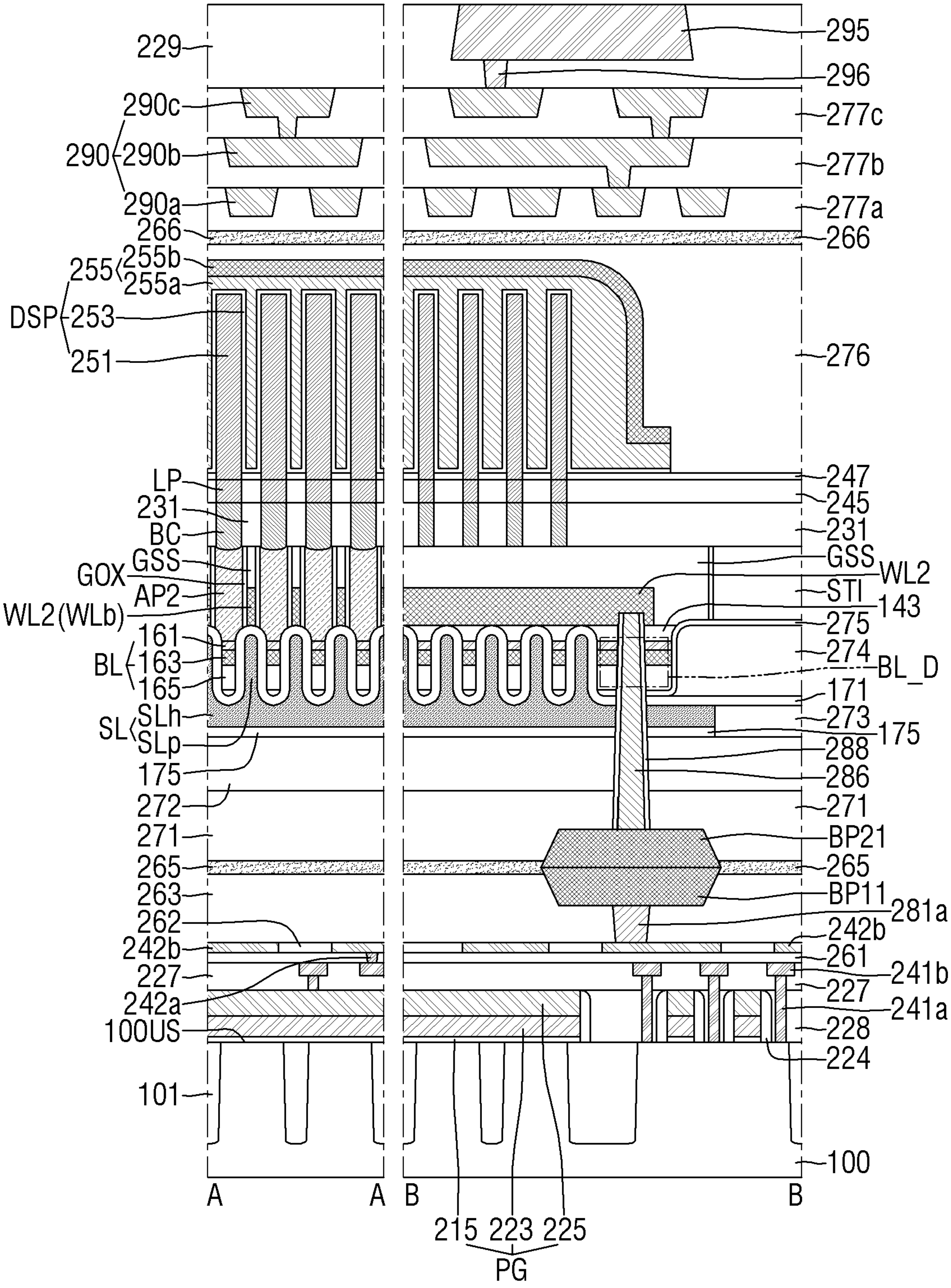
FIGS. 15 and 16 are diagrams for explaining the semiconductor memory device according to some embodiments.
Figure 16:
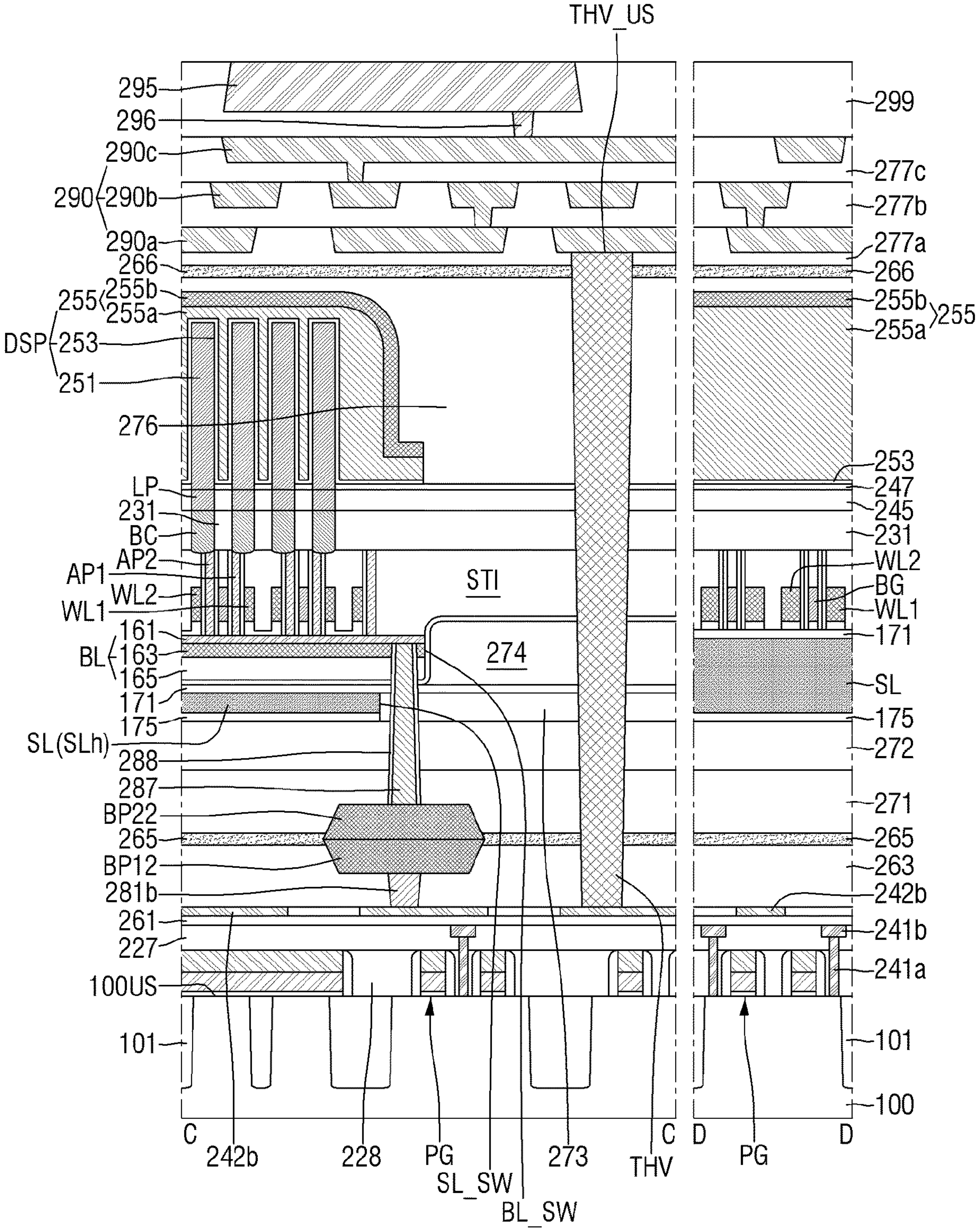
Figure 17:
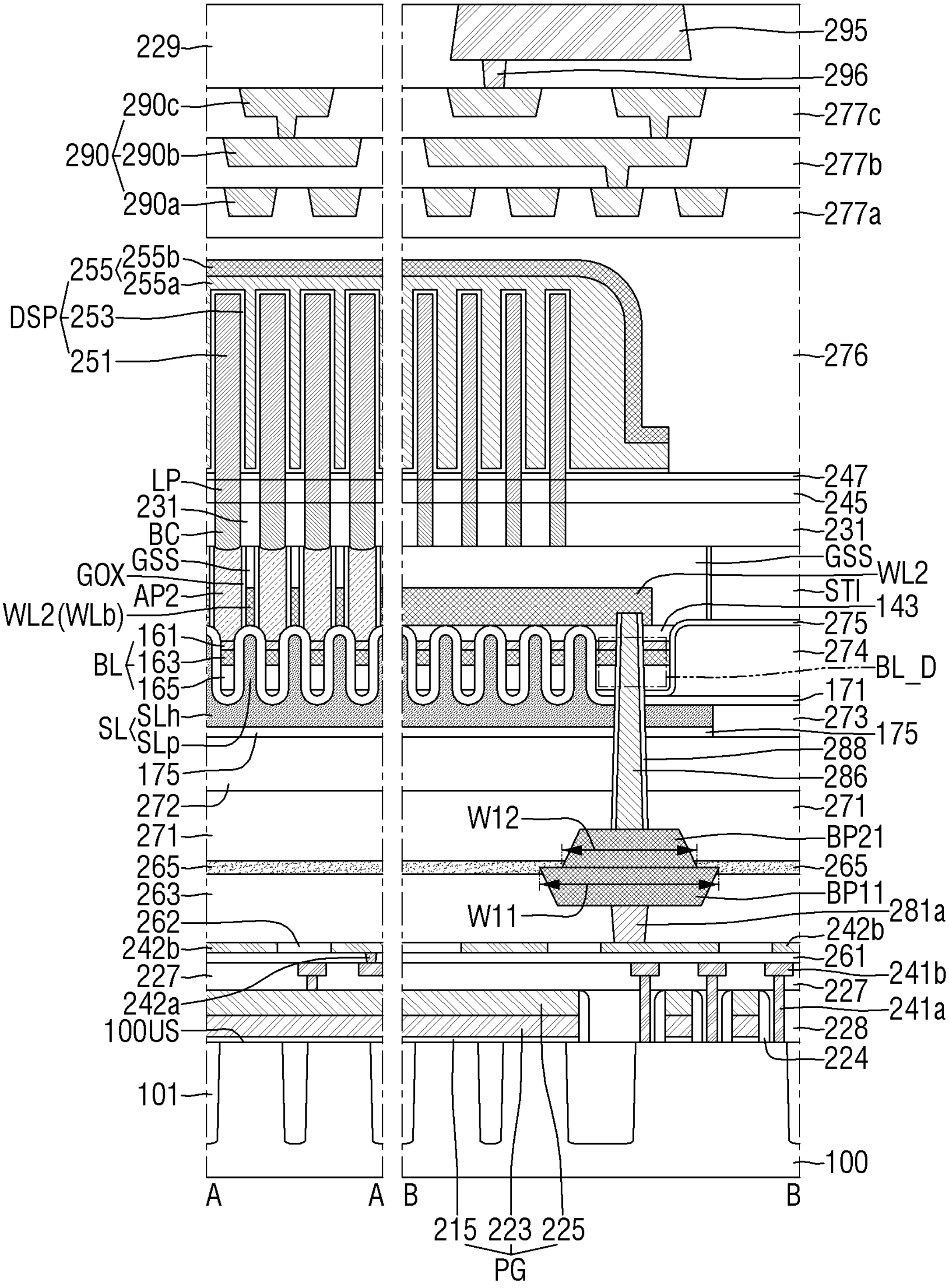
FIGS. 17 and 18 are diagrams for explaining the semiconductor memory device according to some embodiments.
Figure 18:
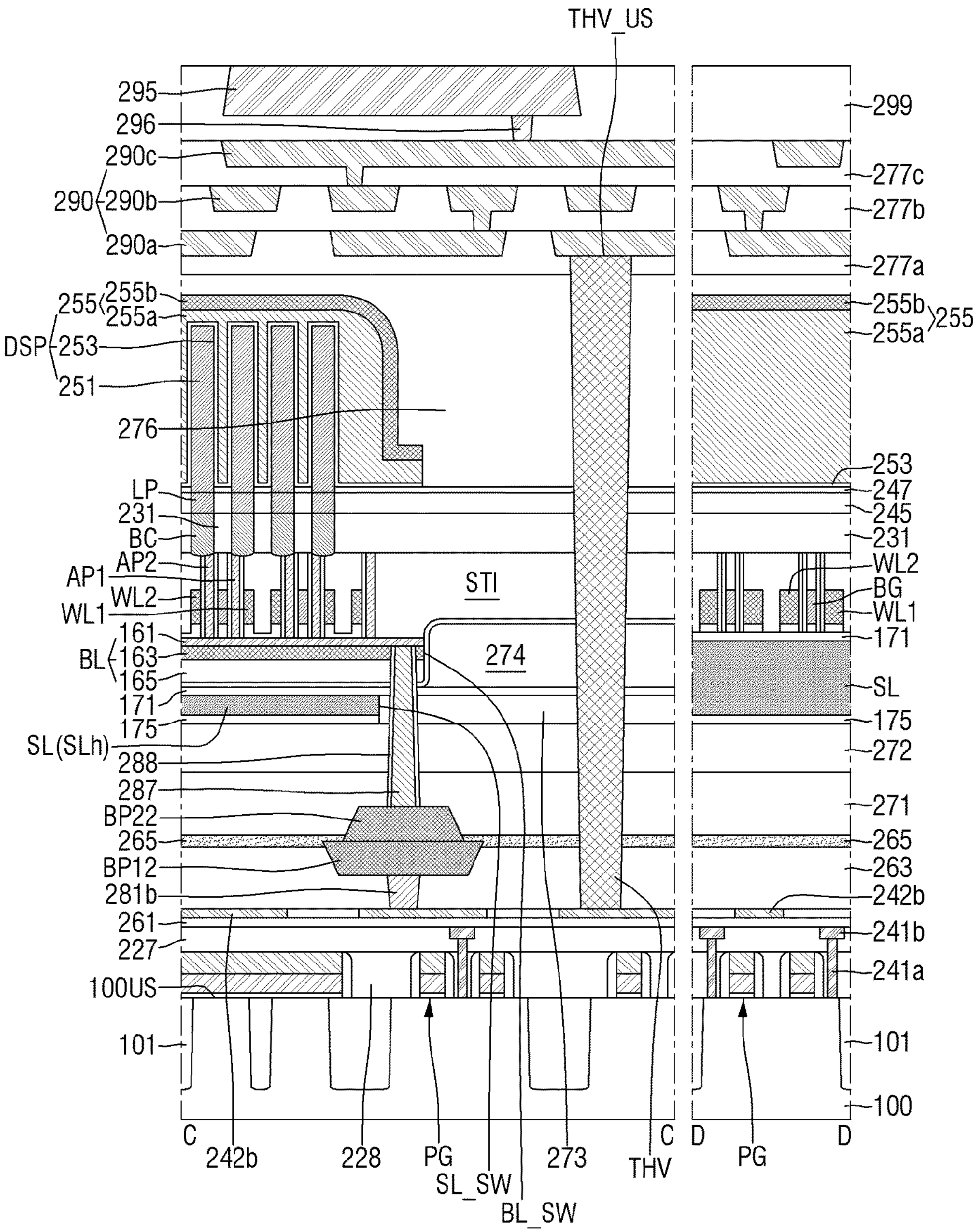
Figure 19:
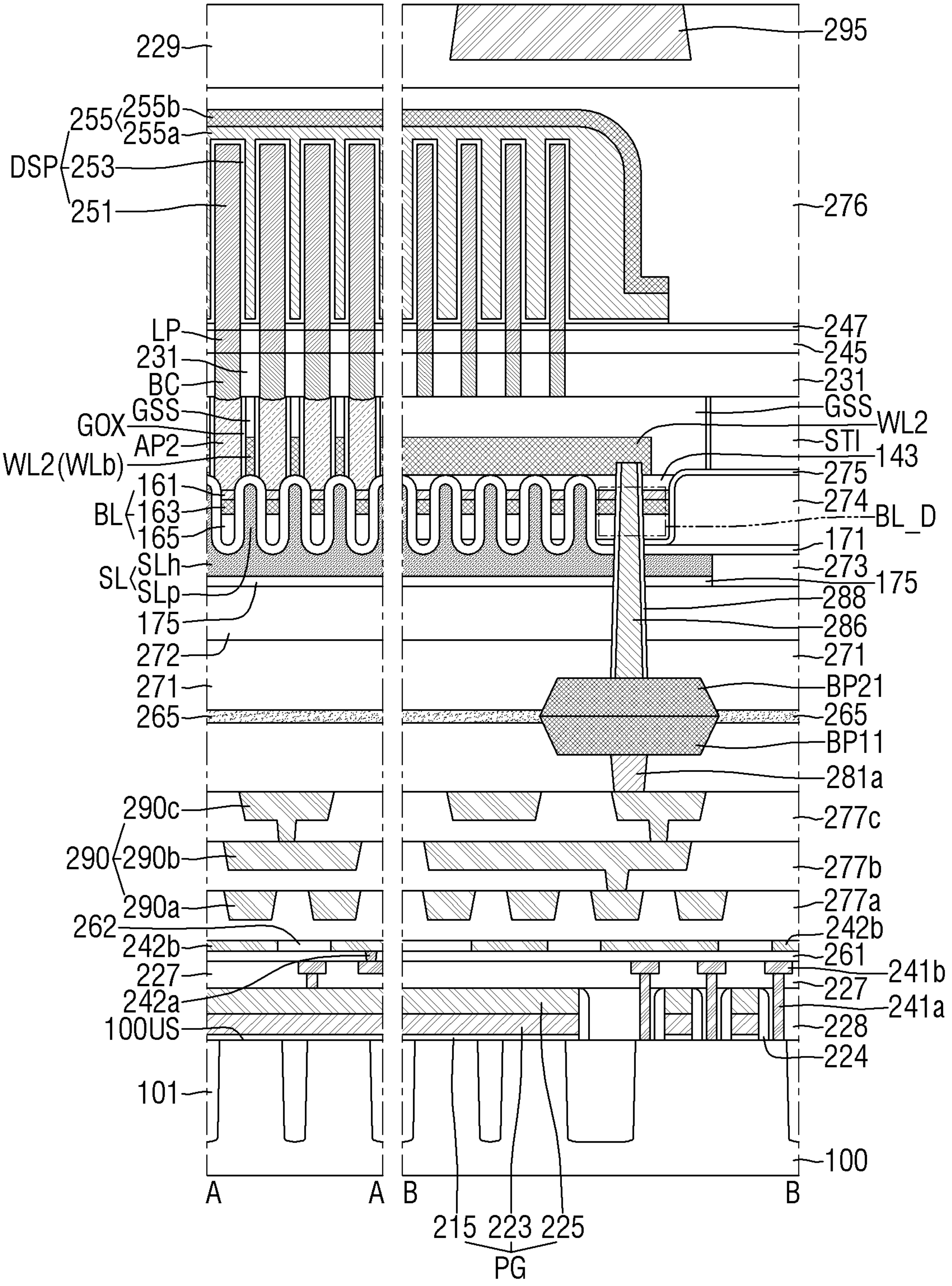
FIGS. 19 and 20 are diagrams for explaining the semiconductor memory device according to some embodiments.
Figure 20:
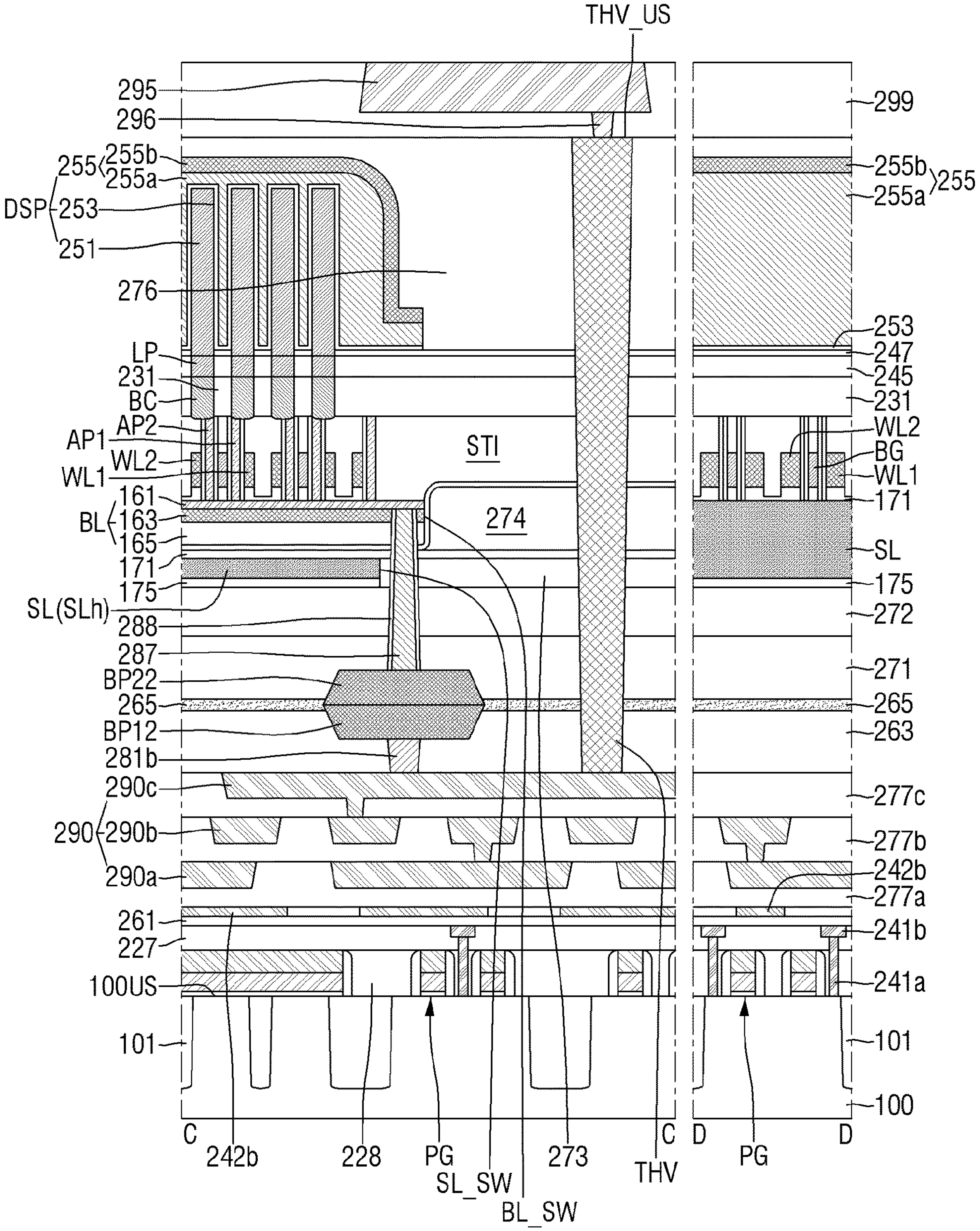
Figure 21:
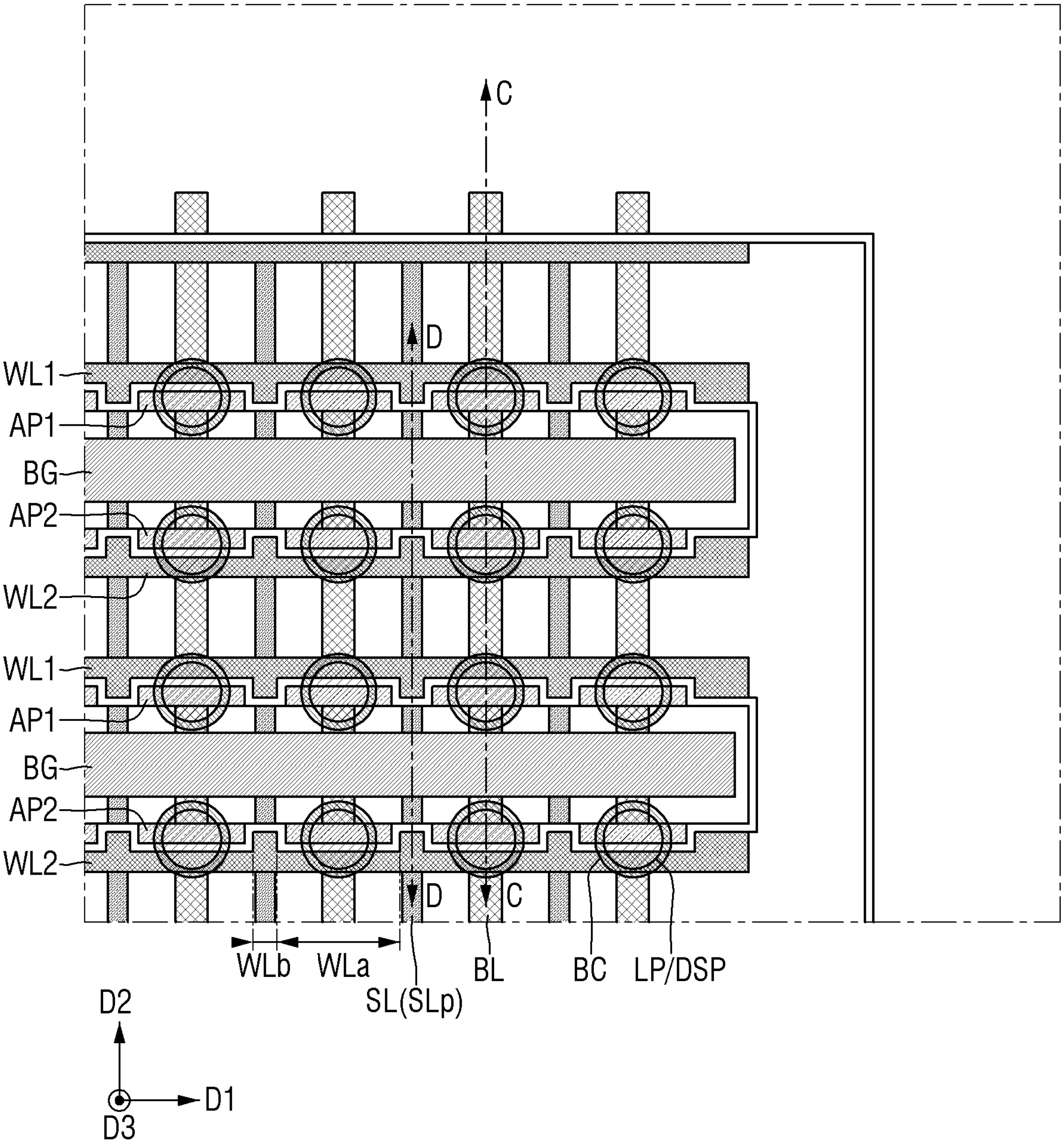
FIGS. 21 and 22 are diagrams for explaining the semiconductor memory device according to some embodiments.
Figure 22:
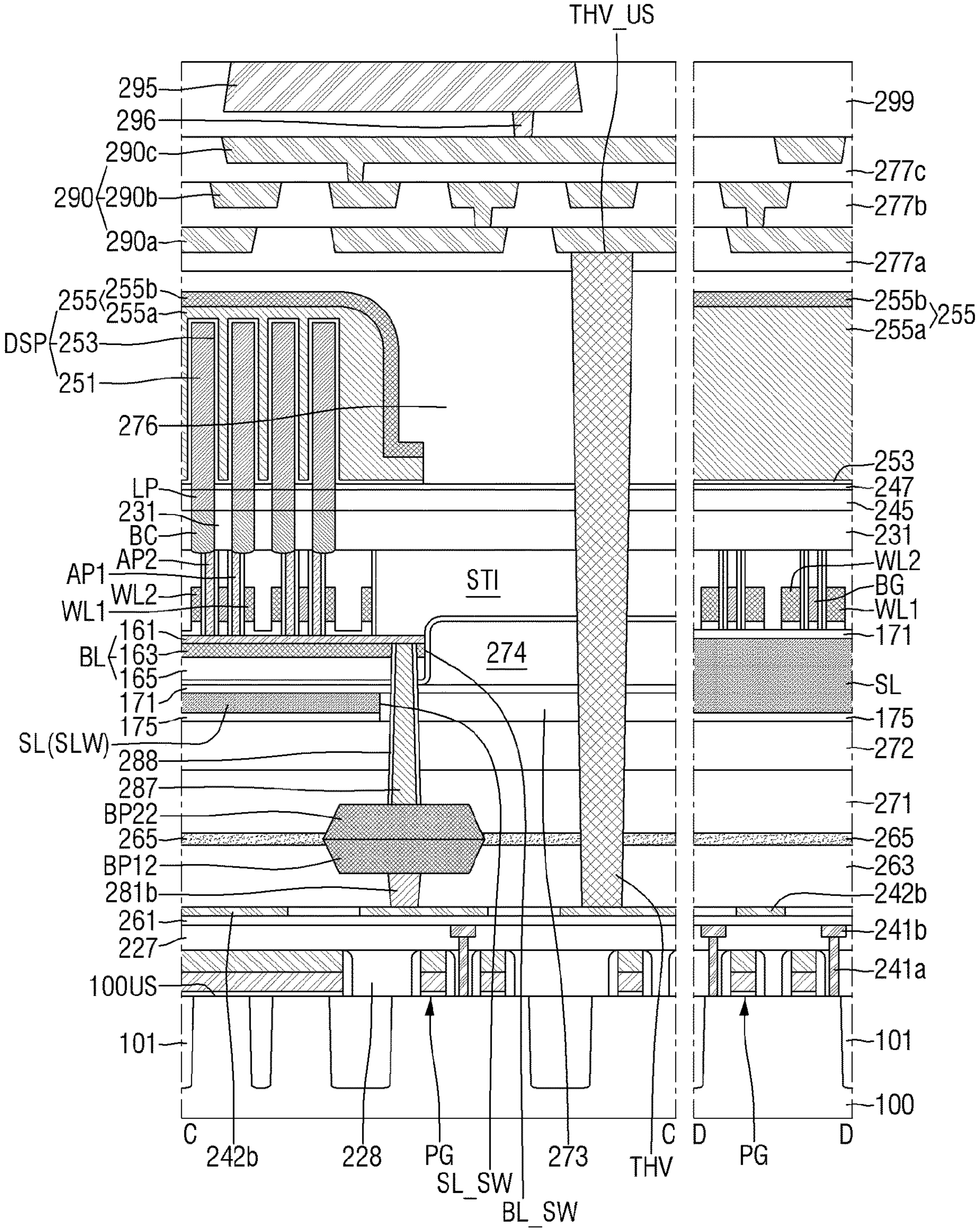

FIGS. 13 and 14 are diagrams for explaining a semiconductor memory device according to some embodiments. FIGS. 15 and 16 are diagrams for explaining the semiconductor memory device according to some embodiments. FIGS. 17 and 18 are diagrams for explaining the semiconductor memory device according to some embodiments. FIGS. 19 and 20 are diagrams for explaining the semiconductor memory device according to some embodiments. FIGS. 21 and 22 are diagrams for explaining the semiconductor memory device according to some embodiments. For convenience of explanation, points different from contents explained above using FIGS. 1 to 12 will be mainly explained.

For reference, FIG. 22 is a cross-sectional view taken along C-C and D-D of FIG. 21.

Referring to FIGS. 13 and 14, in the semiconductor memory device according to some embodiments, a bonding insulating film (265 of FIGS. 3 and 4) may not be disposed between the lower pad insulating film 263 and the first upper pad insulating film 271.

Although the boundary between the lower pad insulating film 263 and the first upper pad insulating film 271 is shown as being distinguished, it is only for convenience of explanation and the invention is not limited thereto. If the lower pad insulating film 263 and the first upper pad insulating film 271 include the same material, the boundary between the lower pad insulating film 263 and the first upper pad insulating film 271 may not be distinguished. In such a case, the boundary between the lower pad insulating film 263 and the first upper pad insulating film 271 may be defined using the boundary between the lower bonding pads BP11 and BP12 and the upper bonding pads BP21 and BP22.

Referring to FIGS. 15 and 16, the semiconductor memory device according to some embodiments may further include a second bonding insulating film 266.

The second bonding insulating film 266 may be disposed between the data storage pattern DSP and the upper connecting pad 295. In the semiconductor memory device according to some embodiments, the second bonding insulating film 266 may be disposed between the data storage pattern DSP and the upper peri-connecting structures 290*a*, 290*b* and 290*c*.

The second bonding insulating film 266 may extend along a boundary between the third upper insulating film 276 and the peri-connecting insulating films 277*a*, 277*b* and 277*c*. The second bonding insulating film 266 may be formed of or include, for example, silicon carbonitride (SiCN).

Referring to FIGS. 17 and 18, in the semiconductor memory device according to some embodiments, a width W11 of the first lower bonding pad BP11 may be different from a width W12 of the first upper bonding pad BP21 at the boundary between the first lower bonding pad BP11 and the first upper bonding pad BP21.

The width of the second lower bonding pad BP12 may be different from the width of the second upper bonding pad BP22 at the boundary between the second lower bonding pad BP12 and the second upper bonding pad BP22.

The first lower bonding pad BP11 and the first upper bonding pad BP21 will be described as an example. The width W11 of the first lower bonding pad BP11 may be greater than the width W12 of the first upper bonding pad BP21. As an example, at the boundary between the first lower bonding pad BP11 and the first upper bonding pad BP21, the first upper bonding pad BP21 may completely overlap the first lower bonding pad BP11 in the third direction D3. As another example, at the boundary between the first lower bonding pad BP11 and the first upper bonding pad BP21, a part of the first upper bonding pad BP21 may overlap the first lower bonding pad BP11 in the third direction D3, and the rest of the first upper bonding pad BP21 may not overlap the first lower bonding pad BP11 in the third direction D3.

Unlike the shown example, the width W11 of the first lower bonding pad BP11 may be smaller than the width W12 of the first upper bonding pad BP21.

Unlike the shown example, the width of the second lower bonding pad BP12 may be smaller than the width of the second upper bonding pad BP22 at the boundary between the second lower bonding pad BP12 and the second upper bonding pad BP22.

Referring to FIGS. 19 and 20, in the semiconductor memory device according to some embodiments, the upper peri-connecting structures 290*a*, 290*b* and 290*c* may be disposed between the lower bonding pads BP11 and BP12 and the lower peri-connecting structures 242*a* and 242*b*.

The lower bonding pads BP11 and BP12 may be connected to the upper peri-connecting structures 290*a*, 290*b* and 290*c*. The upper peri-connecting structures 290*a*, 290*b* and 290*c* may connect the lower bonding pads BP11 and BP12 to the lower peri-connecting structures 242*a* and 242*b*. The first lower pad plug 281*a* and the second lower pad plug 281*b* may be connected to the upper peri-connecting structures 290*a*, 290*b* and 290*c*.

The through connecting via THV may connect the upper peri-connecting structures 290*a*, 290*b* and 290*c* and the upper connecting plug 296. The through connecting via THV may be connected to the upper peri-connecting structure 290*c* disposed at the highest part among the upper peri-connecting structures 290*a*, 290*b* and 290*c*.

Referring to FIGS. 21 and 22, in the semiconductor memory device according to some embodiments, the dummy active pattern (AP_D of FIGS. 2 and 4) is not disposed along the boundary of the cell array region CAR.

Only the word line may extend along the boundary of the cell array regions CAR.

FIGS. 23 to 26 are diagrams for explaining a semiconductor memory device according to some embodiments. For convenience of explanation, points different from contents explained above using FIGS. 1 to 20 will be mainly explained.

Figure 23:
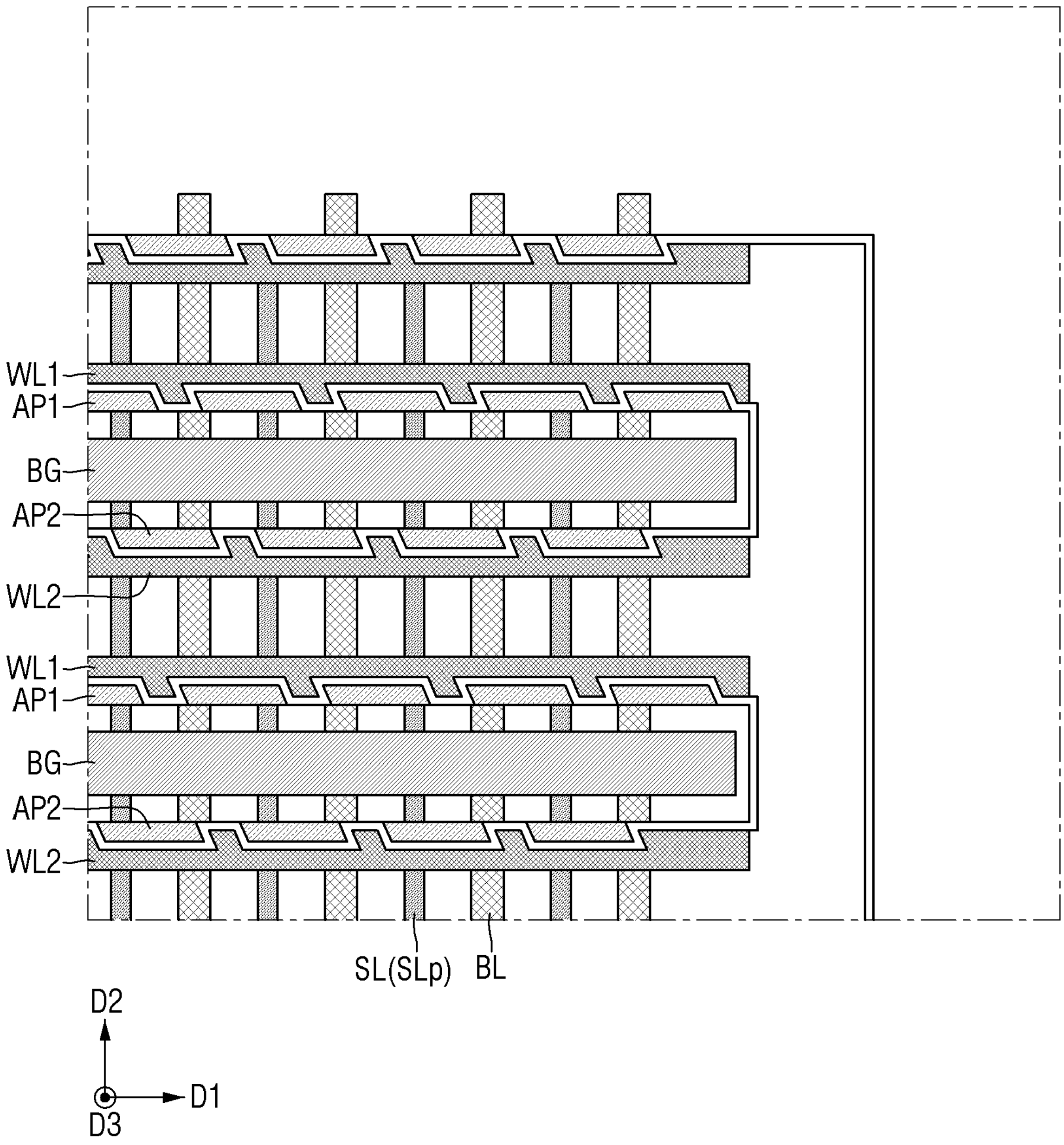
FIGS. 23 to 26 are diagrams for explaining a semiconductor memory device according to some embodiments.

Referring to FIG. 23, in the semiconductor memory device according to some embodiments, the first and second active patterns AP1 and AP2 may be alternately arranged in a diagonal direction with respect to the first direction D1 and the second direction D2.

In plan view, each of the first and second active patterns AP1 and AP2 may have a parallelogram or rhombus shape. Since the first and second active patterns AP1 and AP2 are disposed in the diagonal direction, it is possible to reduce coupling between the first and second active patterns AP1 and AP2 facing each other in the second direction D2.

Figure 24:
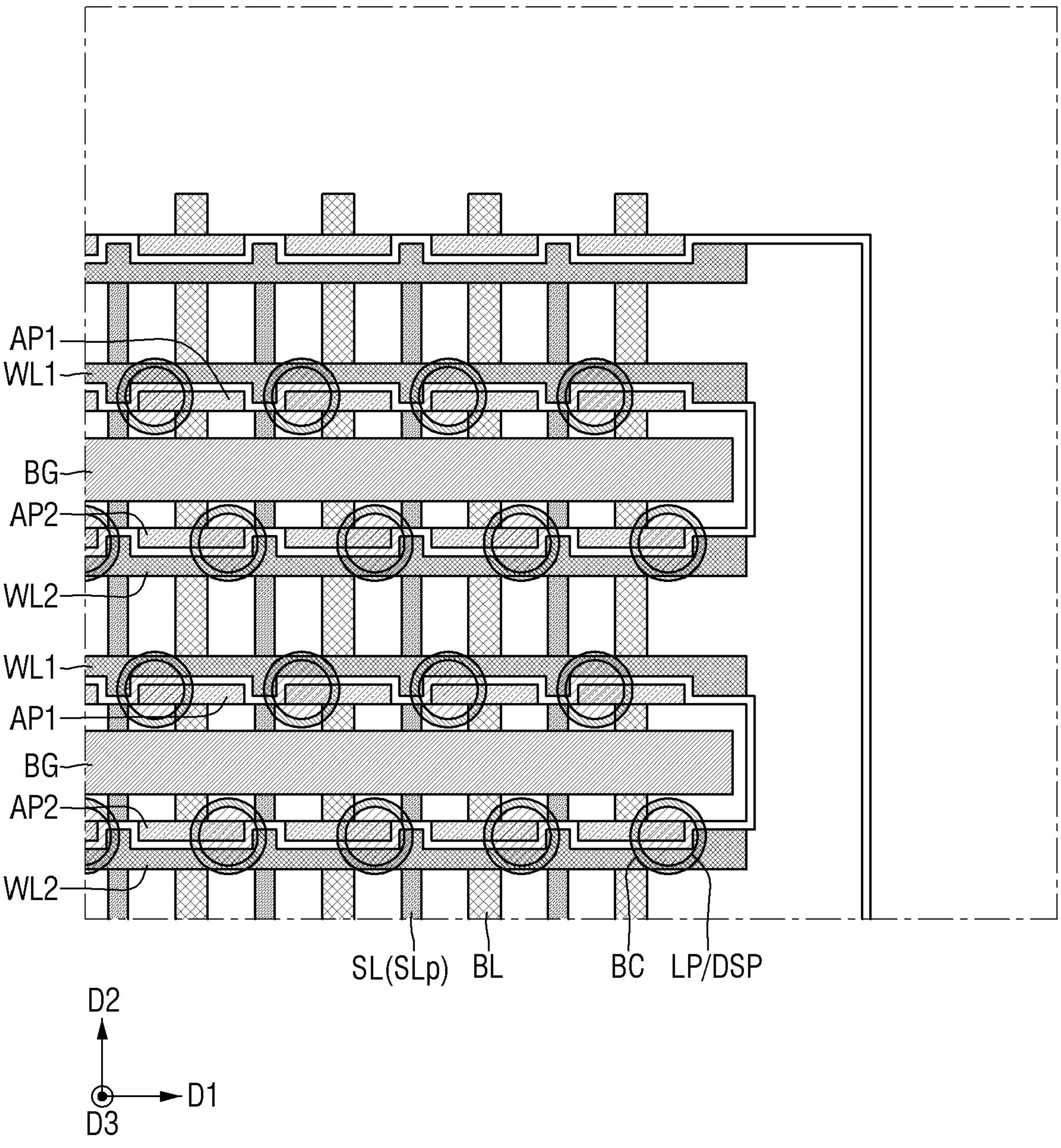

Referring to FIG. 24, in the semiconductor memory device according to some embodiments, the landing pads LP and the data storage patterns DSP may be arranged in the form of a zigzag or honeycomb pattern in plan view.

Figure 25:
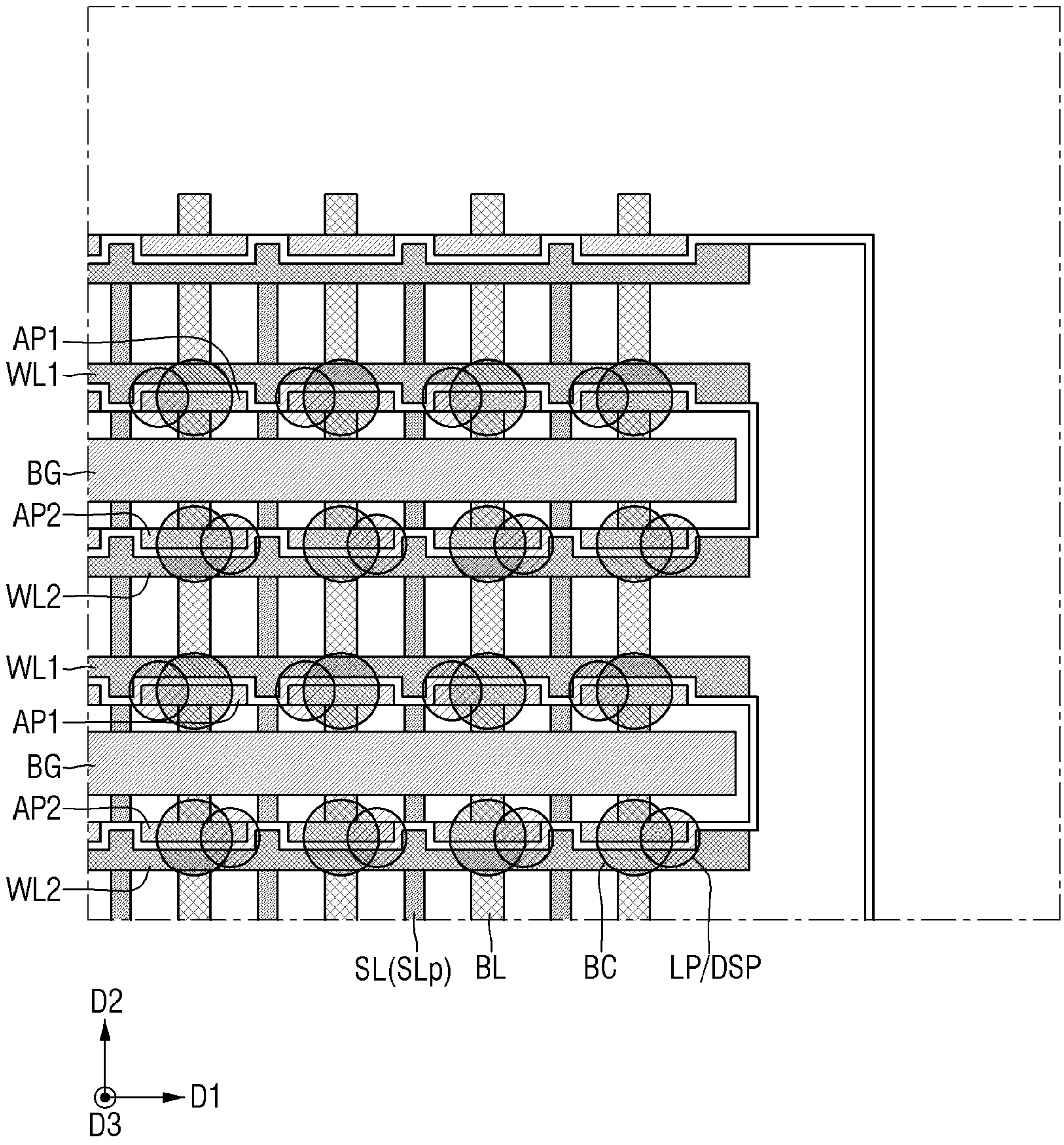

Referring to FIG. 25, in the semiconductor memory device according to some embodiments, the data storage patterns DSP may be disposed to be misaligned from the landing pad LP in plan view.

Each data storage pattern DSP may be in contact with a part of the landing pad LP.

Figure 26:
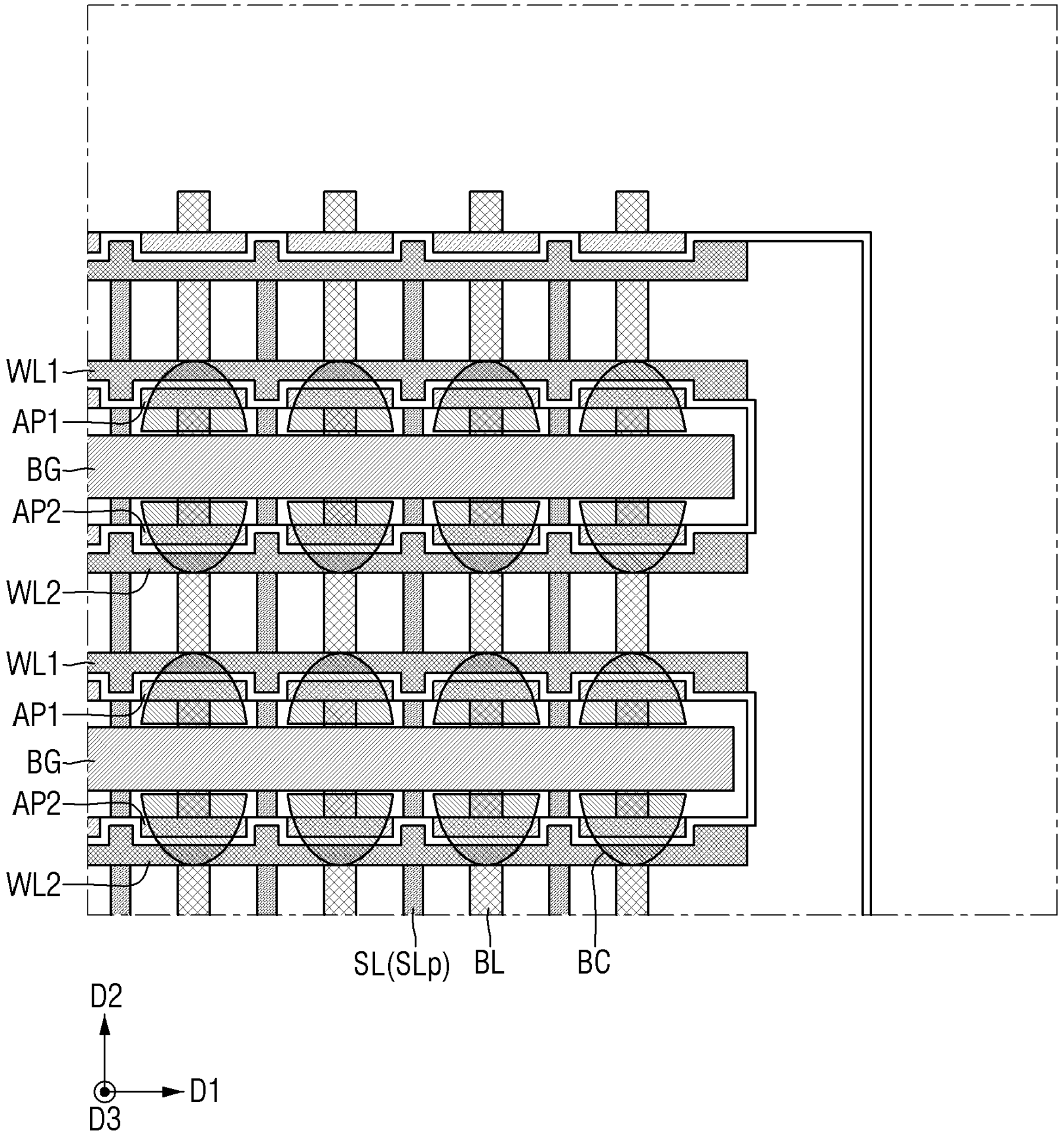

Referring to FIG. 26, in the semiconductor memory device according to some embodiments, each of the contact patterns BC disposed on the first and second active patterns AP1 and AP2 may have a semicircular shape or a semielliptical shape in plan view.

The contact patterns BC may be disposed symmetrically with respect to each other with the back gate electrode BG interposed therebetween from a planar viewpoint.

FIGS. 27 to 53 are diagrams for explaining a method of fabricating a semiconductor memory device according to some embodiments. Accordingly, the semiconductor memory device described using FIGS. 1 to 12 may be fabricated.

Figure 27:
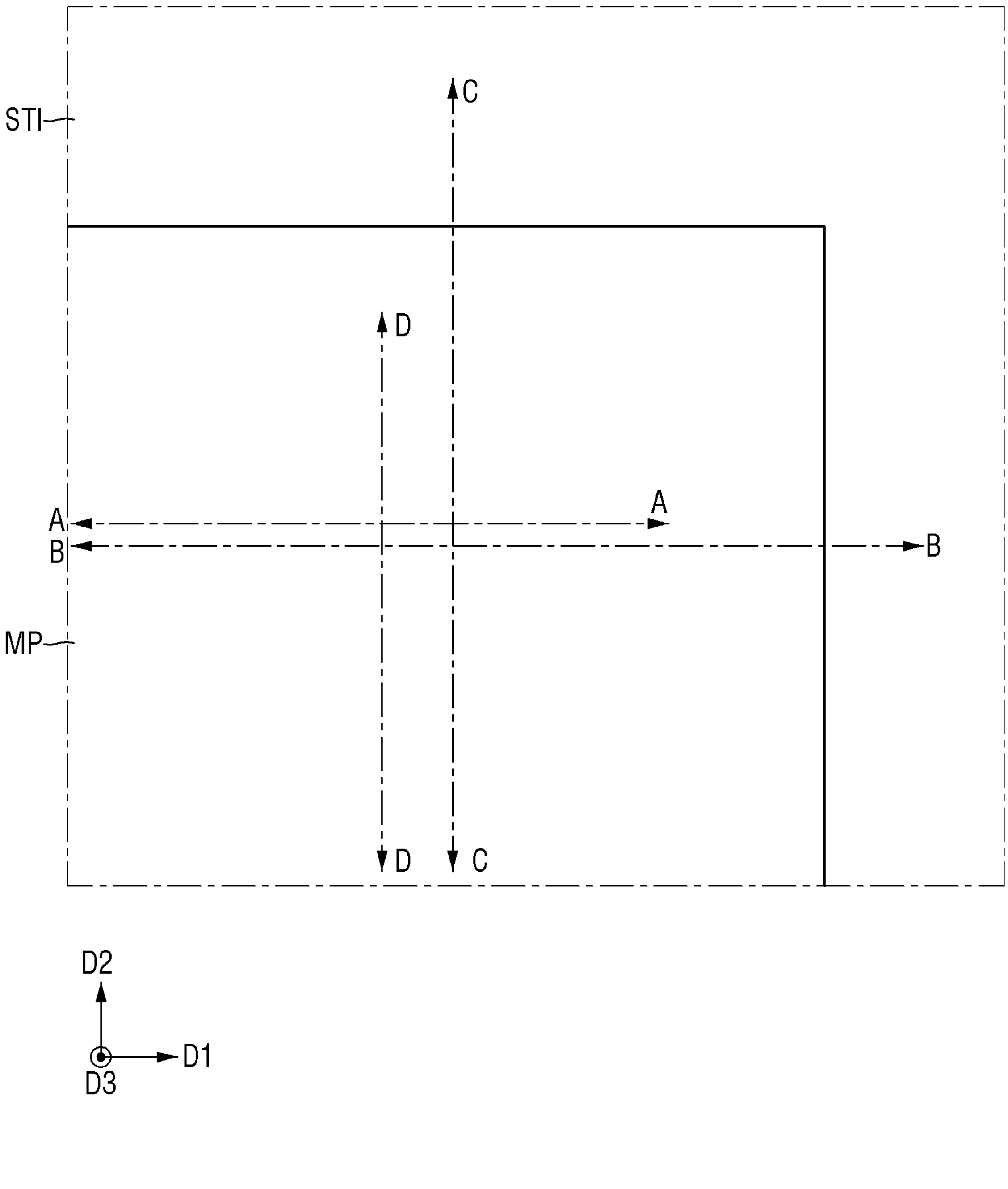
FIGS. 27 to 53 are diagrams for explaining a method of fabricating a semiconductor memory device according to some embodiments.
Figure 28:
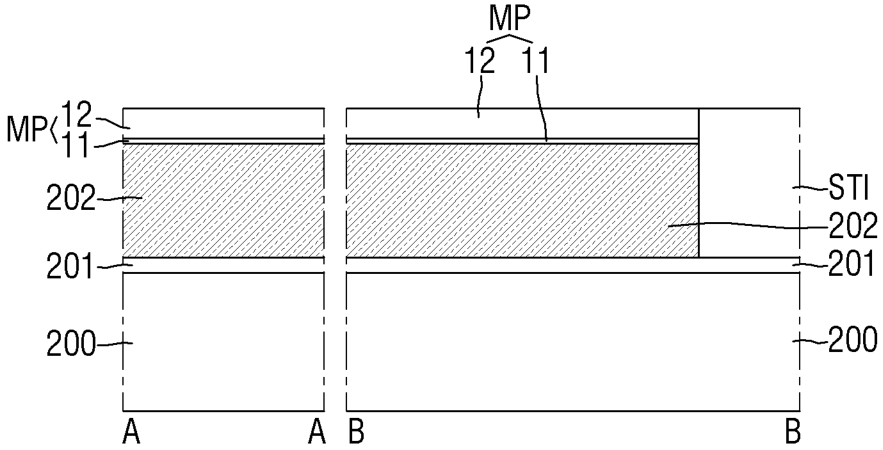
Figure 29:
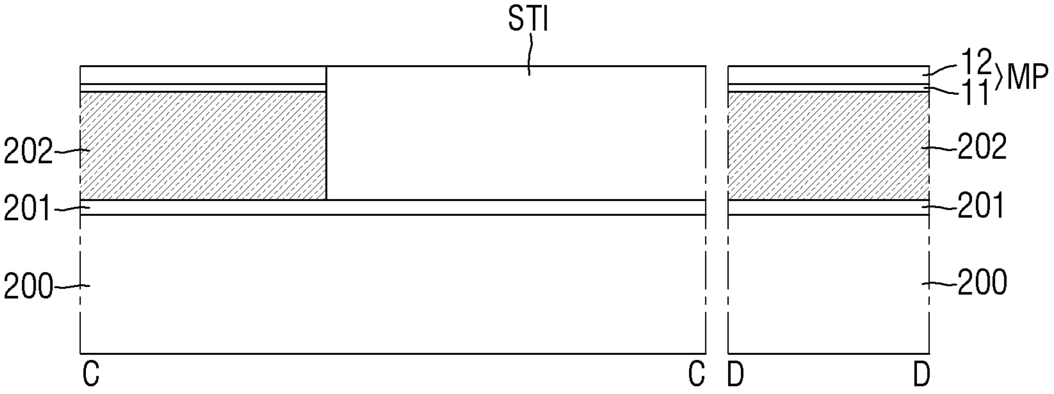

Referring to FIGS. 27 to 29, a sub-substrate structure including a first sub-substrate 200, a buried insulating film 201, and an active layer 202 may be provided.

The buried insulating film 201 and the active layer 202 may be provided on the first sub-substrate 200. The first sub-substrate 200, the buried insulating film 201 and the active layer 202 may be silicon-on-insulator substrates (i.e., SOI substrates).

The first sub-substrate 200 may include a cell array region CAR and a peripheral circuit region PCR. The first sub-substrate 200 may be, for example, a silicon substrate, a germanium substrate, and/or a silicon-germanium substrate.

The buried insulating film 201 may be a buried oxide (BOX) formed by a SIMOX (separation by implanted oxygen) method or a bonding and layer transfer method. In contrast, the buried insulating film 201 may be an insulating film formed by a chemical vapor deposition method. The buried insulating film 201 may include, for example, a silicon oxide film, a silicon nitride film, a silicon oxynitride film, and/or a low dielectric constant insulating film.

The active layer 202 may be a single crystal semiconductor film. The active layer 202 may be, for example, a single crystal silicon substrate, a germanium substrate, and/or a silicon-germanium substrate. The active layer 202 may have a first side and a second side that are opposite to each other in the third direction D3, and the second side of the active layer 202 may be in contact with the buried insulating film 201.

A mask pattern MP may then be formed on the active layer 202. The mask pattern MP may include a lower mask film 11 and an upper mask film 12 that are sequentially stacked. The upper mask film 12 may be made of a material having etching selectivity with respect to the lower mask film 11. As an example, the lower mask film 11 may include silicon oxide, and the upper mask film 12 may include, but is not limited to, silicon nitride.

Subsequently, a cell region element isolation film STI may be formed in the active layer 202 of the peripheral circuit region PCR. The cell region element isolation film STI may be formed by patterning the active layer 202 of the peripheral circuit region PCR to form an element isolation trench that exposes the buried insulating film 201, and then burying an insulating material inside the element isolation trench. The cell region isolation film STI may be formed to define the cell array region CAR. The upper side of the cell region element isolation film STI may be substantially coplanar with the upper side of the mask pattern MP.

Figure 30:
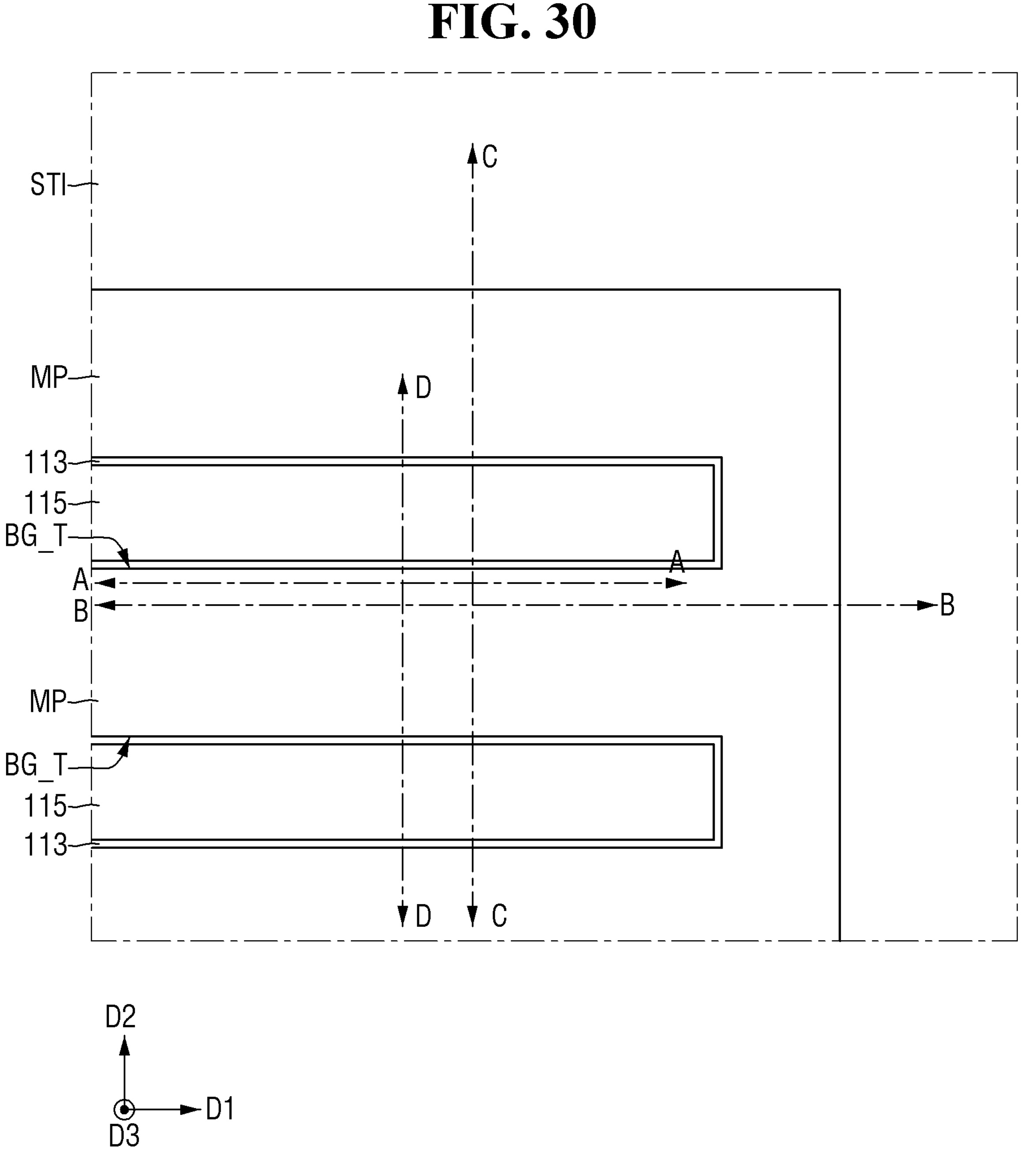
Figure 31:
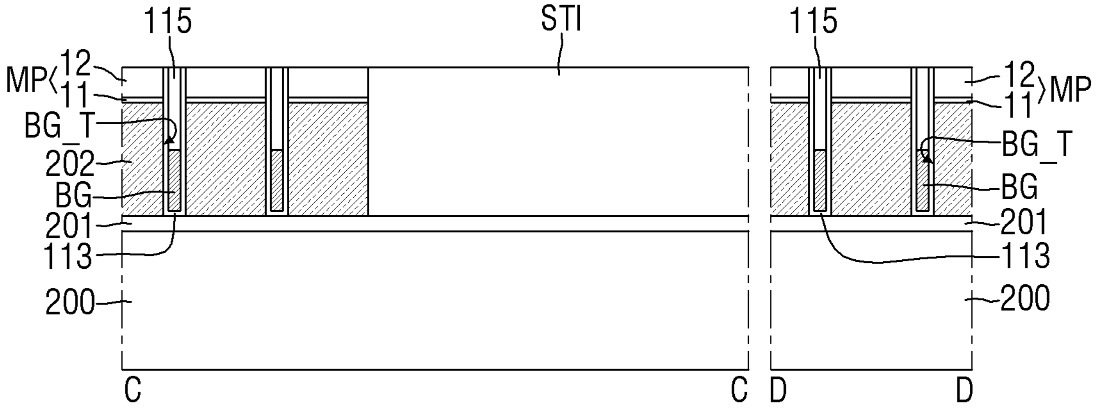
Figure 32:
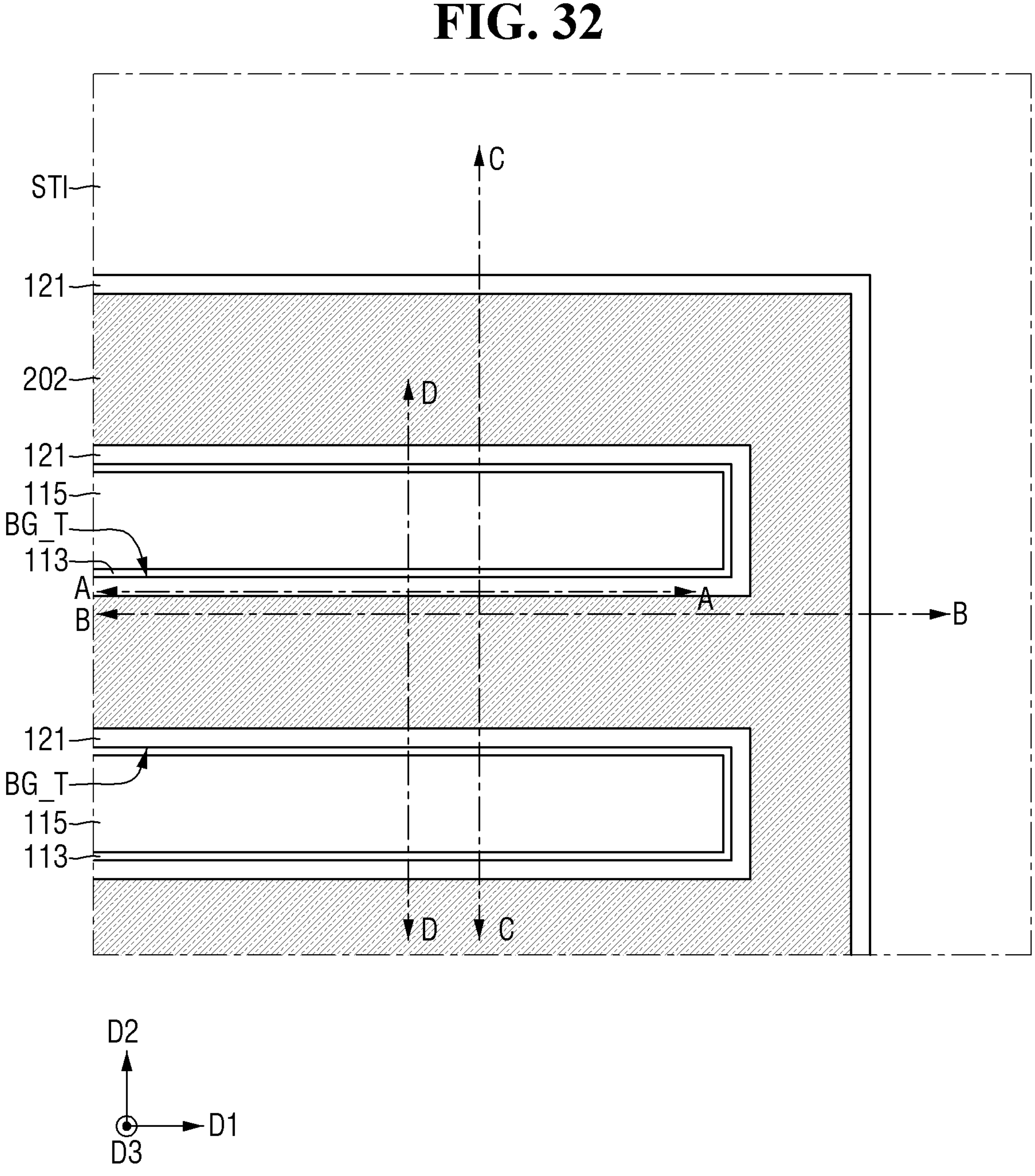
Figure 33:
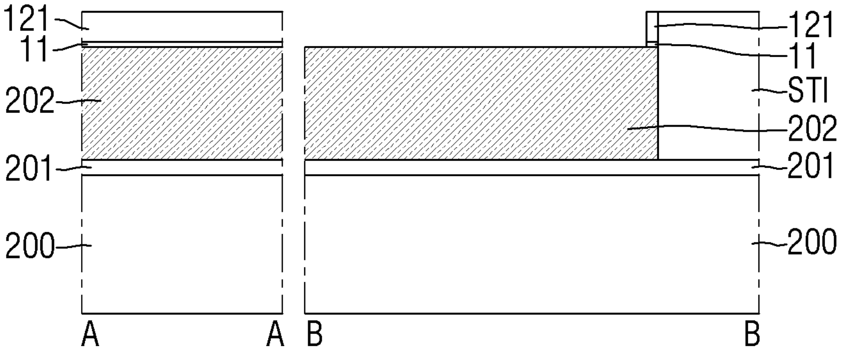
Figure 34:
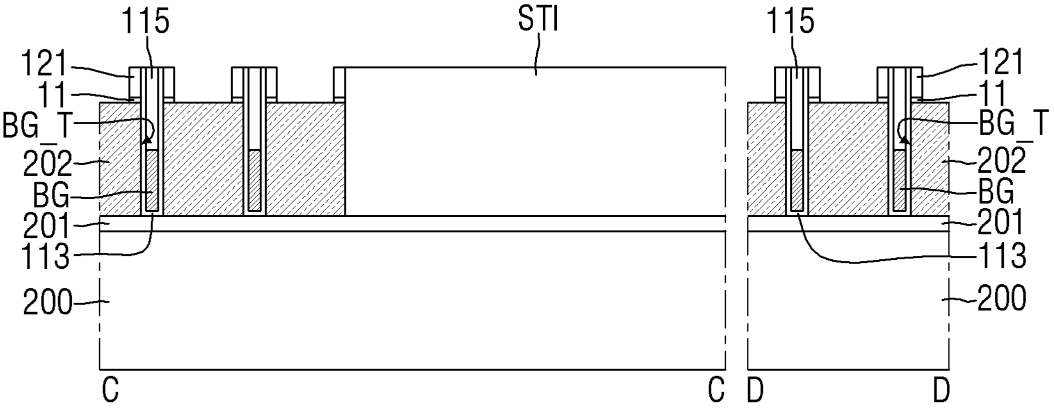
Figure 35:
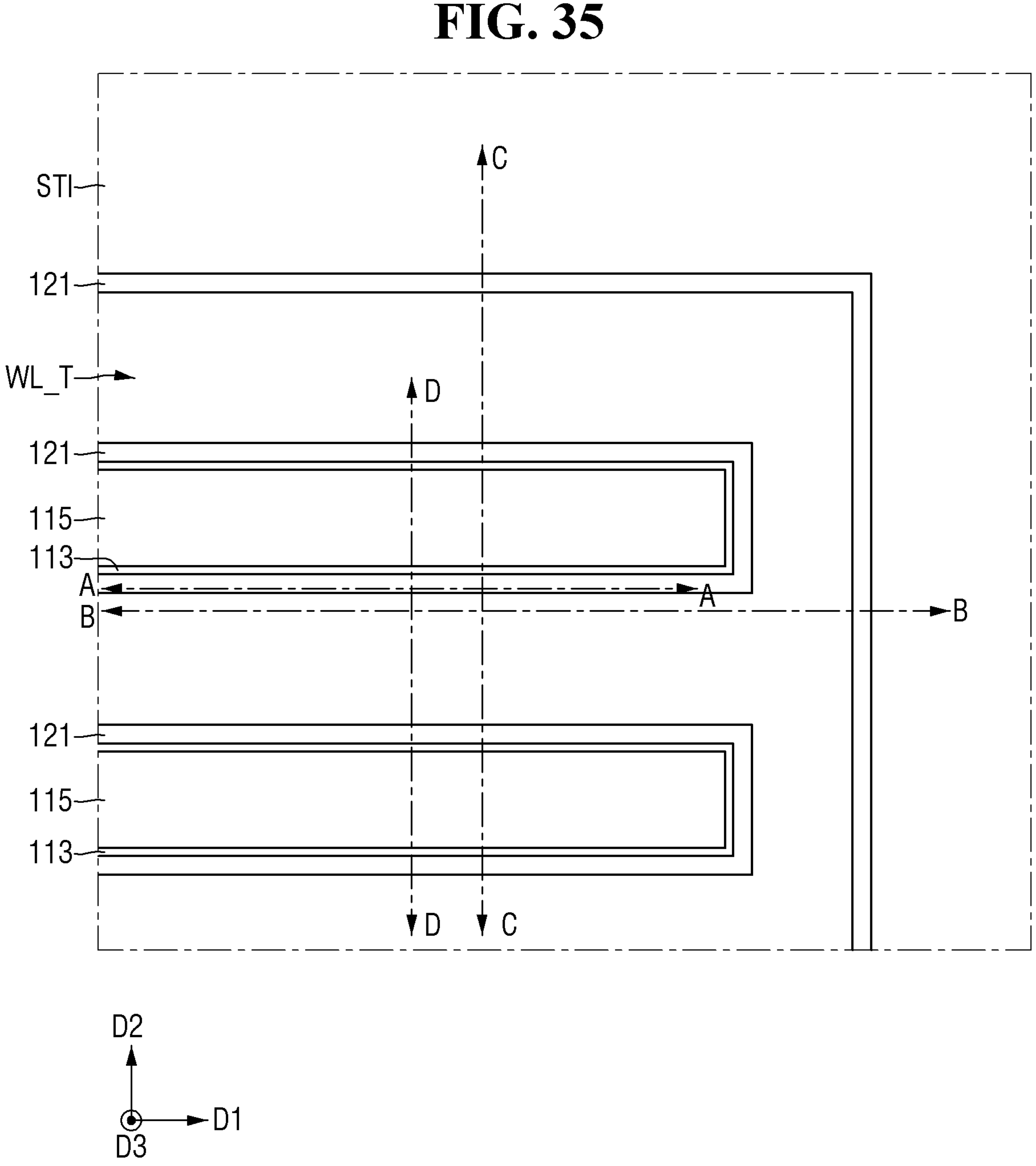
Figure 36:
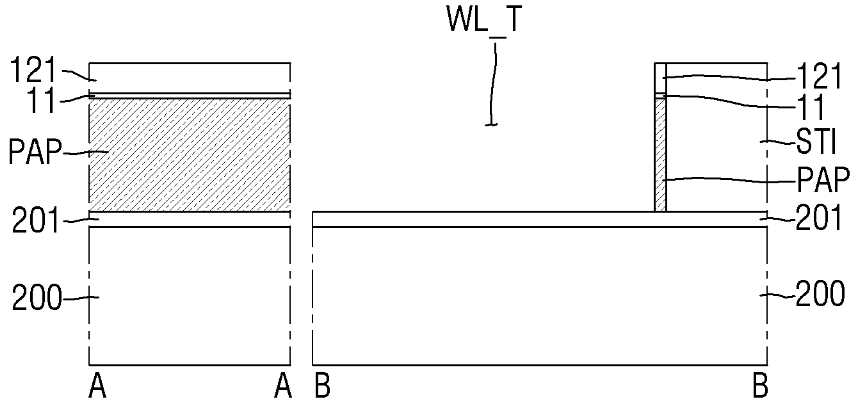
Figure 37:
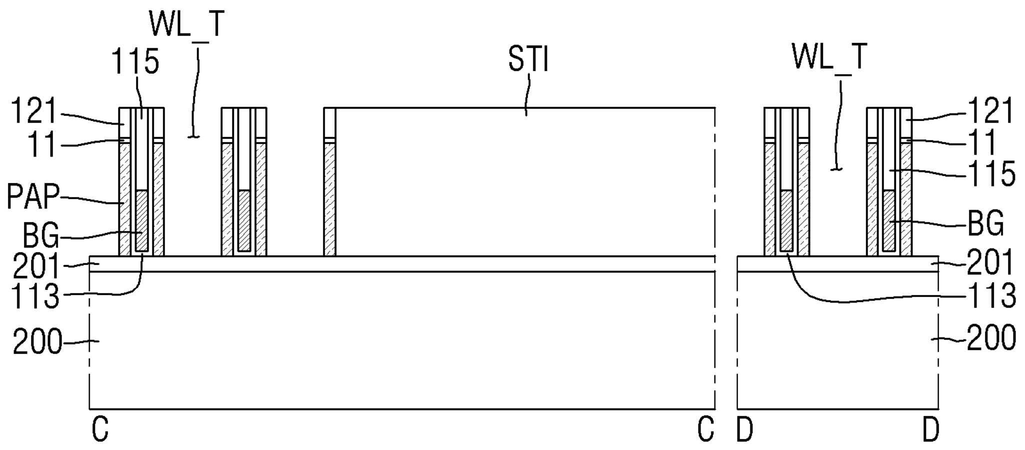
Figure 38:
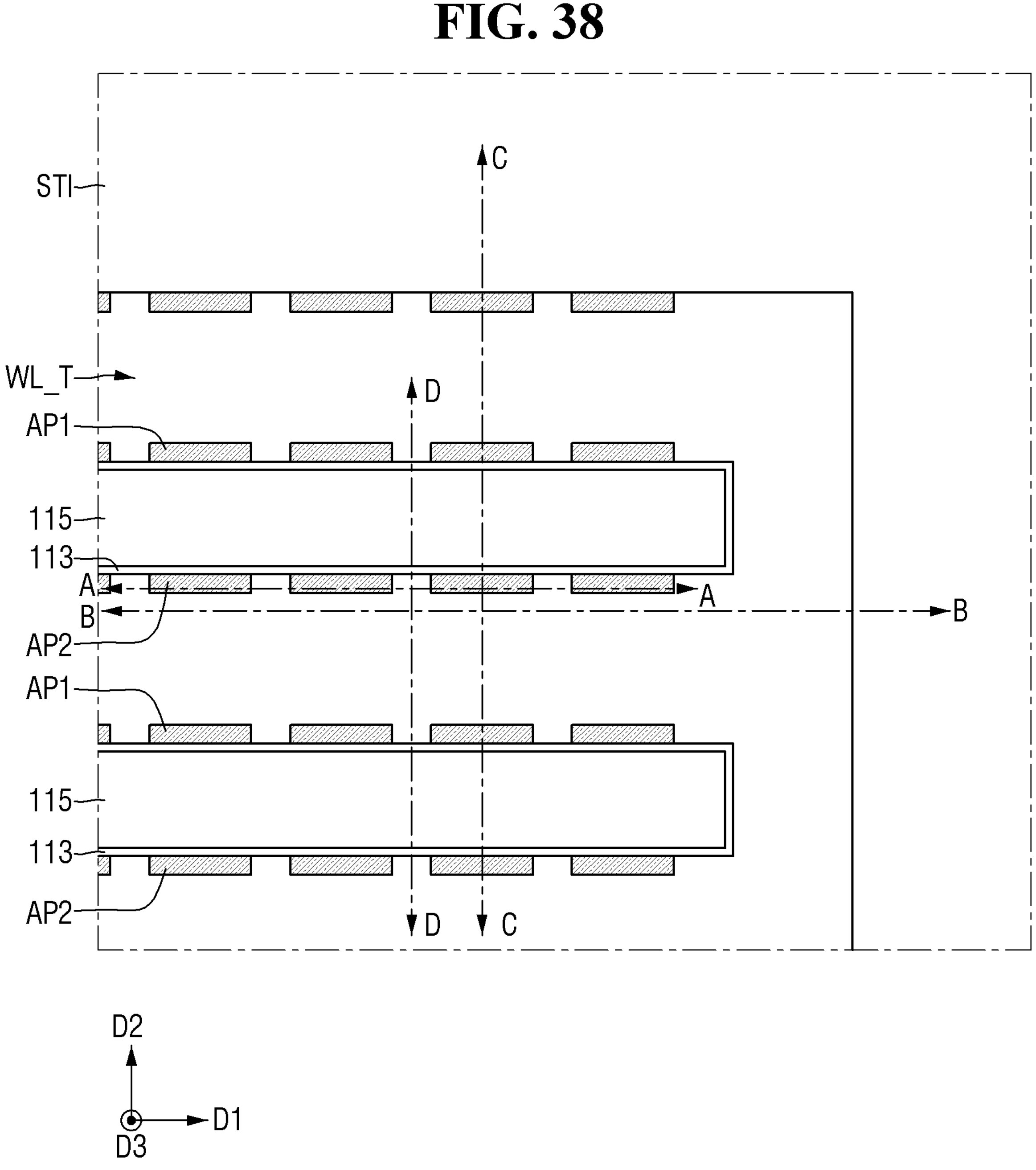
Figure 39:
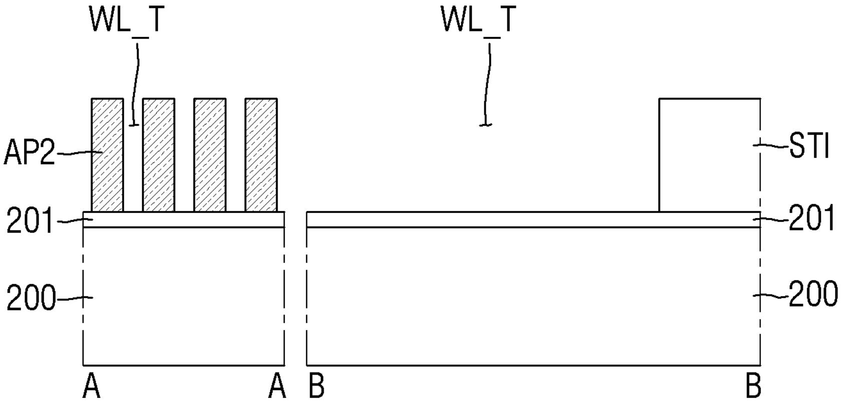
Figure 40:
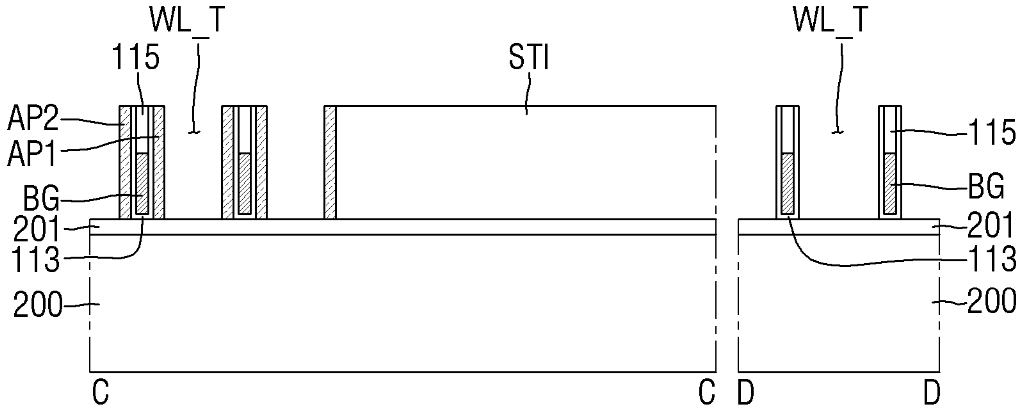

Referring to FIGS. 30 and 31, the active layer 202 of the cell array region CAR may be anisotropically etched.

Accordingly, the back gate trenches BG_T extending in the first direction D1 may be formed on the active layer 202 of the cell array region CAR. The back gate trenches BG_T may expose the buried insulating film 201, and may be spaced apart at constant intervals in the second direction D2.

Unlike the shown example, at least a part of the buried insulating film 201 may be removed, while the back gate trenches BG_T are being formed.

The back gate insulating pattern 113 and the back gate electrodes BG may then be formed inside the back gate trench BG_T.

More specifically, the back gate insulating pattern 113 may be formed along the side walls and bottom side of the back gate trench BG_T and the upper side of the back gate mask pattern MP. The back gate conductive film may be formed on the back gate insulating pattern 113. The back gate conductive film may fill the back gate trench BG_T. Subsequently, the back gate conductive film may be etched to form the back gate electrodes BG extending in the first direction D1. The back gate electrodes BG may fill a part of the back gate trench BG_T.

Meanwhile, according to some embodiments, a gas phase doping (GPD) process or a plasma doping (PLAD) process may be performed before forming the back gate insulating pattern 113. The active layer 202 exposed by the back gate trench BG_T may be doped with impurities through the aforementioned process.

The back gate capping patterns 115 may then be formed on the back gate electrode BG.

The back gate capping pattern 115 may fill the rest of the back gate trench BG_T. If the back gate capping pattern 115 and the back gate insulating pattern 113 are made up of the same material (e.g., silicon oxide), the back gate insulating pattern 113 on the upper side of the back gate mask pattern MP may be removed, while the back gate capping pattern 115 is being formed.

Meanwhile, before forming the back gate capping pattern 115, a gas phase doping (GPD) process or a plasma doping (PLAD) process may be performed. Accordingly, impurities may be doped into the active layer 202 through the back gate trench BG_T in which the back gate electrode BG is formed.

A cross-sectional view taken along A-A and B-B of FIG. 30 may be the same as that of FIG. 28.

Referring to FIGS. 30 to 34, after forming the back gate capping patterns 115, the upper mask film 12 may be removed.

The back gate capping patterns 115 may have a form protruding above the upper side of the lower mask film 11.

A pair of spacer patterns 121 may then be formed on side walls of the back gate insulating pattern 113.

More specifically, the spacer film may be formed along the upper side of the lower mask film 11, the side walls of the back gate insulating patterns 113, and the upper sides of the back gate capping patterns 115. The spacer film may be formed at a uniform thickness. A spacer pattern 121 may be formed by performing an anisotropic etching process on the spacer film. The active layer 202 may be exposed, while the spacer pattern 121 is being formed.

The widths of the active patterns of the vertical channel transistors may be determined, depending on a deposited thickness of the spacer film. The spacer film may be made up of an insulating material. The spacer film may include, for example, silicon oxide, silicon oxynitride, silicon nitride, silicon carbide (SiC), silicon carbon nitride film (SiCN), combinations thereof, and the like.

Referring to FIGS. 32 to 37, an anisotropic etching process may be performed on the active layer 202, using the spacer pattern 121 as an etching mask.

Accordingly, the pre-active patterns PAP that surround each back gate electrode BG may be formed. As the pre-active patterns PAP are formed, the buried insulating film 201 may be exposed. The pre-active pattern PAP may be formed along side walls of the cell region element isolation film STI.

The pre-active patterns PAP may have a loop shape formed along the periphery of the back gate electrode BG. A word line trench WL_T may be formed between the pre-active patterns PAP adjacent to each other.

Referring to FIGS. 35 to 40, a sacrificial film that fills the word line trench WL_T may be formed.

An active mask pattern may be formed on the sacrificial film. The active mask pattern may have a line shape extending in the second direction D2. As another example, the active mask pattern may have the line shape extending in a diagonal direction with respect to the first direction D1 and the second direction D2. The sacrificial film may be etched using the active mask pattern as an etch mask to form sacrificial openings in the sacrificial film.

By etching the pre-active patterns PAP exposed to the sacrificial opening, a first active pattern AP1 and a second active pattern AP2 may be formed on both sides of the back gate electrode BG. The first active patterns AP1 may be formed to be spaced apart from each other in the first direction D1 on the first side walls of the back gate electrode BG. The second active patterns AP2 may be formed to be spaced apart from each other in the first direction D1 on the second side walls of the back gate electrode BG. Since the first active pattern AP1 and the second active pattern AP2 are formed, the sacrificial openings may expose a part of the back gate insulating pattern 113.

Thereafter, the sacrificial film, the active mask pattern, the spacer pattern 121 and the lower mask film 11 may be removed. Accordingly, the first active pattern AP1 and the second active pattern AP2 may be exposed. Also, the buried insulating film 201 may be exposed.

A dummy active pattern (AP_D of FIG. 2) may be formed on the side wall of the cell region element isolation film STI, while the first active pattern AP1 and the second active pattern AP2 are being formed. The dummy active pattern may not be formed on the side walls of the cell region element isolation film STI, unlike the shown example.

Figure 41:
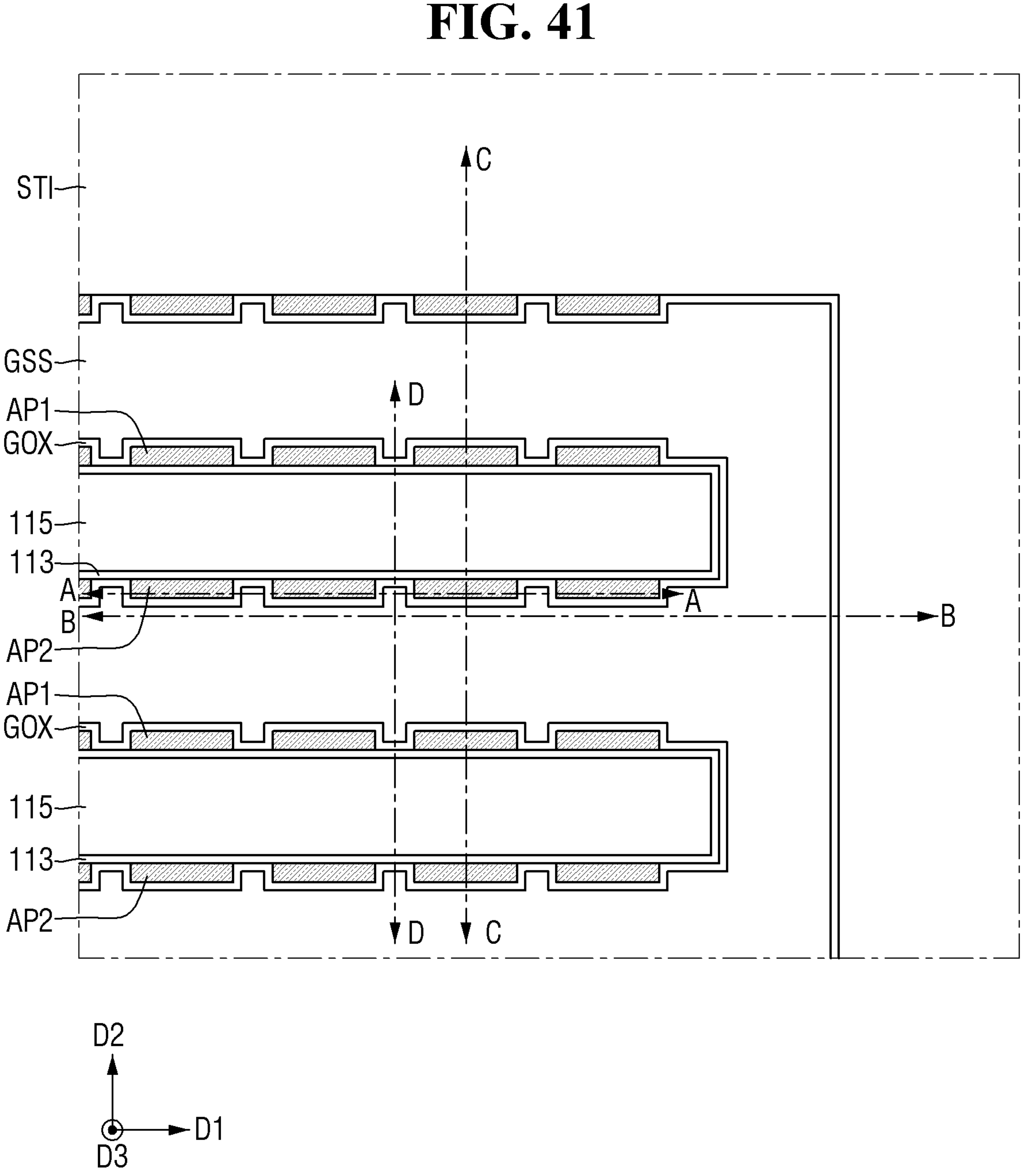
Figure 42:
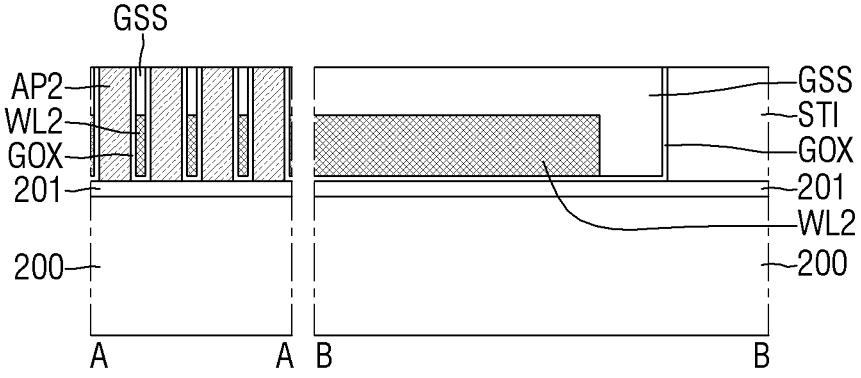
Figure 43:
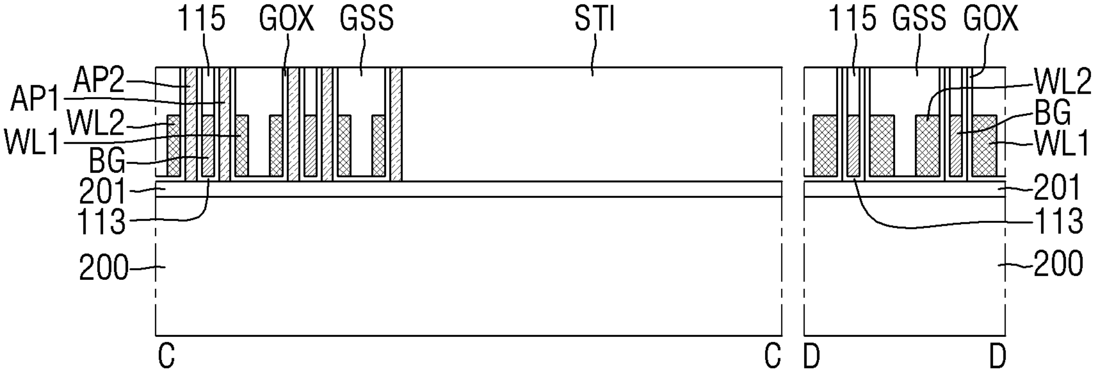

Referring to FIGS. 41 to 43, the gate insulating pattern GOX may be formed along the side walls of the first active pattern AP1, the side walls of the second active pattern AP2, the upper side of the back gate capping pattern 115, and the upper side of the buried insulating film 201.

The gate insulating pattern GOX may be formed using at least one of physical vapor deposition (PVD), thermal chemical vapor deposition (thermal CVD), low-pressure chemical vapor deposition (LP-CVD), plasma enhanced chemical vapor deposition (PE-CVD) or atomic layer deposition (ALD) techniques. However, the invention is not limited thereto.

Subsequently, a first word line WL1 and a second word line WL2 may be formed on the gate insulating pattern GOX. The first and second word lines WL1 and WL2 may be formed on side walls of the first and second active patterns AP1 and AP2. Dummy word lines may be formed on side walls of the dummy active patterns (AP_D of FIG. 2).

Formation of the first and second word lines WL1 and WL2 may include a process of performing an anisotropic etching process on the gate conductive film after depositing a gate conductive film on the gate insulating pattern GOX. Here, a deposition thickness of the gate conductive film may be smaller than half a width of the word line trench (WL_T of FIGS. 38 to 40).

At the time of the anisotropic etching process on the gate conductive film, the gate insulating pattern GOX may be used as an etching stop film. Unlike the shown example, the gate insulating pattern GOX may be over-etched to expose the buried insulating film 201. The first and second word lines WL1 and WL2 may have various shapes depending on the anisotropic etching process on the gate conductive film.

The upper side of the first word line WL1 and the upper side of the second word line WL2 may be positioned at a level lower than the upper sides of the first and second active patterns AP1 and AP2.

As an example, after forming the first and second word lines WL1 and WL2, a gas phase doping (GPD) process or a plasma doping (PLAD) process may be performed. Accordingly, impurities may be doped into the first and second active patterns AP1 and AP2 through the gate insulating patterns GOX exposed by the first and second word lines WL1 and WL2.

Subsequently, the gate isolation pattern GSS may be formed on the first word line WL1 and the second word line WL2. For example, the upper side of the gate isolation pattern GSS may be disposed on the same plane as the upper side of the back gate capping pattern 115.

Figure 44:
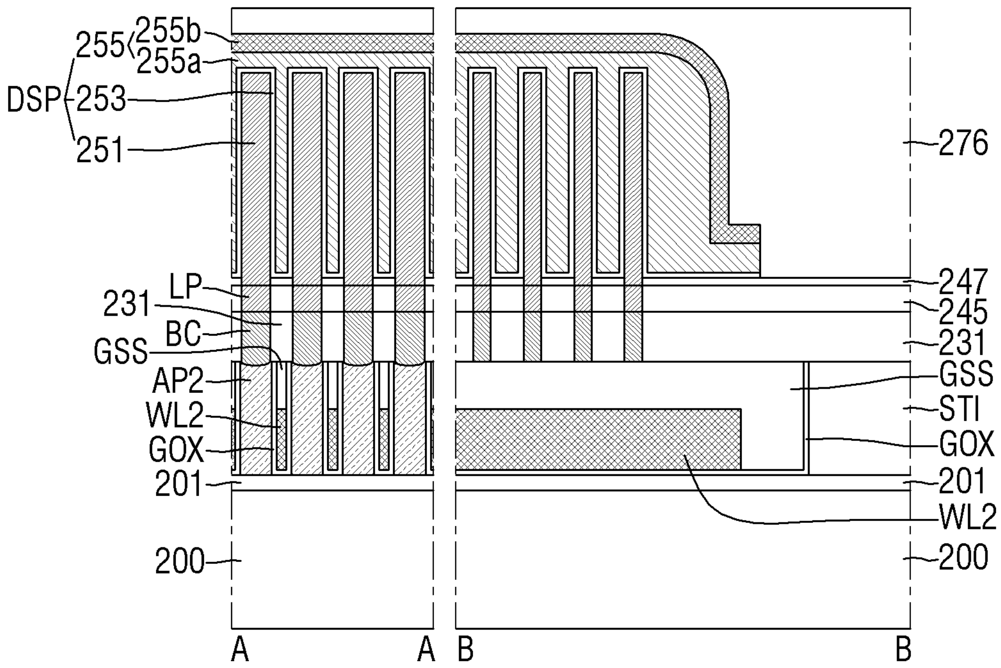
Figure 45:
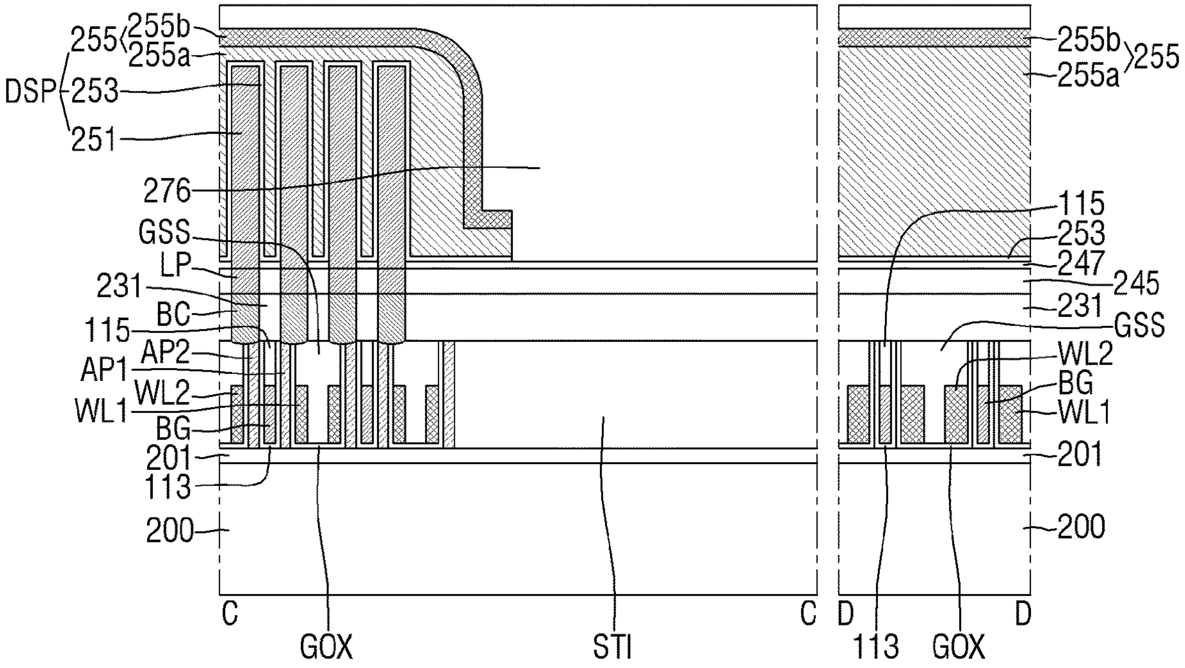
Figure 46:
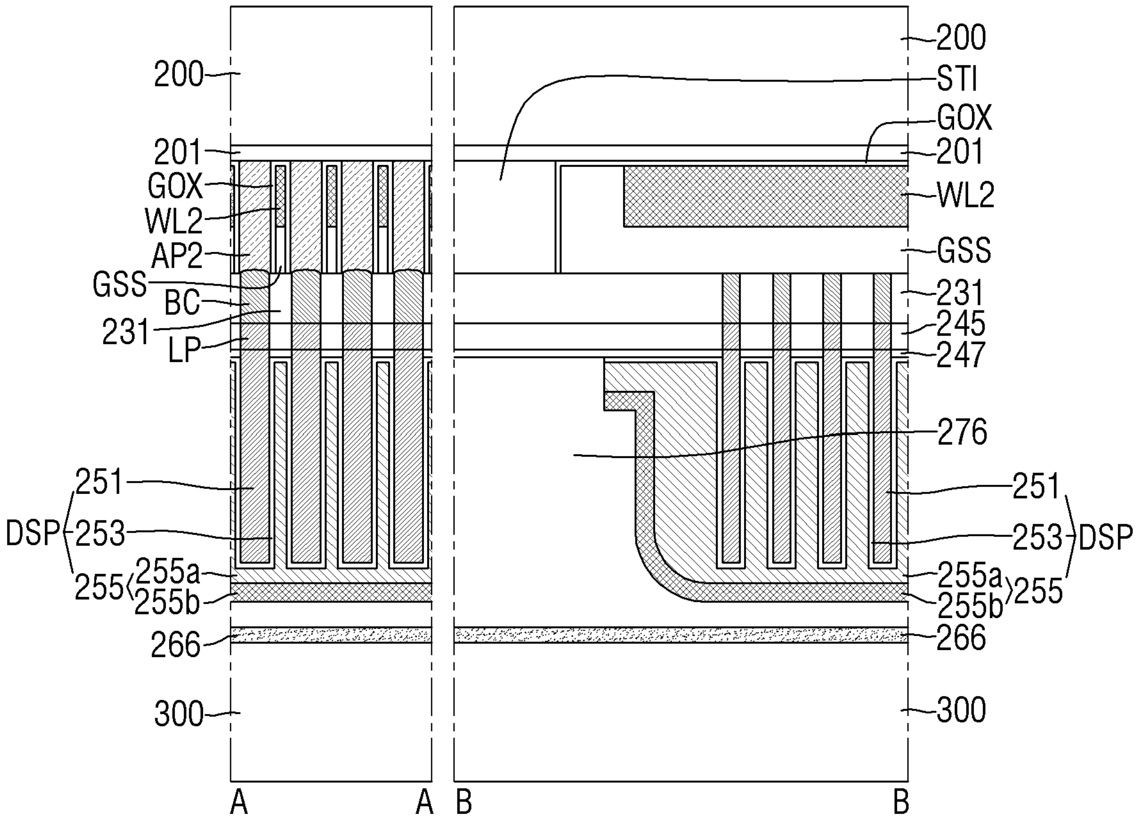

Referring to FIGS. 44 to 46, a contact hole that exposes the first active pattern AP1 and the second active pattern AP2 may be formed in the contact interlayer insulating film 231.

The contact pattern BC may be formed inside the contact hole. The contact patterns BC may be formed on the first active pattern AP1 and the second active pattern AP2. The contact patterns BC may be connected to the first active pattern AP1 and the second active pattern AP2. A landing pad LP may be formed on the contact pattern BC. Data storage patterns DSP may be formed on the landing pad LP.

Subsequently, a third upper insulating film 276 may be formed on the data storage patterns DSP. The third upper insulating film 276 may cover the data storage pattern DSP.

Figure 47:
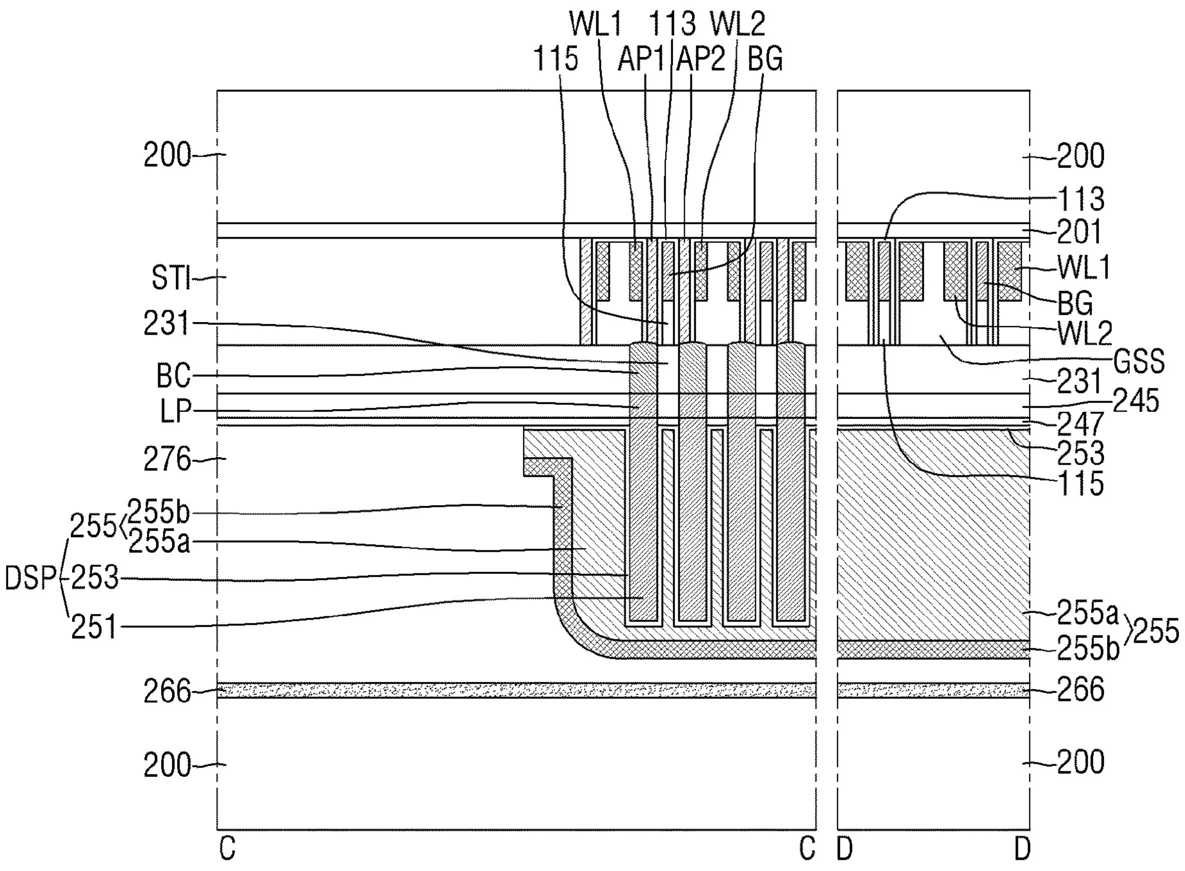
Figure 48:
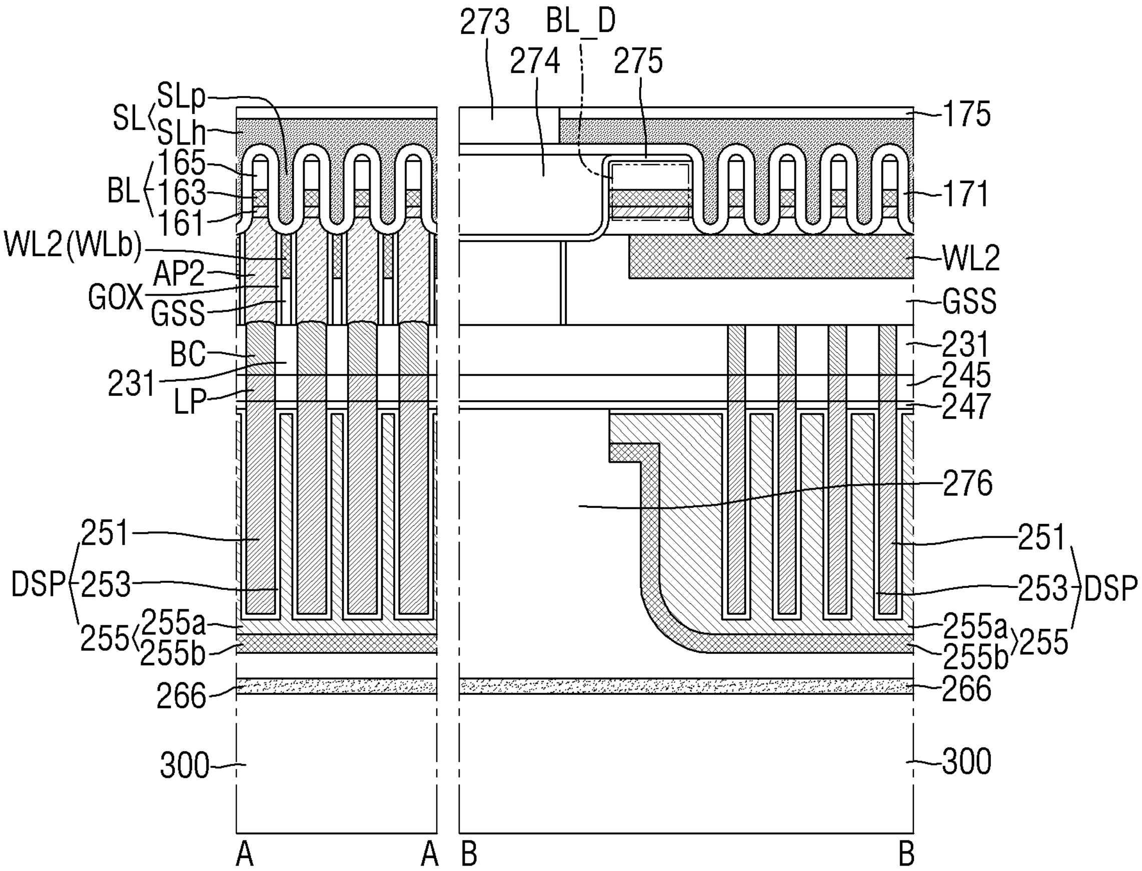
Figure 49:
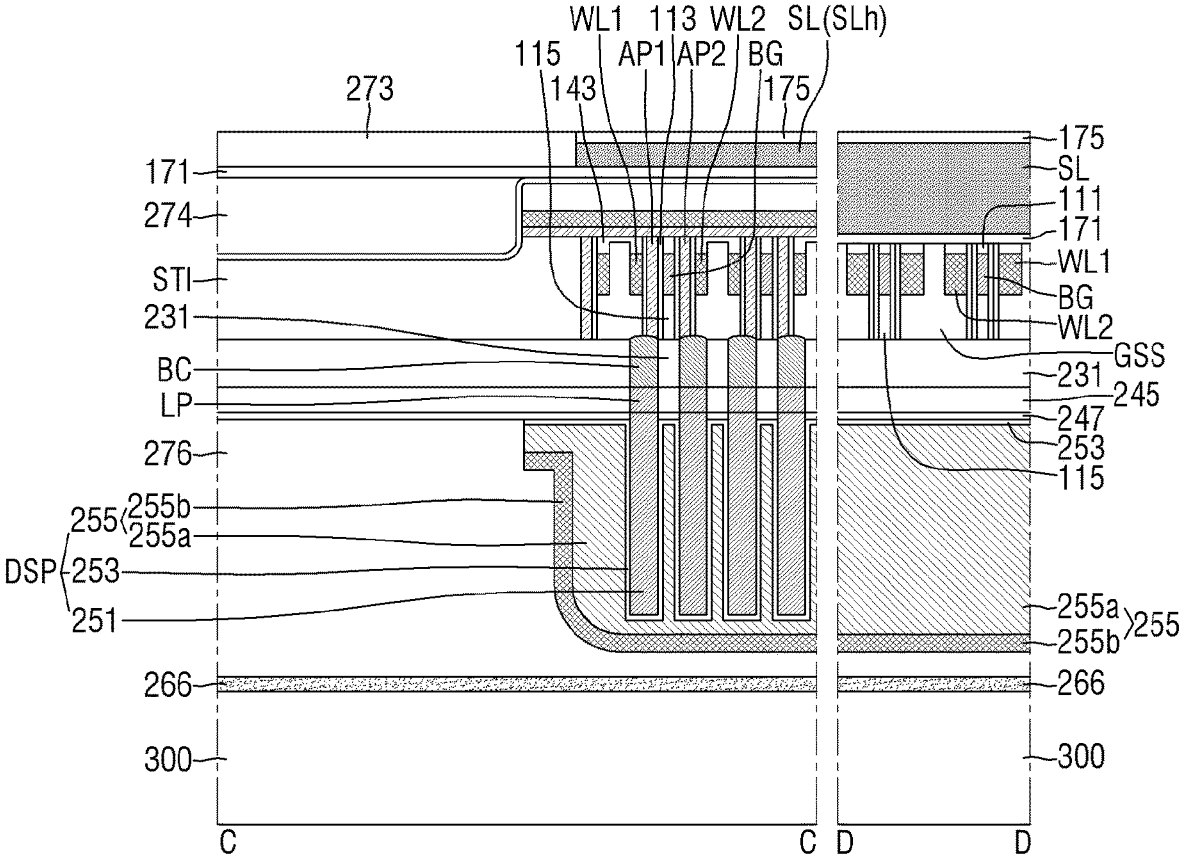

Referring to FIGS. 46 and 47, a first sub-substrate 200 with the back gate electrodes BG, the word lines WL1 and WL2, the active patterns AP1 and AP2, and the date storage patterns DSP formed thereon may be bonded to the second sub-substrate 300.

The first sub-substrate 200 and the second sub-substrate 300 may be bonded, using the second bonding insulating film 266.

Referring to FIGS. 46 to 49, after bonding the first sub-substrate 200 to the second sub-substrate 300, a back side lapping process for removing the first sub-substrate 200 may be performed.

Removal of the first sub-substrate 200 may include a process of exposing the buried insulating film 201 by sequentially performing a grinding process and a wet etching process.

The buried insulating film 201 may then be removed to expose the first active pattern AP1 and the second active pattern AP2.

The buried insulating film 201 may be removed to expose a part of the gate insulating pattern GOX and a part of the back gate insulating pattern 113.

After that, the exposed gate insulating pattern GOX and the exposed back gate insulating pattern 113 may be removed. Accordingly, the back gate electrode BG, the first word line WL1 and the second word line WL2 may be exposed.

An etch-back process may then be performed to remove a part of the first word line WL1 and a part of the second word line WL2. A gate capping pattern 143 may be formed on the recessed first and second word lines WL1 and WL2.

The etch-back process may be performed to remove a part of the back gate electrode BG. The back gate isolation pattern 111 may be formed on the recessed back gate electrode BG.

Subsequently, a bit line BL and a dummy bit line BL_D extending in the second direction D2 may be formed on the gate capping pattern 143 and the back gate isolation pattern 111. The bit line BL may include a bit line mask pattern 165, a metal pattern 163, and a semiconductor pattern 161. A part of the back gate capping pattern 143 and a part of the back gate isolation pattern 111 may be etched, while forming the bit line BL.

The shielding conductive pattern SL may then be formed on the bit line BL and the dummy bit line BL_D. The shielding conductive pattern SL may be formed between the bit lines BL adjacent to each other in the first direction D1. The shielding insulating liner 171 may define a shield region between the bit lines BL adjacent to each other in the first direction D1. The shielding conductive pattern SL may be formed in the shielding region of the shielding insulating liner 171.

The shielding conductive pattern SL may be formed between the bit lines BL and on the bit lines BL. The shielding insulating capping film 175 may be formed on the shielding conductive pattern SL.

Figure 50:
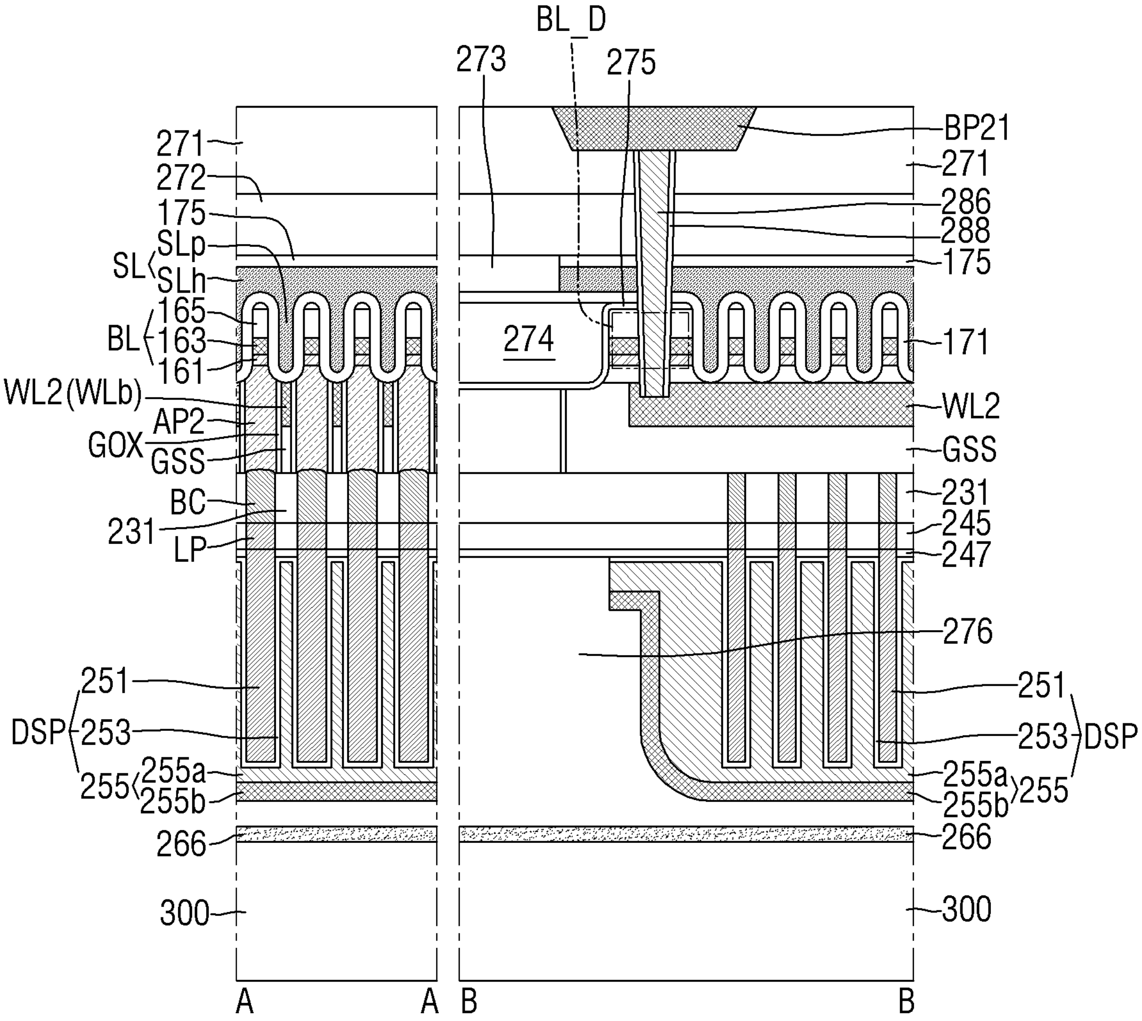
Figure 51:
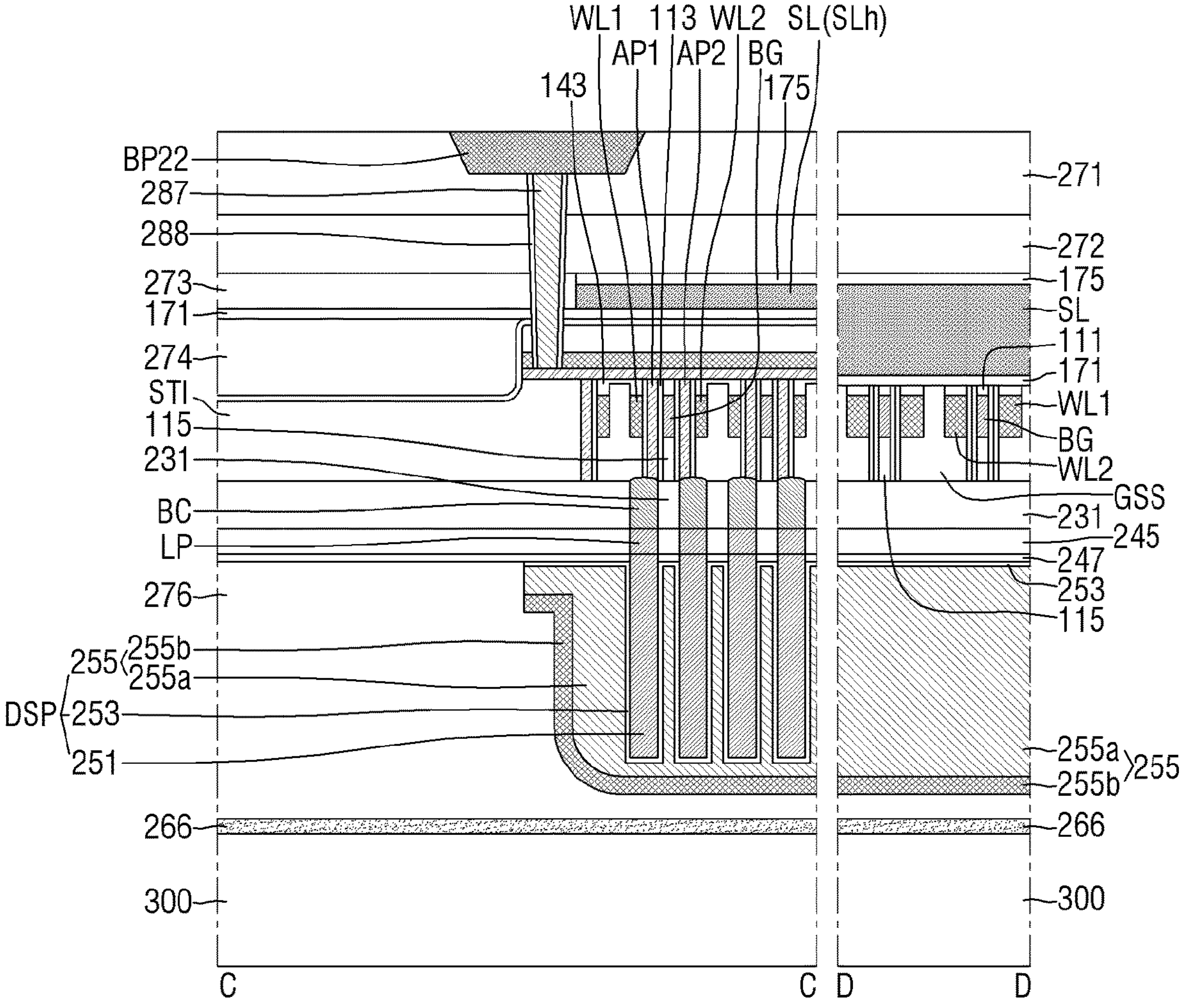

Referring to FIGS. 50 and 51, a first upper bonding pad BP21 and a second upper bonding pad BP22 may be formed on the shielding conductive pattern SL and the bit line BL.

A first upper pad plug 286 and a first upper bonding pad BP21 connected to the word lines WL1 and WL2 may be formed. A second upper pad plug 287 and a second upper bonding pad BP22 connected to the bit line BL may be formed.

Figure 52:
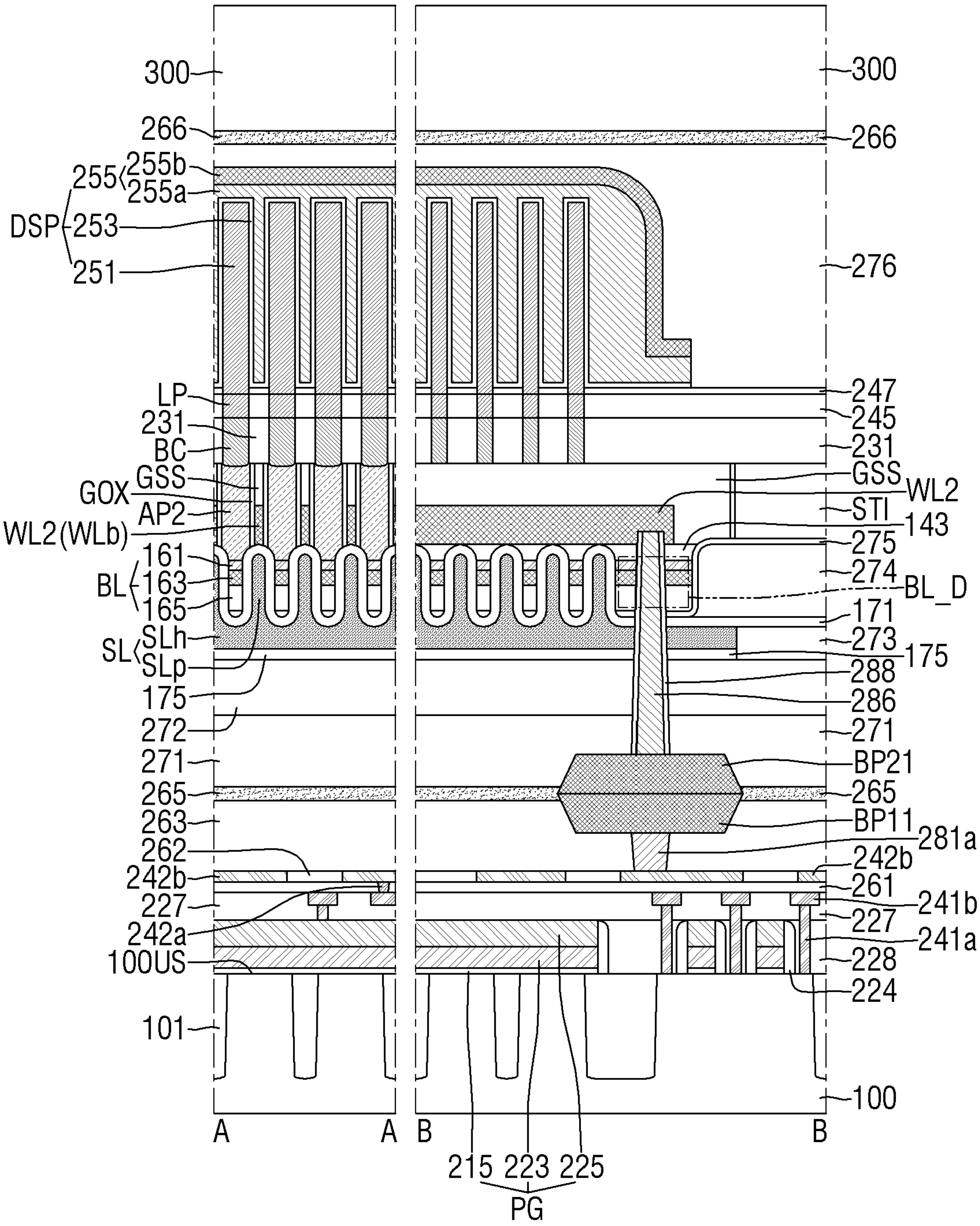
Figure 53:
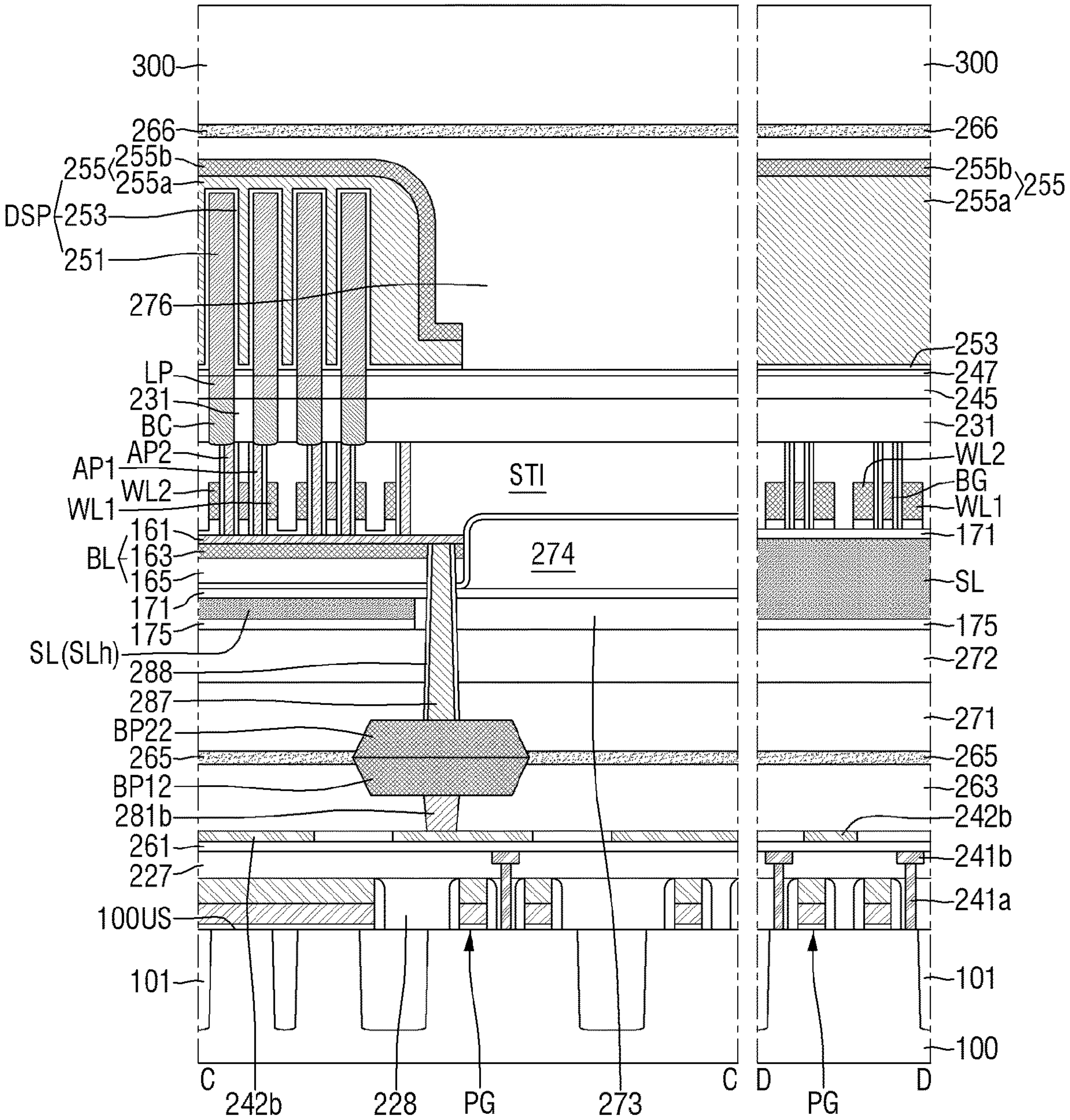

Referring to FIGS. 52 and 53, the substrate 100 having a peri-gate structure PG, lower peri-connecting structures 242*a* and 242*b*, a first lower bonding pad BP11, a second lower bonding pad BP12, a first lower pad plug 281*a*, and a second lower pad plug 281*b* formed thereon may be bonded to the second sub-substrate 300.

The second sub-substrate 300 and the substrate 100 may be bonded, using the first bonding insulating film 265.

Next, referring to FIGS. 3 and 4, after bonding the second sub-substrate 300 and the substrate 100, a back side lapping process for removing the second sub-substrate 300 may be performed. Subsequently, the second bonding insulating film 266 may be removed. Unlike the shown example, the second bonding insulating film 266 may not be removed.

Next, the upper peri-connecting structures 290*a*, 290*b* and 290*c*, the upper connecting pad 295, and the upper connecting plug 296 may be formed on the data storage pattern DSP. The through connecting via THV may be formed before the upper peri-connecting structure 290*a* disposed at the lowest part is formed.

In concluding the detailed description, those skilled in the art will appreciate that many variations and modifications may be made to the preferred embodiments without substantially departing from the principles of the present inventive concept. Therefore, the disclosed preferred embodiments of the disclosure are used in a generic and descriptive sense only and not for purposes of limitation.

What is claimed is:

1. A semiconductor memory device comprising:
- a peri-gate structure on a substrate;
- a first bonding pad on the peri-gate structure;
- a shielding conductive pattern on the first bonding pad;
- a second bonding pad between the shielding conductive pattern and the first bonding pad, the second bonding pad being in contact with the first bonding pad;
- a bit line on the shielding conductive pattern, the bit line extending in a first direction;
- an active pattern on the bit line, the active pattern including a lower surface and an upper surface opposite to each other in a second direction, and a first side wall and a second side wall opposite to each other in the first direction, the lower surface of the active pattern being connected to the bit line;
- a word line on the first side wall of the active pattern, the word line extending in a third direction; and
- a data storage pattern on the active pattern, the data storage pattern being connected to the upper surface of the active pattern.

2. The semiconductor memory device of claim 1, wherein the shielding conductive pattern includes a shielding conductive plate and a shielding conductive protrusion protruding from the shielding conductive plate.

3. The semiconductor memory device of claim 2, wherein the shielding conductive protrusion protrudes toward the word line.

4. The semiconductor memory device of claim 1, wherein the shielding conductive pattern includes side walls extending in the second direction, and
- wherein a part of the bit line protrudes in the first direction beyond the side walls of the shielding conductive pattern.

5. The semiconductor memory device of claim 1, further comprising a pad plug connecting the second bonding pad and the bit line,
- wherein the pad plug is directly connected to the second bonding pad and the bit line.

6. The semiconductor memory device of claim 1, further comprising a pad plug connecting the second bonding pad to the word line,
- wherein the pad plug penetrates the shielding conductive pattern.

7. The semiconductor memory device of claim 6, wherein the substrate includes a cell array region and a peri-region,
- wherein the word line is on the cell array region, and
- wherein the pad plug is connected to an end of the word line at a position of the word line corresponding to a boundary of the cell array region.

8. The semiconductor memory device of claim 1, further comprising a bonding insulating film between the shielding conductive pattern and the peri-gate structure,
- wherein the bonding insulating film is disposed along an extension line of an interface between the first bonding pad and the second bonding pad.

9. The semiconductor memory device of claim 1, further comprising:
- a peri-connecting structure between the peri-gate structure and the first bonding pad, the peri-connecting structure being connected to the peri-gate structure; and
- a through connecting via connected to the peri-connecting structure, the through connecting via extending in the second direction,
- wherein an uppermost surface of the through connecting via is higher than a highest part of the data storage pattern.

10. The semiconductor memory device of claim 1, further comprising a back gate electrode on the second side wall of the active pattern, the back gate electrode extending in the third direction.

11. The semiconductor memory device of claim 1, further comprising a plurality of word lines including the word line,
- wherein each word line of the plurality of word lines includes a first portion and a second portion that are alternately disposed in the third direction,
- wherein a width of the first portion of each word line in the first direction is smaller than a width of the second portion of each word line in the first direction, and
- wherein the active pattern is disposed between second portions of adjacent word lines of the plurality of word lines adjacent in the third direction.

12. A semiconductor memory device comprising:
- a peri-gate structure on a substrate;
- a lower peri-connecting structure on the peri-gate structure;
- a shielding conductive pattern on the lower peri-connecting structure, the shielding conductive pattern including a shielding conductive plate and a plurality of shielding conductive protrusions, the plurality of shielding conductive protrusions protruding from the shielding conductive plate in a first direction;
- a bit line on the shielding conductive pattern, wherein the bit line extends in a second direction and is connected to the lower peri-connecting structure;
- an active pattern on the bit line, the active pattern including a lower surface and an upper surface opposite to each other in the first direction, and a first side wall and a second side wall opposite to each other in the second direction, the lower surface of the active pattern being connected to the bit line;
- a word line on the first side wall of the active pattern, wherein the word line extends in a third direction and is connected to the lower peri-connecting structure;

a back gate electrode on the second side wall of the active pattern, the back gate electrode extending in the third direction; and a data storage pattern on the active pattern, the data storage pattern being connected to the upper surface of the active pattern.

13. The semiconductor memory device of claim 12, wherein each of the plurality of shielding conductive protrusions extends in the second direction, and wherein the bit line is disposed between adjacent shielding conductive protrusions in the third direction.

14. The semiconductor memory device of claim 12, wherein the word line is disposed on the plurality of shielding conductive protrusions.

15. The semiconductor memory device of claim 12, further comprising:

a first bonding pad connected to the lower peri-connecting structure;

a second bonding pad connected to the bit line, the second bonding pad being in contact with the first bonding pad; and a pad plug which connects the second bonding pad to the bit line, and is directly connected to the bit line.

16. The semiconductor memory device of claim 12, further comprising:

a first bonding pad connected to the lower peri-connecting structure;

a second bonding pad connected to the word line, the second bonding pad being in contact with the first bonding pad; and a pad plug connecting the second bonding pad to the word line, the pad plug penetrating the shielding conductive plate.

17. The semiconductor memory device of claim 16, further comprising a dummy bit line on the shielding conductive pattern, the dummy bit line extending in the second direction, wherein the substrate includes a cell array region and a peri-region, wherein the dummy bit line is disposed along a boundary between the cell array region and the peri-region, and wherein the pad plug penetrates the dummy bit line.

18. The semiconductor memory device of claim 12, further comprising:

an upper peri-connecting structure on the data storage pattern; and a through connecting via which connects the lower peri-connecting structure to the upper peri-connecting structure.

19. A semiconductor memory device comprising:

a peri-gate structure on a substrate;

a lower peri-connecting structure on the peri-gate structure;

a first lower bonding pad and a second lower bonding pad on the lower peri-connecting structure, the first lower bonding pad and the second lower bonding pad being connected to the lower peri-connecting structure;

a first upper bonding pad and a second upper bonding pad on the first lower bonding pad and the second lower bonding pad, respectively;

a shielding conductive pattern on the first upper bonding pad and the second upper bonding pad, the shielding conductive pattern including a shielding conductive plate and a plurality of shielding conductive protrusions, each of the plurality of shielding conductive protrusions protruding from the shielding conductive plate in a first direction and extending in a second direction;

a bit line between shielding conductive protrusions adjacent to each other in a third direction, the bit line extending in the second direction;

a first word line on the bit line and the shielding conductive pattern, the first word line extending in the third direction;

a second word line on the bit line and the shielding conductive pattern, wherein the second word line extends in the third direction and is spaced apart from the first word line in the second direction;

a first upper pad plug which connects the bit line to the first upper bonding pad;

a second upper pad plug which connects the first word line to the second upper bonding pad, and which connects the second word line to the second upper bonding pad;

a back gate electrode between the first word line and the second word line, the back gate electrode extending in the third direction;

a first active pattern on the bit line, between the first word line and the back gate electrode;

a second active pattern on the bit line, between the second word line and the back gate electrode;

a data storage pattern on the first active pattern and the second active pattern, the data storage pattern being connected to the first active pattern and the second active pattern;

an upper peri-connecting structure on the data storage pattern; and a through connecting via which connects the lower peri-connecting structure to the upper peri-connecting structure.

20. The semiconductor memory device of claim 19, wherein the second upper pad plug penetrates the shielding conductive plate.

* * * * *